United States Patent
Nii

(10) Patent No.: US 10,734,063 B2
(45) Date of Patent: *Aug. 4, 2020

(54) SEMICONDUCTOR DEVICE

(71) Applicant: Renesas Electronics Corporation, Tokyo (JP)

(72) Inventor: Koji Nii, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/287,587

(22) Filed: Feb. 27, 2019

(65) Prior Publication Data
US 2019/0259443 A1 Aug. 22, 2019

Related U.S. Application Data

(63) Continuation of application No. 15/695,061, filed on Sep. 5, 2017, now Pat. No. 10,262,720.

(30) Foreign Application Priority Data

Sep. 7, 2016 (JP) ................... 2016-174782
Jun. 9, 2017 (JP) ................... 2017-114455

(51) Int. Cl.
*G11C 11/408* (2006.01)
*G11C 15/04* (2006.01)
(Continued)

(52) U.S. Cl.
CPC ........ *G11C 11/4087* (2013.01); *G11C 7/1048* (2013.01); *G11C 7/24* (2013.01);
(Continued)

(58) Field of Classification Search
CPC ............ G11C 11/4087; G11C 11/1697; G11C 11/4085; G11C 11/4093; G11C 11/4097;
(Continued)

(56) References Cited

U.S. PATENT DOCUMENTS 7,298,635 B1 * 11/2007 Maheshwari .......... G11C 15/04 365/189.07
7,324,362 B1 * 1/2008 Maheshwari .......... G11C 15/04 365/190
(Continued)

FOREIGN PATENT DOCUMENTS

JP 02-192098 A 7/1990

*Primary Examiner* — Sung Il Cho
(74) *Attorney, Agent, or Firm* — Sughrue Mion, PLLC

(57) ABSTRACT

A semiconductor device includes: a first cell; a second cell; a first match line and a second match line; a first search line pair, first data being transmitted through the first search line pair; a second search line pair, second data being transmitted through the second search line pair; a first logical operation cell connected to the first search line pair and the first match line, and configured to drive the first match line based on a result of comparison between information held by the first and second cells and the first data; and a second logical operation cell connected to the second search line pair and the second match line, and configured to drive the second match line based on a result of comparison between information held by the first and second cells and the second data.

9 Claims, 41 Drawing Sheets

(51) Int. Cl.
| | |
|---|---|
| *G11C 7/10* | (2006.01) |
| *G11C 7/24* | (2006.01) |
| *G11C 11/16* | (2006.01) |
| *G11C 11/4093* | (2006.01) |
| *G11C 11/4097* | (2006.01) |
| *G11C 11/411* | (2006.01) |
| *G11C 11/412* | (2006.01) |

(52) U.S. Cl.
CPC ...... *G11C 11/1697* (2013.01); *G11C 11/4085* (2013.01); *G11C 11/4093* (2013.01); *G11C 11/4097* (2013.01); *G11C 11/411* (2013.01); *G11C 11/4125* (2013.01); *G11C 15/04* (2013.01)

(58) Field of Classification Search
CPC . G11C 11/411; G11C 11/4125; G11C 7/1048; G11C 7/24; G11C 15/04
See application file for complete search history.

(56) References Cited

U.S. PATENT DOCUMENTS

| | | |
|---|---|---|
| 9,418,741 B1 | 8/2016 | Ramaraju et al. |
| 9,768,179 B1 * | 9/2017 | Liaw ................ H01L 27/1104 |
| 2002/0126519 A1 * | 9/2002 | Foss ........................ G11C 15/04 365/49.17 |
| 2002/0141218 A1 * | 10/2002 | Foss ........................ G11C 15/04 365/49.17 |
| 2003/0185044 A1 * | 10/2003 | Nii ............................ G11C 8/16 365/154 |
| 2004/0114411 A1 * | 6/2004 | Noda ..................... G11C 15/043 365/49.17 |
| 2007/0008760 A1 * | 1/2007 | Nii .......................... G11C 15/04 365/233.1 |
| 2007/0247885 A1 | 10/2007 | Watanabe et al. |
| 2009/0141528 A1 | 6/2009 | Arsovski et al. |
| 2009/0141529 A1 * | 6/2009 | Arsovski ................ G11C 15/04 365/49.17 |
| 2009/0141530 A1 * | 6/2009 | Arsovski ................ G11C 15/04 365/49.17 |
| 2009/0201709 A1 | 8/2009 | Inoue |
| 2010/0271854 A1 | 10/2010 | Chu |
| 2011/0026288 A1 | 2/2011 | Watanabe |
| 2011/0088005 A1 * | 4/2011 | Arsovski ................ G11C 15/04 716/100 |
| 2014/0177310 A1 | 6/2014 | Vattikonda et al. |
| 2014/0328103 A1 | 11/2014 | Arsovski |
| 2015/0200010 A1 | 7/2015 | Liaw |
| 2015/0206586 A1 | 7/2015 | Chang et al. |
| 2015/0262667 A1 | 9/2015 | Hebig et al. |
| 2016/0300614 A1 | 10/2016 | Nebashi et al. |
| 2018/0025755 A1 | 1/2018 | Miki et al. |

* cited by examiner

FIG.12

| m0 | m1 | data |
|---|---|---|
| 0 | 1 | 0 |
| 1 | 0 | 1 |
| 0 | 0 | don't care |
| 1 | 1 | INHIBITED |

FIG.18

| m0 | m1 | data |
|---|---|---|
| 1 | 0 | 0 |
| 0 | 1 | 1 |
| 1 | 1 | don't care |
| 0 | 0 | INHIBITED |

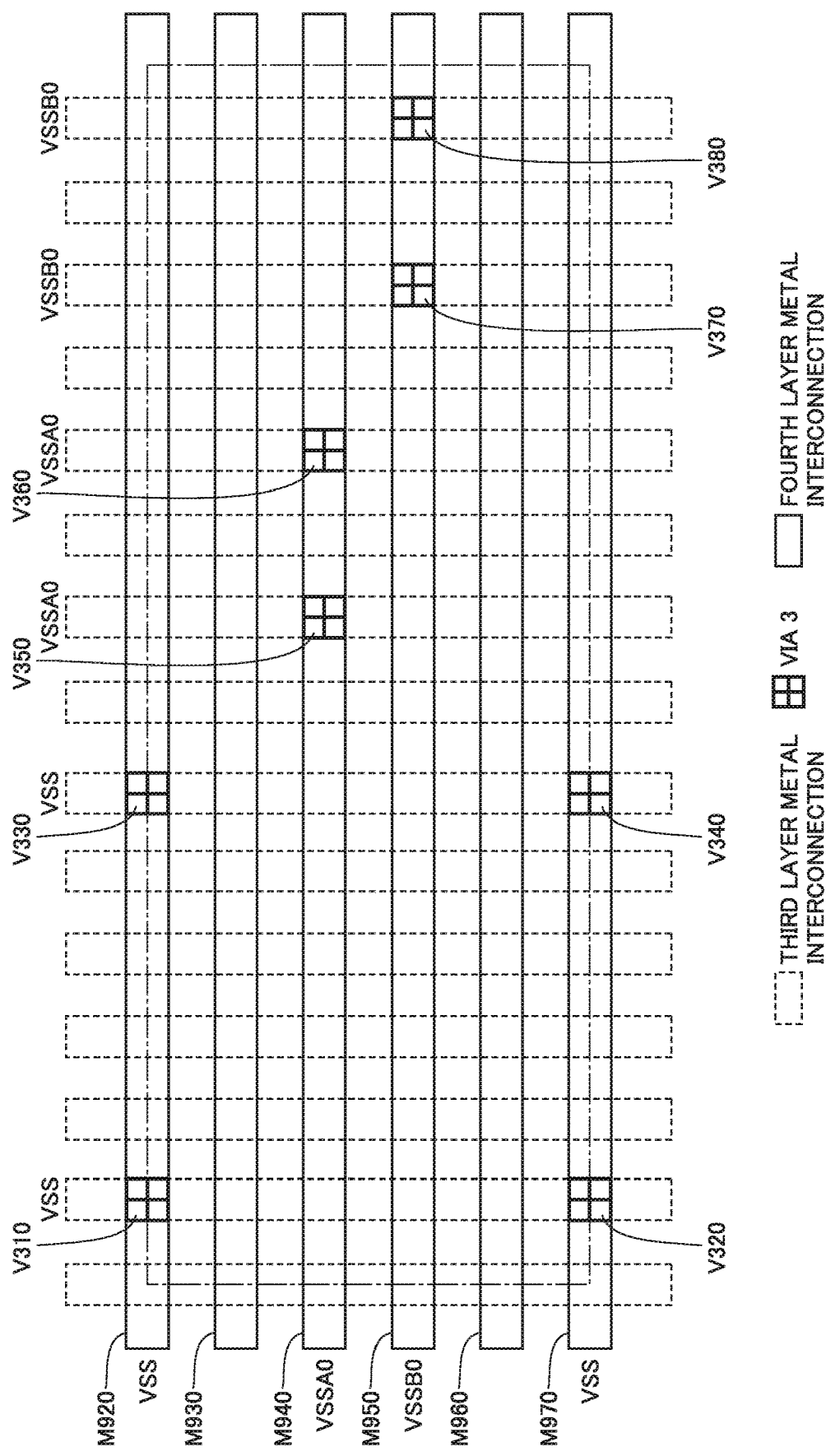

SEMICONDUCTOR DEVICE

CROSS REFERENCE TO RELATED APPLICATION

This application is a continuation of U.S. patent application Ser. No. 15/695,061, filed on Sep. 5, 2017, which claims priority from Japanese Patent Application No. 2016-174782 filed on Sep. 7, 2016 and No. 2017-114455 filed on Jun. 9, 2017, the contents of all of which are incorporated herein by reference in their entirety.

BACKGROUND OF THE INVENTION

Field of the Invention

The present disclosure relates to a semiconductor device, and more particularly to a semiconductor device having a searching function.

Description of the Background Art

In recent years, there has been an increasing demand for a content addressable memory (CAM) due to proliferation of the Internet. In addition to the memory's original storage function of holding data, the CAM has a comparison function of detecting a match between the data input from the outside and the data held therein. This CAM is used mainly in a cache memory, an address translation table, and the like.

A search device disclosed in Japanese Patent Laying-Open No. 02-192098 is configured to use a memory cell (CAM cell) incorporating a comparison function of detecting a match for each 1-bit storage circuit for holding data, to thereby detect a match between the data input from the outside and the data held in the storage circuit without reading the data held in the storage circuit.

SUMMARY OF THE INVENTION

In addition to the address searching function, the CAM is recently used also in the field of image recognition processing and the like for implementing a similar pattern search (minimum distance search) function of searching for a pattern that is most similar to the input pattern from among the reference patterns stored in the database. As the number of addresses to be searched for and the number of patterns to be processed are increased, the number of times of operation processes in the CAM is increased. Accordingly, particularly in the case where real-time processing is required, the processing speed in the CAM needs to be improved. In addition, the memory capacity of the CAM has recently been increased, so that a highly integrated CAM is also demanded.

The present disclosure has been made in order to solve the above-described problems. In a certain aspect, an object of the present disclosure is to provide a semiconductor device allowing a high-speed data search.

Other problems and new characteristics will become apparent from the description in the present specification and the accompanying drawings.

A semiconductor device according to an embodiment includes: a first cell configured to be capable of holding 1-bit information; a second cell configured to be capable of holding 1-bit information and located adjacent to the first cell; a first match line and a second match line that extend in a first direction; a first search line pair extending in a second direction orthogonal to the first direction, first data being transmitted through the first search line pair when the first data is searched for; a second search line pair extending in the second direction, second data being transmitted through the second search line pair when the second data is searched for; a first logical operation cell connected to the first search line pair and the first match line, and configured to drive the first match line based on a result of comparison between information held by each of the first cell and the second cell and the first data transmitted through the first search line pair; and a second logical operation cell connected to the second search line pair and the second match line, and configured to drive the second match line based on a result of comparison between information held by each of the first cell and the second cell and the second data transmitted through the second search line pair.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a diagram showing, in a table form, the correspondence relation between the data held by each of a data cell and a mask data cell, and the data in the memory cell in FIG. 11.

FIG. 18 is a diagram showing, in a table form, the correspondence relation between the data held by each of a data cell and a mask data cell, and the data in the memory cell in FIG. 17.

FIG. 41 is a plan view showing an arrangement of a via 3, a third layer metal interconnection, and a fourth layer metal interconnection in the memory cell according to the fifth embodiment.

DESCRIPTION OF THE PREFERRED EMBODIMENTS

Figure 1:
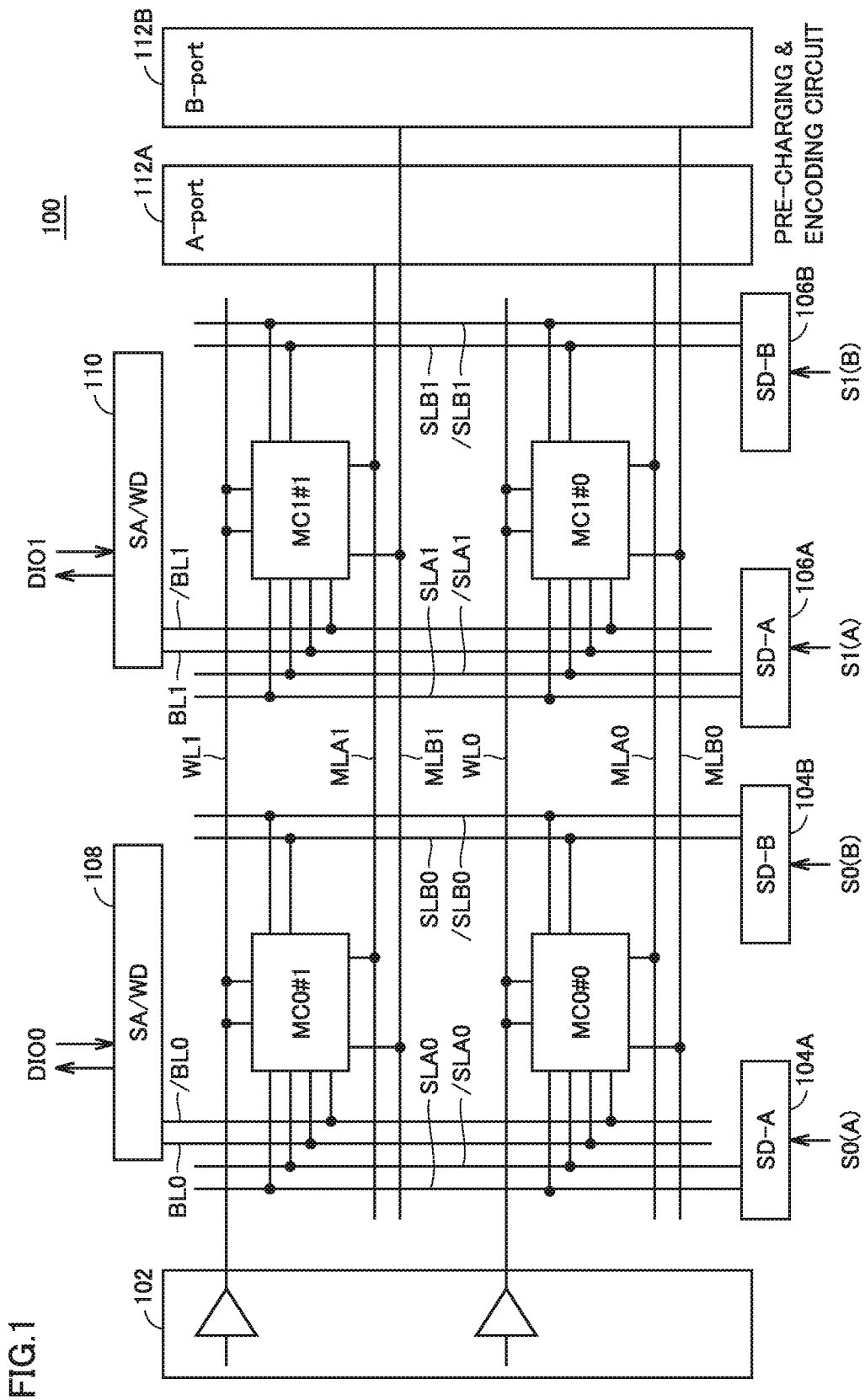
FIG. 1 is a block diagram illustrating a configuration example of a semiconductor device according to an embodiment.

Each embodiment will be hereinafter described in detail with reference to the accompanying drawings. In the following description, the same components are designated by the same reference characters. Names and functions thereof are also the same. Accordingly, the detailed description thereof will not be repeated.

First Embodiment

Configuration Example of Semiconductor Device

FIG. 1 is a block diagram illustrating a configuration example of a semiconductor device 100 according to an embodiment. Referring to FIG. 1, semiconductor device 100 includes a row decoder 102, search drivers 104A, 104B, 106A, 106B, read/write circuits 108, 110, pre-charging & encoding circuits 112A, 112B, and memory cells MC0#0 to MC1#1 (MC0#0, MC0#1, MC1#0, MC1#1) forming a memory array. In this case, #0 to #1 each are an address number referred to as an entry. For example, #0 shows the 0th address number, at which two BCAM cells in memory cell MC0#0 and memory cell MC1#0 are simultaneously accessed during the data reading and writing operations.

The memory array shown in FIG. 1 is configured in a two-column, two-row arrangement for the sake of simple description. The configuration of the memory cell to which the technique disclosed in the present specification is applied is not limited to this configuration.

Row decoder 102 activates one word line of word lines WL0 and WL1 according to the input address signal (not shown).

Search driver 104A drives a search line SLA0 to the level corresponding to an A-port search data signal S0(A), and drives a search line /SLA0 to its inverted level. Search driver 104B drives a search line SLB0 to the level corresponding to a B-port search data signal S0(B), and drives a search line /SLB0 to its inverted level. Search driver 106A drives a search line SLA1 to the level corresponding to an A-port search data signal S1(A), and drives a search line /SLA1 to its inverted level. Search driver 106B drives a search line SLB1 to the level corresponding to a B-port search data signal S1(B), and drives a search line /SLB1 to its inverted level.

In a certain aspect, read/write circuit 108 amplifies the data (electric potential) read onto a bit line pair BL0, /BL0 by a sense amplifier (not shown), and then reads the amplified data. Thereby, read/write circuit 108 reads the data from each memory cell connected to bit line pair BL0, /BL0. In another aspect, read/write circuit 108 drives bit line pair BL0, /BL0 according to input data DIO0 by a writing driver (not shown). Thereby, read/write circuit 108 writes data onto each memory cell connected to bit line pair BL0, /BL0 and having word lines activated therein. Similar to read/write circuit 108, read/write circuit 110 also amplifies the data read onto bit line pair BL1, /BL1 by a sense amplifier (not shown) in a certain aspect, and then drives bit line pair BL1, /BL1 according to input data DIO1 by a writing driver (not shown) in another aspect.

Pre-charging & encoding circuit 112A pre-charges A-port match lines MLA0, MLA1, and also encodes the search results output through match lines MLA0, MLA1. Pre-charging & encoding circuit 112B pre-charges B-port match lines MLB0, MLB1, and also encodes the search results output through match lines MLB0, MLB1. In a certain aspect, pre-charging & encoding circuits 112A and 112B pre-charge the match line connected thereto to an "H" level.

Each of memory cells MC0#0 to MC1#1 is configured to be capable of holding 1-bit storage data. The storage data is a target data to be compared with the search data.

To each memory cell, one word line, one set of bit line pair, two sets of search line pairs, and two match lines are connected. For example, memory cell MC0#0 is connected to word line WL0, bit line pair BL0, /BL0, search line pair SLA0, /SLA0 and search line pair SLB0, /SLB0, and match lines MLA0, MLB0.

To memory cells MC0#0 and MC0#1 on the first column, bit line pair BL0, /BL0, search line pair SLA0, /SLA0 and search line pair SLB0, /SLB0 are connected in common. To memory cells MC1#0 and MC1#1 on the second column, bit line pair BL1, /BL1, search line pair SLA1, /SLA1 and search line pair SLB1, /SLB1 are connected in common.

To memory cells MC0#0 and MC1#0 corresponding to the first row (address #0), word line WL0 and match lines MLA0, MLB0 are connected in common. To memory cells MC0#1 and MC1#1 corresponding to the second row (address #1), word line WL1 and match lines MLA1, MLB1 are connected in common.

Circuit Configuration of Memory Cell

Figure 2:
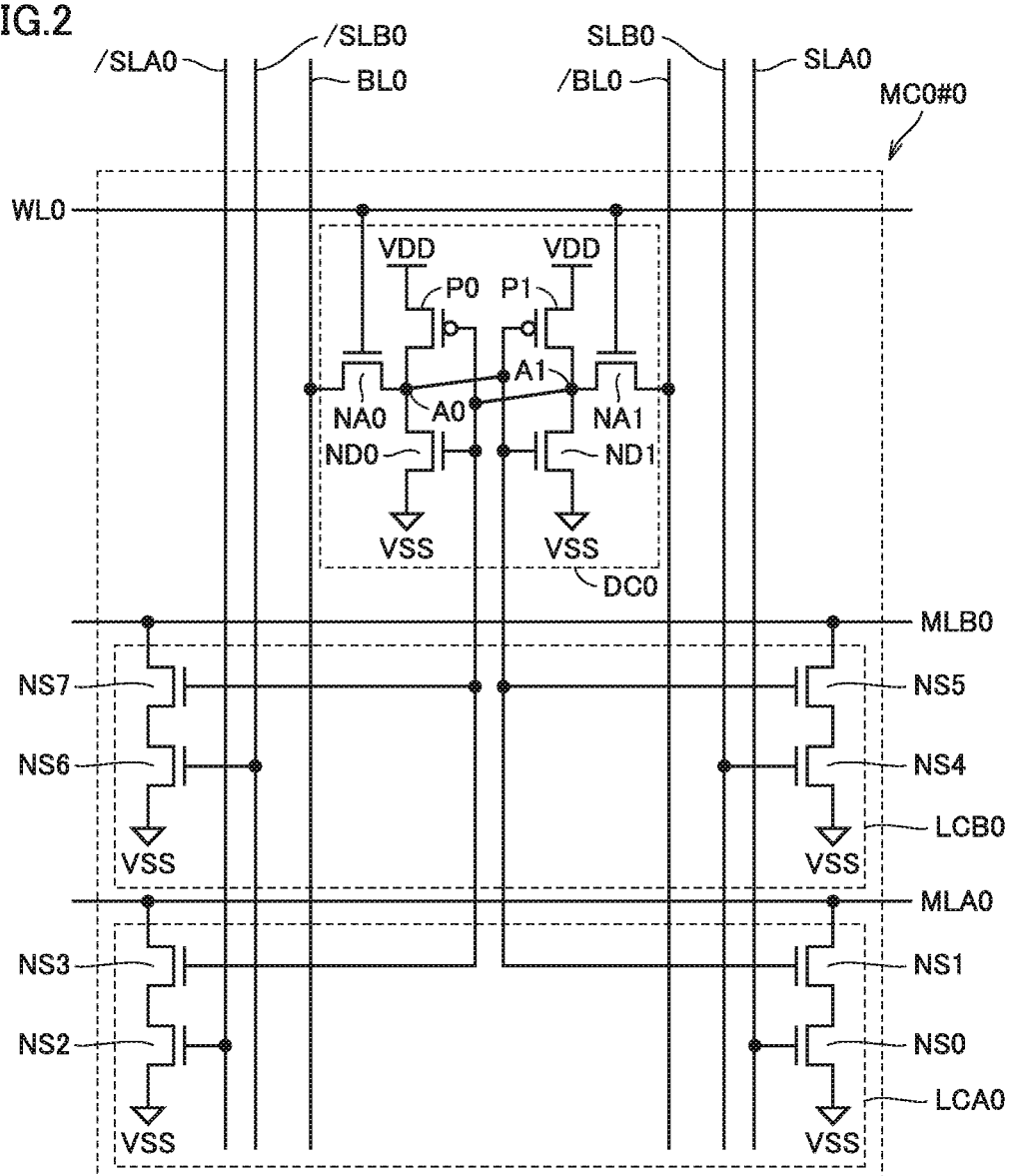
FIG. 2 is a circuit diagram illustrating a configuration example of a memory cell according to an embodiment.

FIG. 2 is a circuit diagram illustrating a configuration example of memory cell MC0#0 according to an embodiment.

Referring to FIG. 2, memory cell MC0#0 includes a data cell DC0 capable of holding 1-bit information and configured of: a metal oxide semiconductor (NMOS) transistors NA0, NA1 each serving as an access transistor; NMOS transistors ND0, ND1 each serving as a driver transistor; and PMOS transistors P0, P1. In a certain aspect, semiconductor device 100 may function as a binary content addressable memory (BCAM).

Memory cell MC0#0 further includes: a bit line pair BL0, /BL0 extending in a column direction (the longitudinal direction in FIG. 2); a word line WL0 extending in the row direction orthogonal to the direction in which the bit line pair extends; a search line pair SLA0, /SLA0 extending in the column direction and through which A-port search data is transmitted; and a search line pair SLB0, /SLB0 extending in the column direction and through which B-port search data is transmitted.

Memory cell MC0#0 includes: match lines MLA0, MLB0 extending in the row direction (the lateral direction in FIG. 2); a logical operation cell LCA0 configured to output a result to match line MLA0, the result being obtained based on the information held in the data cell and the A-port search data; and a logical operation cell LCB0 configured to output a result to match line MLB0, the result being obtained based on the information held in the data cell and the B-port search data.

NMOS transistor NA0 is connected between a storage node A0 and a bit line BL0, and has a gate to which word line WL0 is connected. NMOS transistor NA1 is connected between a storage node A1 and a bit line /BL0, and has a gate to which word line WL0 is connected. PMOS transistor P0 is connected between storage node A0 and a power supply line VDD as a power supply potential, and has a gate connected to storage node A1. NMOS transistor ND0 is connected between storage node A0 and a power supply line VSS as a ground potential, and has a gate connected to storage node A1. PMOS transistor P1 is connected between power supply line VDD and storage node A1, and has a gate connected to storage node A0. NMOS transistor ND1 is connected between storage node A1 and power supply line VSS, and has a gate connected to storage node A0.

NMOS transistor ND0 and PMOS transistor P0 form an inverter. NMOS transistor ND1 and PMOS transistor P1 also form an inverter. One of the inverters has an output connected to an input of the other inverter. Accordingly, a flip-flop formed by NMOS transistors ND0 and ND1 and PMOS transistors P0 and P1 holds 1-bit information.

Logical operation cell LCA0 includes NMOS transistors NS0, NS1, NS2, and NS3. Logical operation cell LCB0 includes NMOS transistors NS4, NS5, NS6, and NS7.

NMOS transistors NS0 and NS1 are connected in series between match line MLA0 and power supply line VSS as a ground potential. Also, NMOS transistors NS0 and NS1 have gates to which search line SLA0 and storage node A0 are respectively connected. NMOS transistors NS2 and NS3 are connected in series between match line MLA0 and power supply line VSS. Also, NMOS transistors NS2 and NS3 have gates to which search line /SLA0 and storage node A1 are respectively connected.

NMOS transistors NS4 and NS5 are connected in series between match line MLB0 and power supply line VSS. Also, NMOS transistors NS4 and NS5 have gates to which search line SLB0 and storage node A0 are respectively connected. NMOS transistors NS6 and NS7 are connected in series between match line MLB0 and power supply line VSS. Also, NMOS transistors NS6 and NS7 have gates to which search line /SLB0 and storage node A1 are respectively connected.

To each of memory cells other than memory cell MC0#0 in FIG. 1, a word line, a match line, a bit line pair, and a search line pair that are different from those in the above-described example are connected, but the inner circuit configuration is the same as that of memory cell MC0#0, and therefore, the description thereof will not be repeated.

Writing Operation

Then, the operation performed on the memory cell at address #0 will be hereinafter described with reference to FIGS. 1 and 2.

Row decoder 102 activates word line WL0 to an "H" level when data is written at address #0, and deactivates other word lines (that is, word line WL1) to an "L" level. Then, read/write circuit 108 drives bit line BL0 to the level corresponding to input data DIO0, and drives bit line BL0 to its inverted level. Read/write circuit 110 drives bit line BL1 to the level corresponding to input data DIO1, and drives bit line BL1 to its inverted level. At this time, each of the search line pairs is set at the "L" level. Each of match lines does not have to be set at a particular level, but preferably set at the pre-charged "H" level.

In the example shown in FIG. 2, the data (level) held at storage node A1 is assumed to be data held by memory cell MC0#0. More specifically, when storage node A1 is "1" (at the "H" level), and when storage node A0 is "0" (at the "L" level), memory cell MC0#0 holds data "1". On the other hand, when storage node A1 is "0", and when storage node A0 is "1", memory cell MC0#0 holds data "0".

By way of example, when data "1" is written onto memory cell MC0#0, row decoder 102 first activates word line WL0 to an "H" level. Then, read/write circuit 108 activates bit line /BL0 to an "H" level, and deactivates bit line BL0 to an "L" level.

By performing the above-described operations, semiconductor device 100 can write the input data onto the memory cell at address #0. When the data is read, the potential difference on the bit line is amplified by a sense amplifier (not shown), and the data held in each memory cell is read.

Search Operation

Then, the operation during data search will be hereinafter described. When data is searched for, the search data input into each search line pair and the entry data at each of a plurality of addresses #0 to #1 are collectively compared with each other. Then, the comparison result showing whether each entry data matches the search data or not is output in one cycle. At this time, word lines WL0 and WL1 each are set at an "L" level. Bit lines BL0 and BL1 each are preferably set at an "H" level.

According to the configuration of memory cell MC0#0 as described above, when the A-port search data is "1" (that is, search line SLA0 is "1" and search line /SLA0 is "0"), and when the data in memory cell MC0#0 is "0" (storage node A1 is "0" and storage node A0 is "1"), NMOS transistors NS0 and NS1 are brought into an ON state, and the electric potential on match line MLA0 becomes a ground potential. When the A-port search data is "0" (that is, search line SLA0 is "0" and search line /SLA0 is "1"), and when the data in memory cell MC0#0 is "1" (storage node A1 is "1" and storage node A0 is "0"), NMOS transistors NS2 and NS3 are brought into an ON state, and the electric potential on match line MLA0 becomes a ground potential. In other words, when the A-port search data does not match the data in memory cell MC0#0, the electric potential on match line MLA0 becomes a ground potential.

On the other hand, when the A-port search data is "1" and the data in memory cell MC0#0 is "1", or when the A-port search data is "0" and the data in memory cell MC0#0 is "0" (that is, the A-port search data matches the data in memory cell MC0#0), the electric potential on the pre-charged match line MLA0 is maintained.

As described above, the electric charge stored on match line MLA0 is extracted unless the data in each of memory cells (memory cells MC0#0 and MC1#0) connected to match line MLA0 matches the corresponding A-port search data.

According to the above description, logical operation cell LCA0 includes: a first logic unit formed by NMOS transistors NS0 and NS1; and a second logic unit formed by NMOS transistors NS2 and NS3. The first logic unit drives match line MLA0 based on the result of comparison between the information held in mask data cell MDC0 and the information transmitted through search line SLA0. The second logic unit drives match line MLA0 based on the result of comparison between the information held in data cell DC0 and the information transmitted through search line /SLA0.

Since the behavior of match line MLB0 is the same as that of match line MLA0 as described above, the description thereof will not be repeated.

According to the above description, semiconductor device 100 in an embodiment includes an A-port search line pair, a match line and a logical operation cell, and independently therefrom, a B-port search line pair, a match line and a logical operation cell. Thereby, semiconductor device 100 can simultaneously search for the A-port search data and the B-port search data in one cycle. Thus, when there are a plurality of search targets, semiconductor device 100 can implement the searching speed that is twice as high as that of a single-port search device (a BCAM device).

In addition, this semiconductor device 100 searches for the A-port search data and the B-port search data using a common memory array. Accordingly, semiconductor device 100 can be suppressed from being increased in size.

Furthermore, the search device performs a search at the timing according to a clock signal generated by a clock generation circuit (generally not shown). In this regard, since the conventional search device has only one search port, it has to generate a clock signal twice in order to search for two pieces of search data. On the other hand, this semiconductor device 100 only has to generate a clock signal once in order to search for two pieces of search data. Accordingly, this semiconductor device 100 can suppress the power consumption in the clock generation circuit as compared with the conventional case.

Layout of Memory Cell

Figure 3:
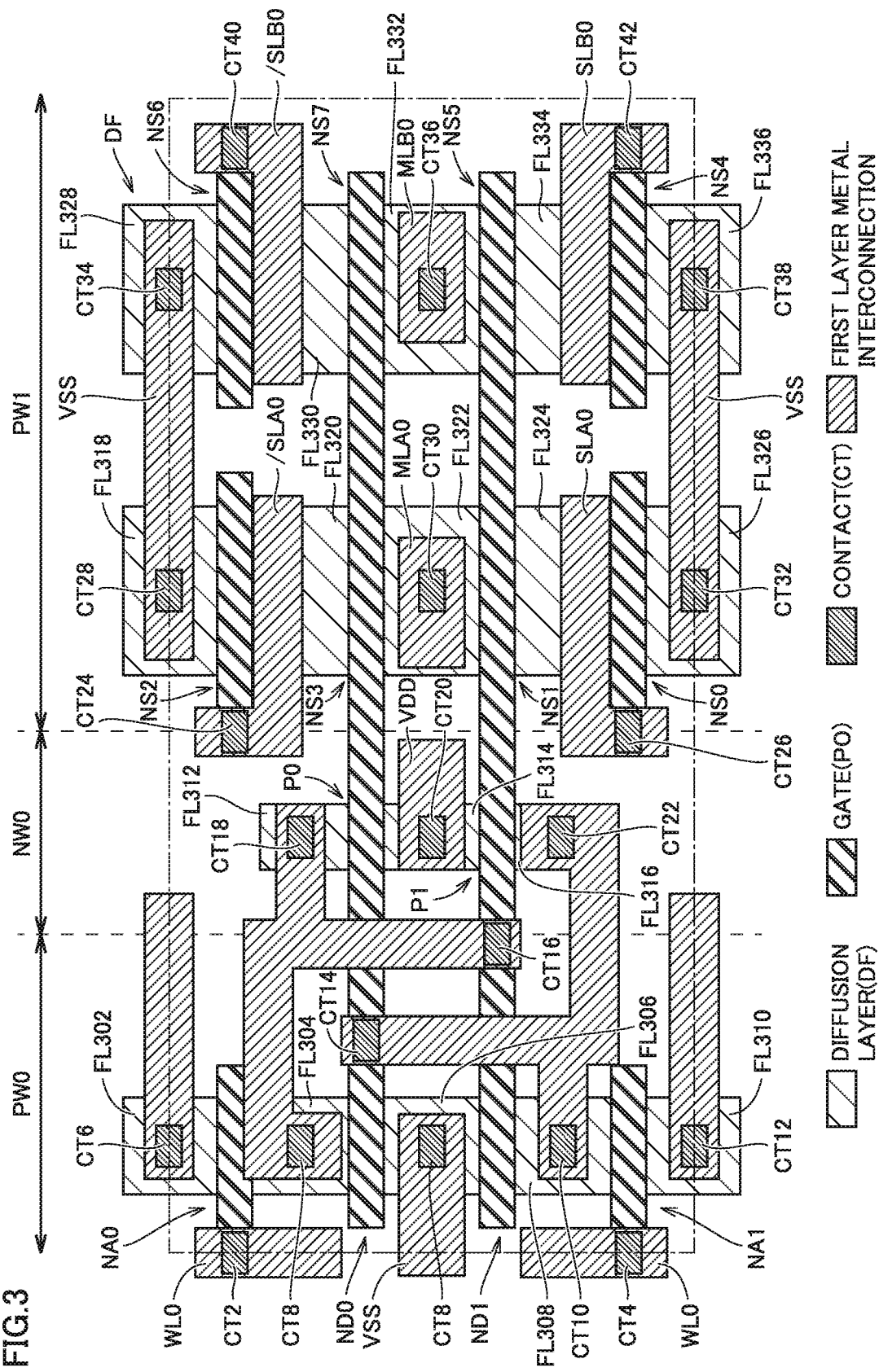
FIG. 3 is a plan view showing an arrangement of a well, a diffusion region, a polysilicon, a contact hole, and a first layer metal interconnection in the memory cell arranged in the semiconductor device.
Figure 4:
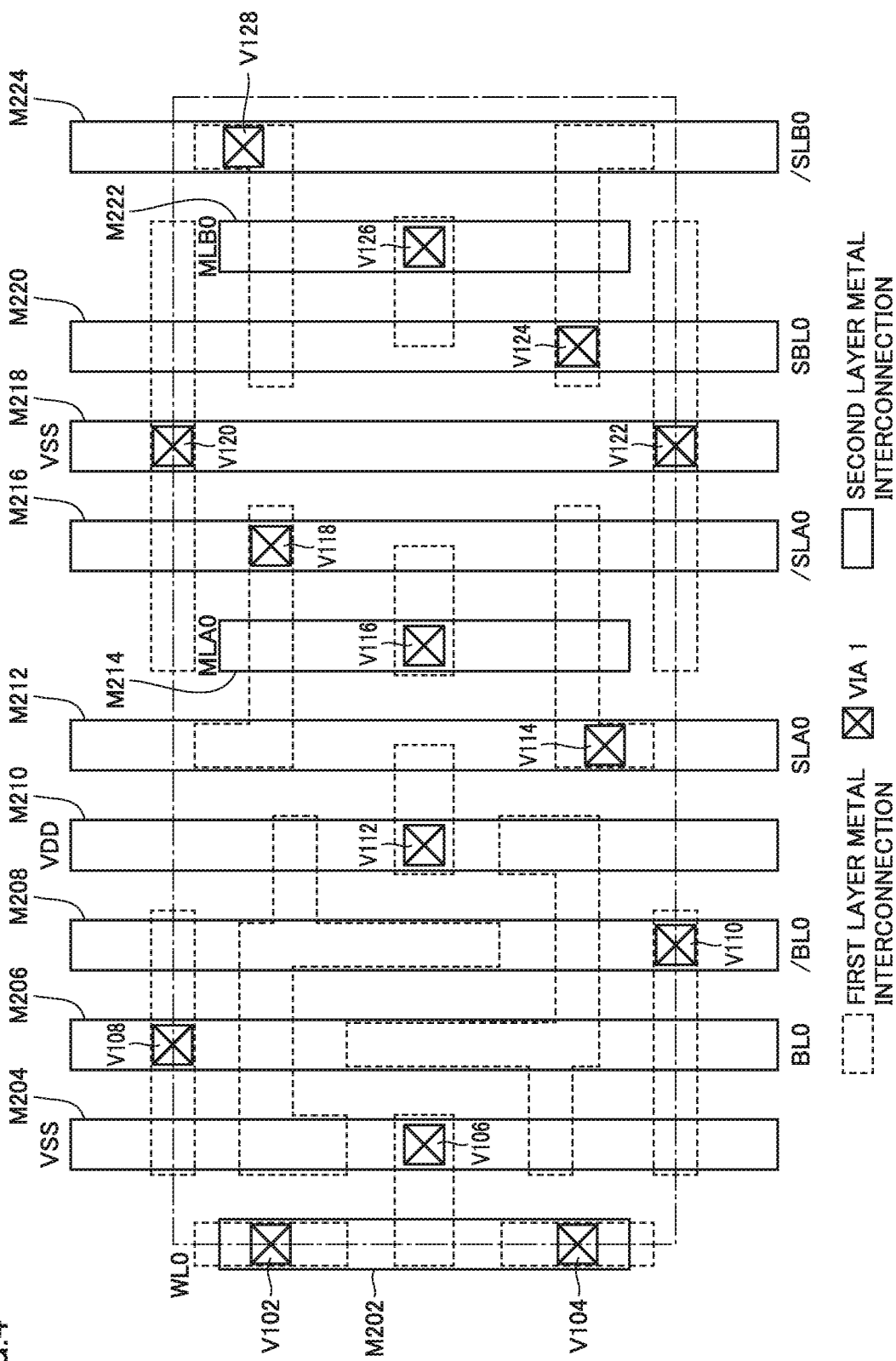
FIG. 4 is a plan view showing an arrangement of a via 1, a first layer metal interconnection layer, and a second layer metal interconnection layer in the memory cell arranged in the semiconductor device.
Figure 5:
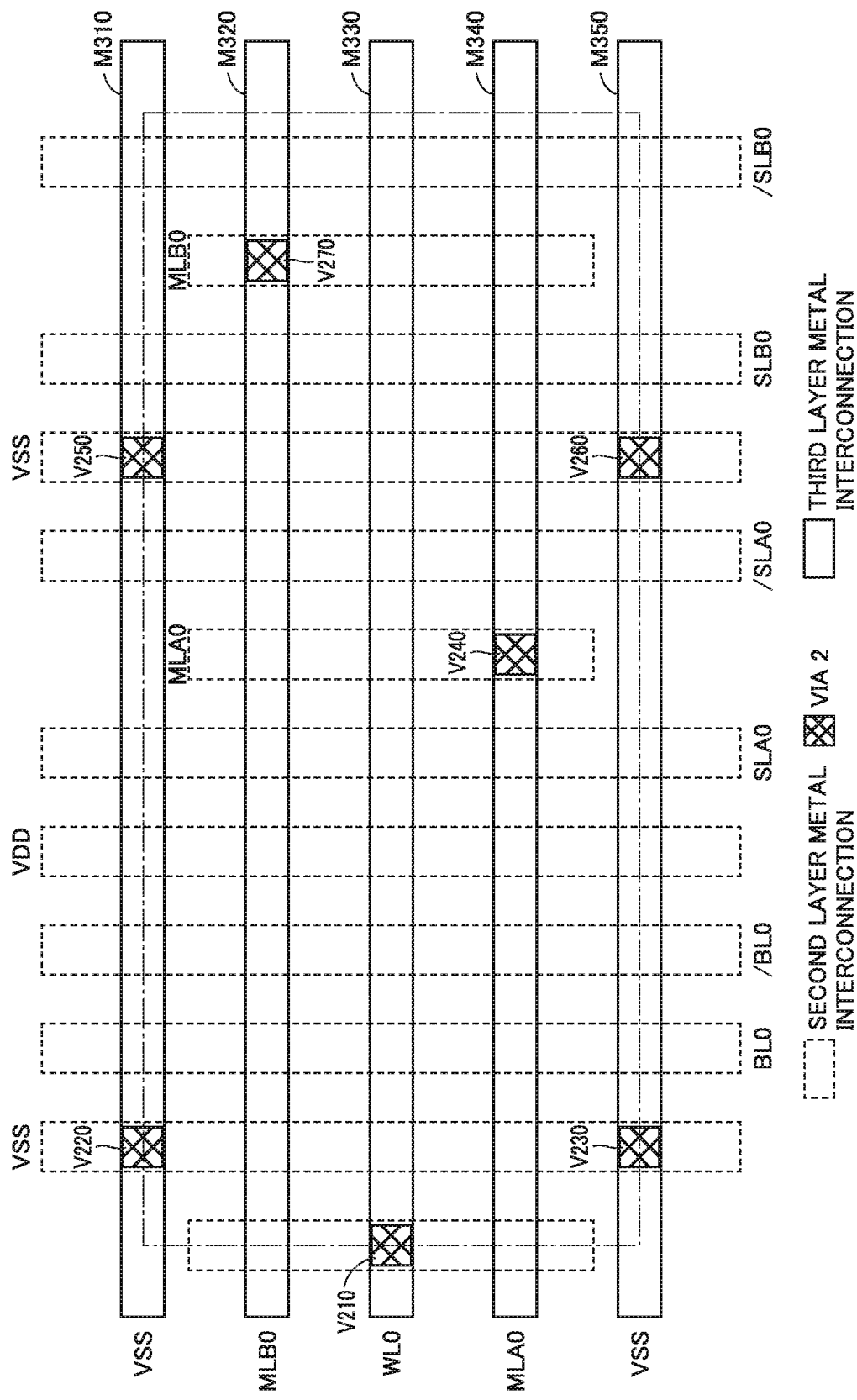
FIG. 5 is a plan view showing an arrangement of a via 2, a second layer metal interconnection layer, and a third layer metal interconnection layer in the memory cell arranged in the semiconductor device.

The following is an explanation about memory cell MC0#0 in the layout configuration divided in the stacking direction by way of example with reference to FIGS. 3 to 5.

FIG. 3 is a plan view showing an arrangement of a well, a diffusion region DF, a polysilicon P0, a contact hole CT, and a first layer metal interconnection in memory cell MC0#0 arranged in semiconductor device 100. In FIG. 3, one polysilicon is representatively designated by a symbol P0 and one diffusion region is representatively designated by a symbol DF. In the example shown in FIG. 3, the gate of the transistor is made of polysilicon, but the material of the gate is not limited to polysilicon. In another aspect, the gate may be made using metal. In this case, it is preferable that the gate insulating film disposed below a gate made of metal (metal gate) is formed using a High-k material (for example, hafnium oxide) having a high dielectric constant (relative dielectric constant). These conditions are the same also in the figures, which will be described below.

As shown in FIG. 3, polysilicon (P0) forming a gate of each transistor extends in the row direction while each of the plurality of wells forming a memory cell extends in the column direction. Accordingly, each gate and each well extend in the direction orthogonal to each other. Furthermore, each well is formed so as to be continuous to the corresponding well in the memory cell (memory cell MC0#1) that is adjacent thereto in the column direction.

In memory cell MC0#0, a P well PW0 having a P type conductivity type, an N well NW0 having an N-type conductivity type, and a P well PW1 are sequentially formed in this order in the direction in which word line WL0 extends (in the row direction). A transistor forming data cell DC0 is arranged in a region in which P well PW0 and N well NW0 are provided. More specifically, PMOS transistors P0 and P1 are arranged in N well NW0, and NMOS transistors NA0, NA1, ND0, and ND1 are arranged in P well PW0.

NMOS transistors NS0 to NS7 for data search are arranged in P well PW1. More specifically, two N type diffusion layers DF are formed in P well PW1. Transistors NS0 to NS3 forming logical operation cell LCA0 are arranged in one diffusion layer DF while transistors NS4 to NS7 forming logical operation cell LCB0 are arranged in the other diffusion layer DF.

NMOS transistor NA0 has a source and a drain formed by a pair of N-type diffusion regions FL302, FL304, and also has a polysilicon gate disposed therebetween. This gate is electrically connected through a contact hole CT2 to word line WL0 formed on the upper metal interconnection layer. N-type diffusion region FL302 is electrically connected through a contact hole CT6 to bit line BL0 formed on the upper metal interconnection layer.

NMOS transistor ND0 has a source and a drain formed by a pair of N-type diffusion regions FL304, FL306, and also has a polysilicon gate disposed therebetween. N-type diffusion region FL306 is electrically connected through a contact hole CT8 to power supply line VSS formed on the upper metal interconnection layer.

NMOS transistor ND1 has a source and a drain formed by a pair of N-type diffusion regions FL306, FL308, and also has a polysilicon gate disposed therebetween.

NMOS transistor NA1 has a source and a drain formed by a pair of N-type diffusion regions FL308, FL310, and also has a polysilicon gate disposed therebetween. This gate is electrically connected through a contact hole CT4 to word line WL0 formed on the upper metal interconnection layer. N-type diffusion region FL310 is electrically connected through a contact hole CT12 to bit line BL0 formed on the upper metal interconnection layer.

PMOS transistor P0 has a source and a drain formed by a pair of P-type diffusion regions FL312, FL 314, and also has a gate made of polysilicon and disposed therebetween. N-type diffusion region FL304, the gate of NMOS transistor ND1, and P-type diffusion region FL312 are connected through contact holes CT8, CT16, and CT18, respectively, to the common first layer metal interconnection. Thus, these elements are electrically connected to each other. P-type diffusion region FL314 is electrically connected through a contact hole CT20 to power supply line VDD formed on the upper metal interconnection layer.

PMOS transistor P1 has a source and a drain formed by a pair of P-type diffusion regions FL314, FL316, and also has a gate made of polysilicon and disposed therebetween. N-type diffusion region FL308, the gate of NMOS transistor ND0, and P-type diffusion region FL316 are connected through contact holes CT10, CT14, and CT22, respectively, to the common first layer metal interconnection. Thus, these elements are electrically connected to each other.

NMOS transistor NS2 has a source and a drain formed by a pair of N-type diffusion regions FL318, FL320, and also has a polysilicon gate disposed therebetween. This gate is electrically connected through a contact hole CT24 to search line /SLA0 formed on the upper metal interconnection layer. N-type diffusion region FL318 is electrically connected through a contact hole CT28 to power supply line VSS formed on the upper metal interconnection layer.

NMOS transistor NS3 has a source and a drain formed by a pair of N-type diffusion regions FL320, FL322, and also has a polysilicon gate disposed therebetween. N-type diffusion region FL322 is electrically connected through a contact hole CT30 to match line MLA0 formed on the upper metal interconnection layer.

NMOS transistor NS1 has a source and a drain formed by a pair of N-type diffusion regions FL322, FL324, and also has a polysilicon gate disposed therebetween.

NMOS transistor NS0 has a source and a drain formed by a pair of N-type diffusion regions FL324, FL326, and also has a polysilicon gate disposed therebetween. This gate is electrically connected through a contact hole CT26 to search line SLA0 formed on the upper metal interconnection layer. N-type diffusion region FL326 is electrically connected through a contact hole CT32 to power supply line VSS formed on the upper metal interconnection layer.

NMOS transistor NS6 has a source and a drain formed by a pair of N type diffusion regions FL328, FL330, and also has a polysilicon gate disposed therebetween. This gate is electrically connected through a contact hole CT40 to a search line /SLB0 formed on the upper metal interconnection layer. N type diffusion region FL328 is electrically connected through a contact hole CT34 to power supply line VSS formed on the upper metal interconnection layer.

NMOS transistor NS7 has a source and a drain formed by a pair of N type diffusion regions FL330, FL332, and also has a polysilicon gate disposed therebetween. N type diffusion region FL332 is electrically connected through a contact hole CT36 to match line MLB0 formed on the upper metal interconnection layer.

NMOS transistor NS5 has a source and a drain formed by a pair of N type diffusion regions FL332, FL334, and also has a polysilicon gate disposed therebetween.

NMOS transistor NS4 has a source and a drain formed by a pair of N type diffusion regions FL334, FL336, and also has a polysilicon gate disposed therebetween. This gate is electrically connected through a contact hole CT42 to search line SLB0 formed on the upper metal interconnection layer. N type diffusion region FL336 is electrically connected through a contact hole CT38 to power supply line VSS formed on the upper metal interconnection layer.

The gate of NMOS transistor ND0, the gate of PMOS transistor P0, the gate of NMOS transistor NS3, and the gate of NMOS transistor NS7 are formed by common polysilicon.

The gate of NMOS transistor ND1, the gate of PMOS transistor P1, the gate of NMOS transistor NS1, and the gate of NMOS transistor NS5 are formed by common polysilicon.

NMOS transistors NA0, ND0, ND1, and NA1 are arranged in the common N type diffusion layer. PMOS transistors P0 and P1 are arranged in the common P type diffusion layer.

Each N type diffusion region is formed by pouring N type impurities into active regions of P wells PW0 and PW1. Each P type diffusion region is formed by pouring P type impurities into the active region of N well NW0.

As described above, the memory cell forming semiconductor device 100 has a configuration in which NMOS transistors NS0 to NS7 for data search are arranged in two N type diffusion layers DF. Generally, the BCAM has a configuration in which transistors for data search are arranged in one diffusion layer DF. Thus, in the memory array forming semiconductor device 100, the physical distance of the memory cells arranged adjacent to each other in the row direction is slightly longer than that of a generally-used BCAM. Thereby, semiconductor device 100 can reduce the probability of occurrence of a multi bit error. A multi bit error is a phenomenon in which the data held by a plurality of cells arranged in the row direction is inverted by cosmic rays such as an a ray and a neutron ray.

FIG. 4 is a plan view showing an arrangement of via 1, the first layer metal interconnection layer, and the second layer metal interconnection layer in memory cell MC0#0 arranged in semiconductor device 100. Through via 1, the first layer metal interconnection and the second layer metal interconnection are connected. In FIG. 4, second layer metal interconnections M202 to M224 are arranged in the column direction.

The gate of NMOS transistor NA0 and the gate of NMOS transistor NA1 are connected through contact holes CT2 and CT4, respectively, to different first layer metal interconnections. Each of these first layer metal interconnections are connected through a corresponding one of a via 1 V102 and a via 1 V104 to common second layer metal interconnection M202 that forms word line WL0.

N-type diffusion region FL306 forming sources of NMOS transistors ND0 and ND1 is connected through contact hole CT8 to the first layer metal interconnection. This first layer metal interconnection is connected through a via 1 V106 to second layer metal interconnection M204 that forms power supply line VSS.

N-type diffusion region FL302 forming a source of NMOS transistor NA0 is connected through a contact hole CT6 to the first layer metal interconnection. This first layer metal interconnection is connected through a via 1 V108 to second layer metal interconnection M206 that forms bit line BL0.

N-type diffusion region FL310 forming a source of NMOS transistor NA1 is connected through a contact hole CT10 to the first layer metal interconnection. This first layer metal interconnection is connected through a via 1 V110 to second layer metal interconnection M208 that forms bit line /BL0.

P type diffusion region FL314 forming sources of PMOS transistors P0 and P1 is connected through a contact hole CT20 to the first layer metal interconnection. This first layer metal interconnection is connected through a via 1 V112 to second layer metal interconnection M210 that forms power supply line VDD.

The gate of NMOS transistor NS0 is connected through a contact hole CT26 to the first layer metal interconnection. This first layer metal interconnection is connected through a via 1 V114 to second layer metal interconnection M212 that forms search line SLA0.

N type diffusion region FL322 forming sources of NMOS transistors NS1 and NS3 is connected through a contact hole CT30 to the first layer metal interconnection. This first layer metal interconnection is connected through a via 1 V116 to second layer metal interconnection M214 that forms match line MLA0.

The gate of NMOS transistor NS2 is connected through a contact hole CT24 to the first layer metal interconnection. This first layer metal interconnection is connected through a via 1 V118 to second layer metal interconnection M216 that forms search line /SLA0.

N type diffusion regions FL318 and FL328 that form sources of their respective NMOS transistors NS2 and NS6 are connected through their respective contact holes CT28 and CT34 to the common first layer metal interconnection. This first layer metal interconnection is connected through a via 1 V120 to second layer metal interconnection M218 that forms power supply line VSS.

N type diffusion region FL326 forming a source of NMOS transistor NS0 and N type diffusion region FL336 forming a source of NMOS transistor NS4 are connected through contact holes CT32 and CT38, respectively, to the common first layer metal interconnection. This first layer metal interconnection is connected through a via 1 V122 to second layer metal interconnection M218.

The gate of NMOS transistor NS4 is connected through contact hole CT42 to the first layer metal interconnection. This first layer metal interconnection is connected through a via 1 V124 to second layer metal interconnection M220 that forms search line SLB0.

N type diffusion region FL332 forming sources of NMOS transistors NS5 and NS7 is connected through contact hole CT36 to the first layer metal interconnection. This first layer metal interconnection is connected through a via 1 V126 to second layer metal interconnection M222 that forms match line MLB0.

The gate of NMOS transistor NS6 is connected through contact hole CT40 to the first layer metal interconnection. This first layer metal interconnection is connected through a via 1 V128 to second layer metal interconnection M224 that forms search line /SLB0.

FIG. 5 is a plan view showing an arrangement of a via 2, a second layer metal interconnection layer, and a third layer metal interconnection layer in memory cell MC0#0 arranged in semiconductor device 100. Through via 2, the second layer metal interconnection and the third layer metal interconnection are connected. In FIG. 5, third layer metal interconnections M310 to M350 are arranged in the row direction.

Second layer metal interconnection M204 is connected through a via 2 V220 and a via 2 V230 to third layer metal interconnections M310 and M350, respectively, that form power supply line VSS. Second layer metal interconnection 218 is connected through a via 2 V250 and a via 2 V260 to third layer metal interconnections M310 and M350, respectively.

Second layer metal interconnection M222 is connected through a via 2 V270 to third layer metal interconnection M320 that forms match line MLB0.

Second layer metal interconnection M202 is connected through a via 2 V210 to third layer metal interconnection M330 that forms word line WL0.

Second layer metal interconnection M214 is connected through a via 2 V240 to third layer metal interconnection M340 that forms match line MLA0.

Since the interconnection pattern of the metal interconnection inside memory cell MC0#1 that is adjacent to memory cell MC0#0 in the column direction is the same as the interconnection pattern obtained by arranging the interconnection pattern of memory cell MC0#0 so as to be axisymmetrically in the row direction, the description thereof will not be repeated. In addition, the interconnection pattern of the metal interconnection inside memory cell MC1#0 that is adjacent to memory cell MC0#0 in the row direction may be the same as the interconnection pattern obtained by arranging the interconnection pattern of memory cell MC0#0 so as to be axisymmetrically in the column direction, or may be the same as the interconnection pattern of memory cell MC0#0.

By configuring the layout as described above, a highly integrated CAM memory array can be realized with layers up to the third layer metal interconnection layer. If the number of interconnection layers can be suppressed, the manufacturing cost can be reduced.

Modifications

In the above-described embodiments, each transistor for data search is an NMOS transistor (NS01 to N507). In another aspect, the semiconductor device may include a PMOS transistor as a transistor for data search.

Figure 6:
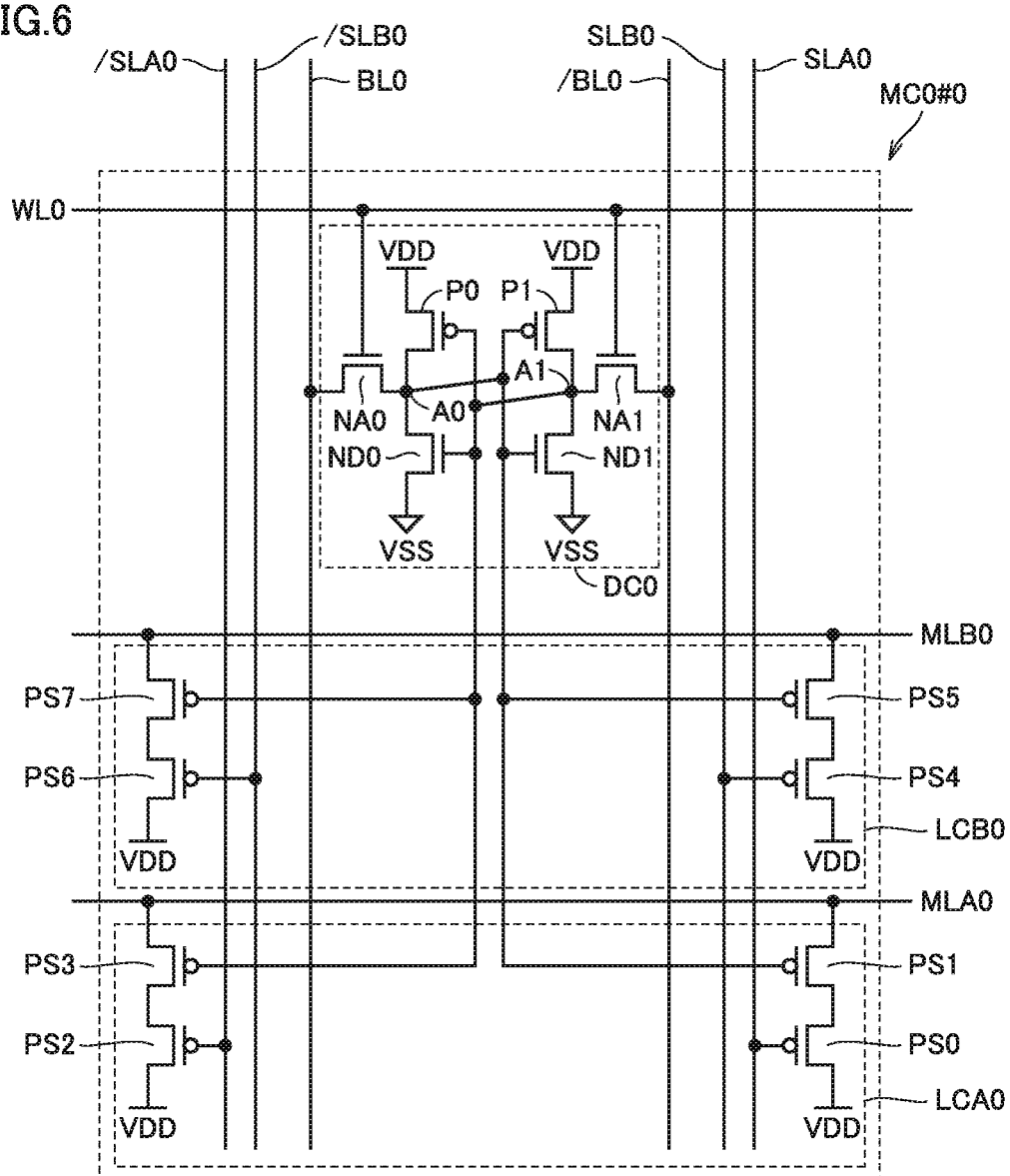
FIG. 6 is a circuit diagram illustrating a configuration example of a memory cell according to another embodiment.

FIG. 6 is a circuit diagram illustrating a configuration example of a memory cell MC0#0 according to another embodiment. In FIG. 6, since the same elements as those in FIG. 2 are designated by the same reference characters, the description thereof will not be repeated.

Logical operation cell LCA0 according to another embodiment includes PMOS transistors PS0, PS1, PS2, and PS3 in place of NMOS transistors NS0, NS1, NS2, and NS3. Logical operation cell LCB0 according to another embodiment includes PMOS transistors PS4, PS5, PS6, and PS7 in place of NMOS transistors NS4, NS5, NS6, and NS7.

PMOS transistors PS0 and PS1 are connected in series between match line MLA0 and power supply line VDD. Also, PMOS transistors PS0 and PS1 have gates to which search line SLA0 and storage node A0 are respectively connected. PMOS transistors PS2 and PS3 are connected in series between match line MLA0 and power supply line VDD. Also, PMOS transistors PS2 and PS3 have gates to which search line /SLA0 and storage node A1 are respectively connected.

PMOS transistors PS4 and PS5 are connected in series between match line MLB0 and power supply line VDD. Also, PMOS transistors PS4 and PS5 have gates to which search line SLB0 and storage node A0 are respectively connected. PMOS transistors PS6 and PS7 are connected in series between match line MLB0 and power supply line VDD. Also, PMOS transistors PS6 and PS7 have gates to which search line /SLB0 and storage node A1 are respectively connected.

As to the data in memory cell MC0#0 shown in FIG. 2, data "0" is held when storage node A1 is at the "L" level while data "1" is held when storage node A1 is at the "H" level. In a certain aspect, as to the data in memory cell MC0#0 shown in FIG. 6, data "0" is held when storage node A0 is at the "L" level while data "1" is held when storage node A0 is at the "H" level.

Figure 7:
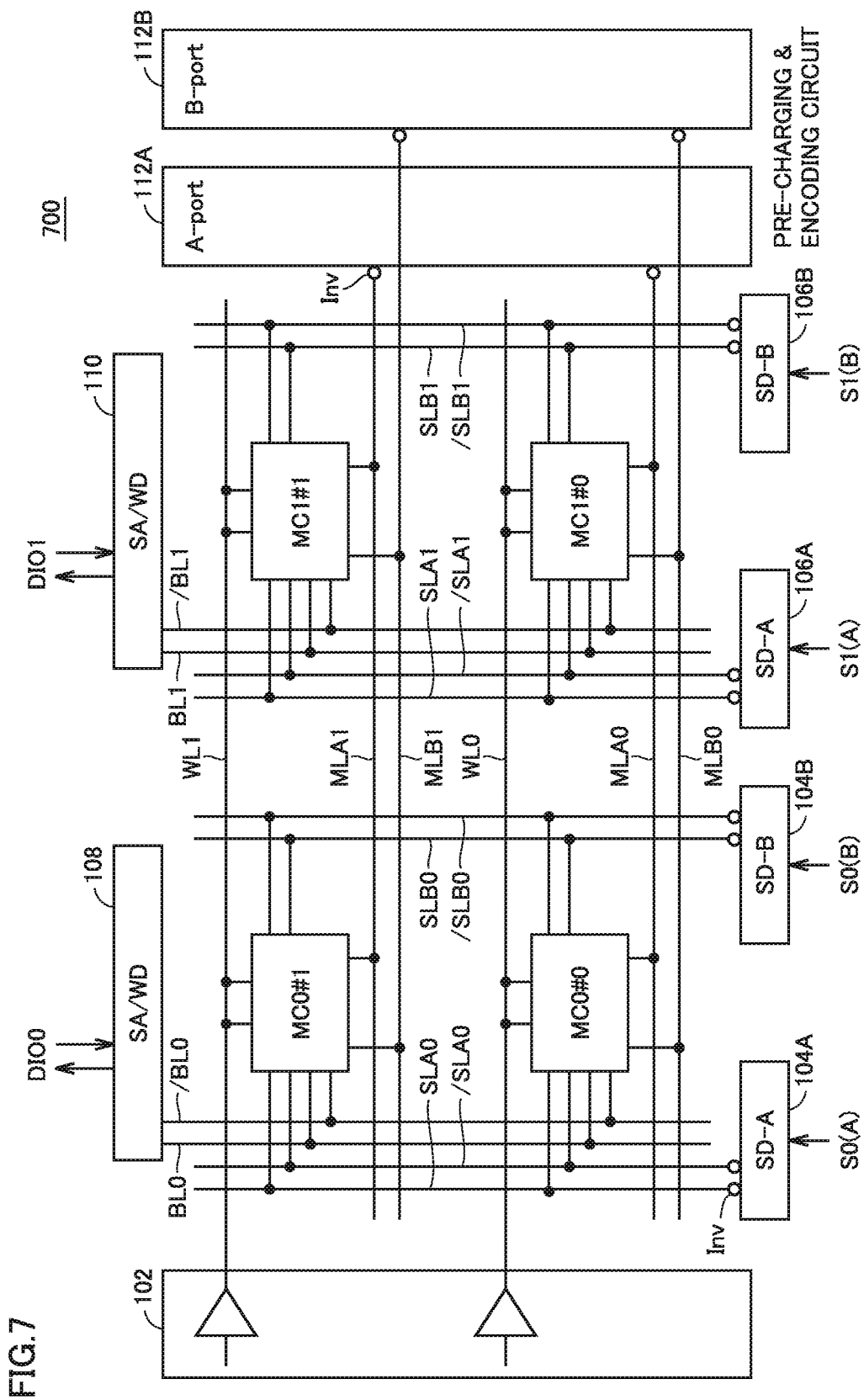
FIG. 7 is a block diagram illustrating a configuration example of a semiconductor device according to another embodiment.

FIG. 7 is a block diagram illustrating a configuration example of a semiconductor device 700 according to another embodiment. In FIG. 7, since the same elements as those in FIG. 1 are designated by the same reference characters, the description thereof will not be repeated.

Memory cells MC0#0 to MC1#1 arranged in semiconductor device 700 each have a PMOS transistor as a transistor for data search, as shown in FIG. 6.

Semiconductor device 700 includes search drivers 104A, 104B, 106A, and 106B each having an output terminal that is provided with an inverter Inv. Thereby, the level of each search line becomes an inverted level of the signal that is output from the search driver connected thereto.

Also, semiconductor device 700 includes pre-charging & encoding circuits 112A and 112B each having an input terminal that is provided with inverter Inv. Thereby, each of pre-charging & encoding circuits 112A and 112B receives an input of the signal of inverted level on a corresponding one of the match lines connected thereto. Each of these inverters Inv serves to invert the output level of a corresponding one of pre-charging & encoding circuits 112A and 112B for pre-charging each match line. In a certain aspect, each match line is pre-charged to an "L" level.

The search operation of semiconductor device 700 will be hereinafter described with reference to FIGS. 6 and 7. When the data in memory cell MC0#0 (the level at storage node A0) matches the search data, the level on the match line is maintained at a pre-charged "L" level. On the other hand, when the data in memory cell MC0#0 does not match the search data, the level on the match line becomes an "H" level.

The following is an explanation about the case where search data signal S0(A) is "1" by way of example. In this case, the level on search line SLA0 is inverted by inverter Inv and thereby becomes an "L" level. Thus, PMOS transistor PS0 connected to search line SLA0 is brought into an ON state. In the above-described case, when the data in memory cell MC0#0 is "0", that is, when the data in memory cell MC0#0 does not match the search data, PMOS transistor PS1 is brought into an ON state and match line MLA0 becomes an "H" level. On the other hand, when the data in memory cell MC0#0 is "1", that is, when the data in memory cell MC0#0 matches the search data, PMOS transistor PS1 is brought into an OFF state, and match line MLA0 is maintained at the pre-charged "L" level.

According to the above description, the level on A-port match line MLA0 is maintained at the "L" level when each data held by the memory cell corresponding to address #0 matches the corresponding A-port search data, but the level on A-port match line MLA0 becomes a level "H" when even one piece of data does not match the A-port search data. Due to the effect of inverter Inv, when each data held by the memory cell corresponding to address #0 matches the corresponding A-port search data, pre-charging & encoding circuit 112A receives an input of the "H" level. On the other hand, when even one piece of data does not match the A-port search data, pre-charging & encoding circuit 112A receives an input of the "L" level. This also applies to pre-charging & encoding circuit 112A included in the above-described semiconductor device 100. Similarly, the behavior of pre-charging & encoding circuit 112B included in semiconductor device 700 is the same as the behavior of pre-charging & encoding circuit 112B included in semiconductor device 100.

Accordingly, merely by providing an inverter at each output terminal of the search driver and at each input terminal of the pre-charging & encoding circuit, semiconductor device 700 may use a memory cell including a PMOS transistor as a transistor for data search.

In a certain aspect, a silicon germanium layer can be formed in a source region and a drain region in each of the above-described PMOS transistors PS0 to PS7. This causes stress to be applied onto silicon in the adjacent channel portion, so that the lattice constant of this silicon may be increased. Consequently, the speed of the current flowing through the channel portion is raised, so that the switching speed of each of PMOS transistors PS0 to PS7 may be improved. In another aspect, the layers formed in the source region and the drain region in each of PMOS transistors PS0 to PS7 are not limited to a silicon germanium layer, but may be any element that can apply stress onto silicon of the channel portion.

Figure 8:
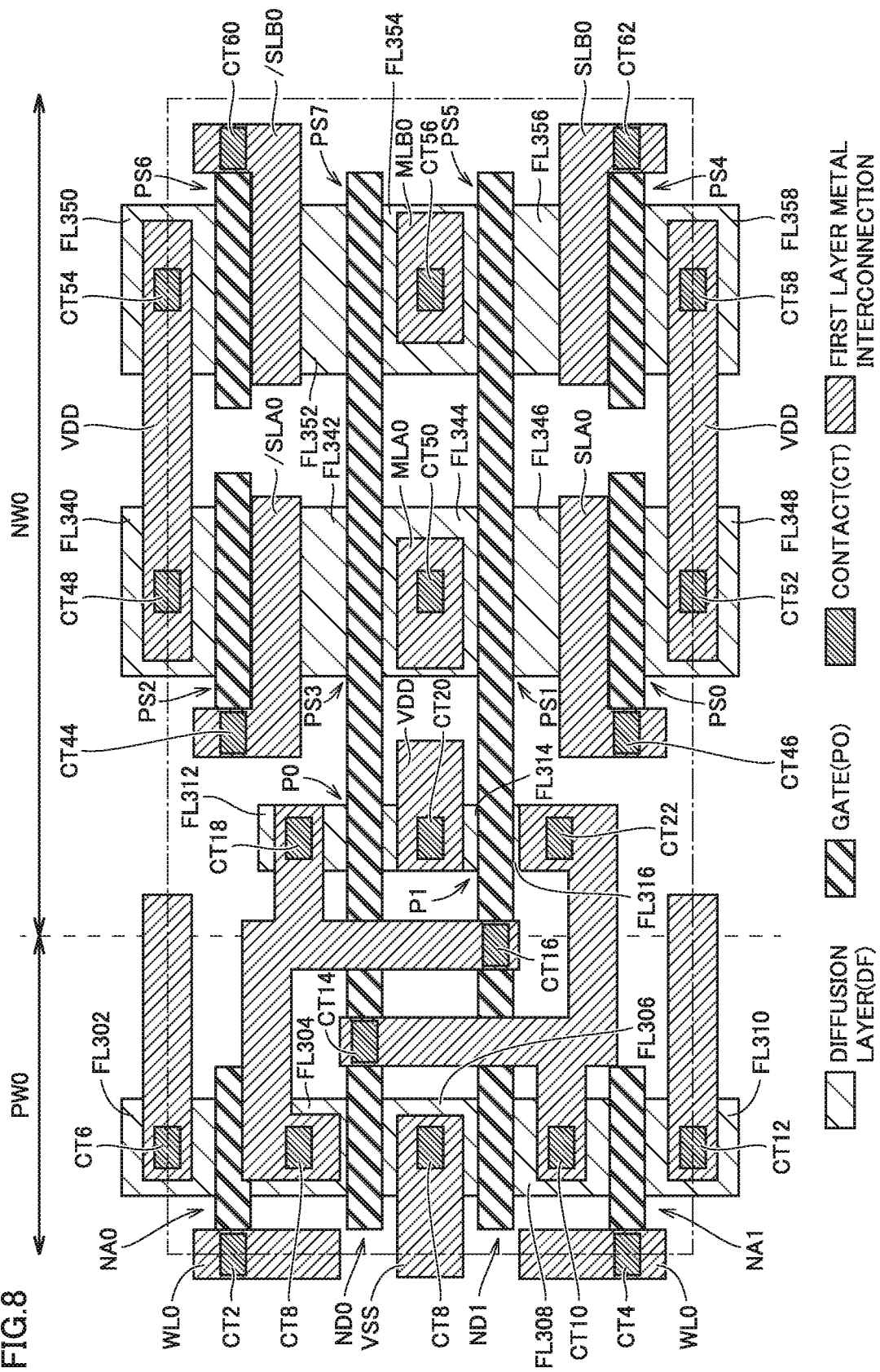
FIG. 8 is a plan view showing an arrangement of a well, a diffusion region, a polysilicon, a contact hole, and a first layer metal interconnection in the memory cell according to another embodiment.

FIG. 8 is a plan view showing an arrangement of a well, a diffusion region DF, a polysilicon P0, a contact hole CT, and a first layer metal interconnection in memory cell MC0#0 according to another embodiment. In FIG. 8, since the same elements as those in FIG. 3 are designated by the same reference characters, the description thereof will not be repeated.

As shown in FIG. 8, the well configuration of memory cell MC0#0 according to another embodiment is different from the well configuration of memory cell MC0#0 illustrated in FIG. 3 in that it does not include P well PW1.

PMOS transistors PS0 to PS7 for data search are arranged in N well NW0. More specifically, three diffusion layers DF extending in the column direction are formed in N well NW0. In one diffusion layer DF, PMOS transistors P0 and P1 forming data cell DC0 are arranged. In one diffusion layer DF, PMOS transistors PS0 to PS3 forming logical operation cell LCA0 are arranged. In one diffusion layer DF, PMOS transistors PS4 to PS7 forming logical operation cell LCB0 are arranged.

PMOS transistor PS2 has a source and a drain that are formed by one pair of P type diffusion regions FL340, FL342, and also has a polysilicon gate disposed therebetween. This gate is connected through a contact hole CT44 to the first layer metal interconnection that forms search line /SLA0. P type diffusion region FL340 is connected through a contact hole CT48 to the first layer metal interconnection that forms power supply line VDD.

PMOS transistor PS3 has a source and a drain that are formed by one pair of P type diffusion regions FL342, FL344, and also has a polysilicon gate disposed therebetween. P type diffusion region FL344 is connected through a contact hole CT50 to the first layer metal interconnection that forms match line MLA0.

PMOS transistor PS1 has a source and a drain that are formed by one pair of P type diffusion regions FL344, FL346, and also has a polysilicon gate disposed therebetween.

PMOS transistor PS0 has a source and a drain that are formed by one pair of P type diffusion regions FL346, FL348, and also has a polysilicon gate disposed therebetween. This gate is connected through a contact hole CT46 to the first layer metal interconnection that forms search line SLA0. P type diffusion region FL348 is connected through a contact hole CT52 to the first layer metal interconnection that forms power supply line VDD.

PMOS transistor PS6 has a source and a drain that are formed by one pair of P type diffusion regions FL350, FL352, and also has a polysilicon gate disposed therebetween. This gate is connected through a contact hole CT60 to the first layer metal interconnection that forms search line /SLB0. P type diffusion region FL350 is connected through a contact hole CT54 to the first layer metal interconnection that forms power supply line VDD.

PMOS transistor PS7 has a source and a drain that are formed by one pair of P type diffusion regions FL352, FL354, and also has a polysilicon gate disposed therebetween. P type diffusion region FL354 is connected through a contact hole CT56 to the first layer metal interconnection that forms match line MLB0.

PMOS transistor PS5 has a source and a drain that are formed by one pair of P type diffusion regions FL354, FL356, and also has a polysilicon gate disposed therebetween.

PMOS transistor PS4 has a source and a drain that are formed by one pair of P type diffusion regions FL356, FL358, and also has a polysilicon gate disposed therebetween. This gate is connected through a contact hole CT62 to the first layer metal interconnection that forms search line SLB0. P type diffusion region FL358 is connected through a contact hole CT58 to the first layer metal interconnection that forms power supply line VDD.

The gate of NMOS transistor ND0, the gate of PMOS transistor P0, the gate of PMOS transistor PS3, and the gate of PMOS transistor PS7 are formed by common polysilicon.

The gate of NMOS transistor ND1, the gate of PMOS transistor P1, the gate of PMOS transistor PS1, and the gate of PMOS transistor PS5 are formed by common polysilicon.

Since each of memory cells forming semiconductor device 700 does not have P well PW1, the number of wells in each of memory cells forming semiconductor device 700 is less by one than the number of wells in each of memory cells forming semiconductor device 100. Accordingly, the memory cells forming semiconductor device 700 may be formed smaller in size than the memory cells forming semiconductor device 100.

Figure 9:
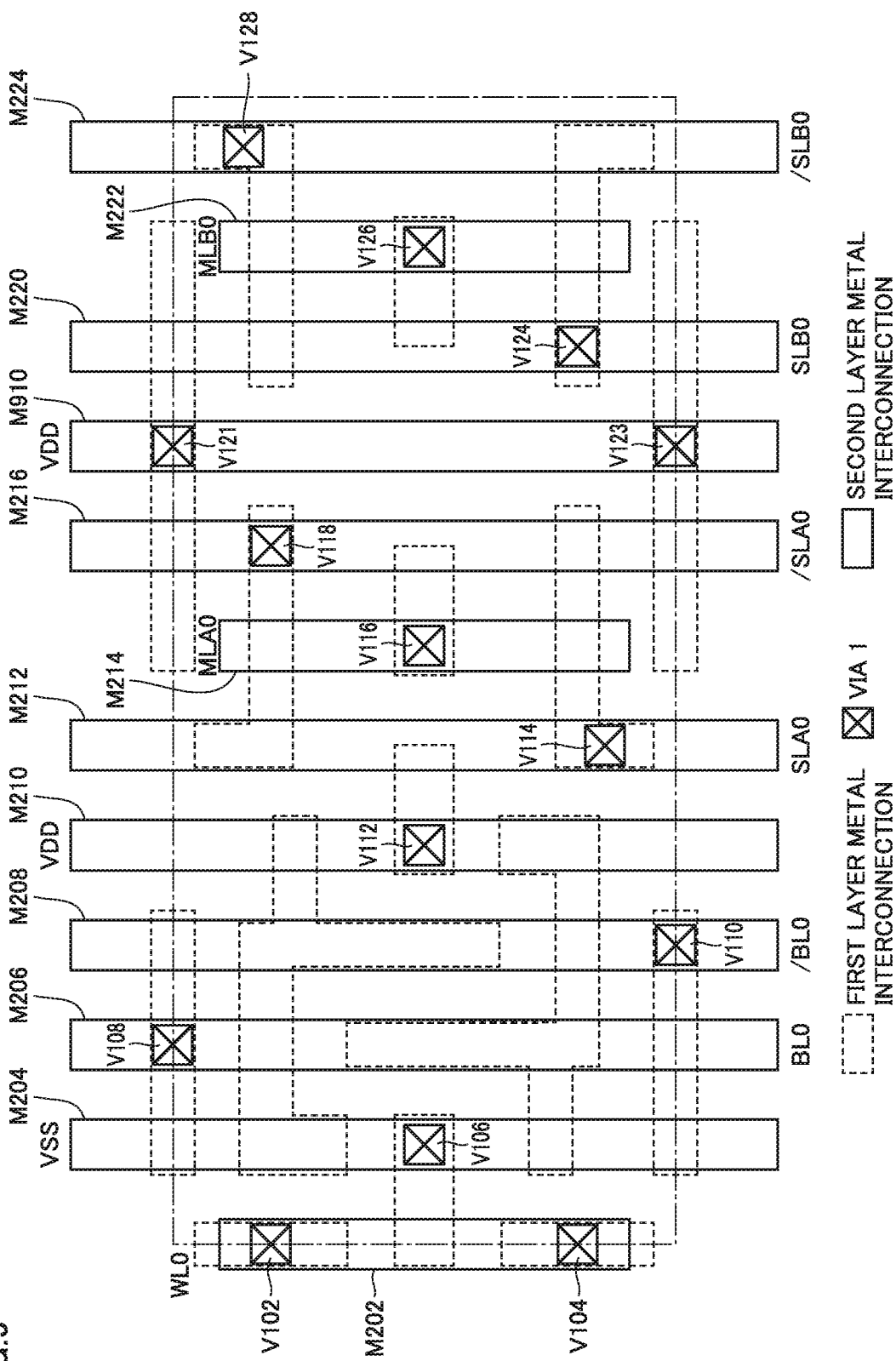
FIG. 9 is a plan view showing an arrangement of a via 1, a first layer metal interconnection layer, and a second layer metal interconnection layer in the memory cell according to another embodiment.

FIG. 9 is a plan view showing an arrangement of via 1, the first layer metal interconnection layer, and the second layer metal interconnection layer in memory cell MC0#0 according to another embodiment. In FIG. 9, since the same elements as those in FIG. 4 are designated by the same reference characters, the description thereof will not be repeated.

The metal interconnection pattern in the second layer of memory cell MC0#0 according to another embodiment is different from the metal interconnection pattern shown in FIG. 4 in that it includes a second layer metal interconnection M910 in place of second layer metal interconnection M218.

P type diffusion region FL340 forming a source of PMOS transistor PS2 and P type diffusion region FL350 forming a source of PMOS transistor PS6 are connected through contact holes CT48 and CT54, respectively, to the common first layer metal interconnection. This first layer metal interconnection is connected through a via 1 V121 to second layer metal interconnection M910 that forms power supply line VDD.

P type diffusion region FL348 forming a source of PMOS transistor PS0 and P type diffusion region FL358 forming a source of PMOS transistor PS4 are connected through contact holes CT52 and CT58, respectively, to the common first layer metal interconnection. This first layer metal interconnection is connected through a via 1 V123 to second layer metal interconnection M910 that forms power supply line VDD.

Second Embodiment

The semiconductor device shown in the above-described embodiment may function as a dual-port BCAM device. More specifically, the semiconductor device explained in the above-described embodiment has a configuration in which a search line pair, a match line, and a logical operation cell are arranged for each port in the BCAM cell holding binary data. The following is an explanation about the semiconductor device that may function as a dual-port ternary content addressable memory (TCAM) device.

Configuration Example of Semiconductor Device

Figure 10:
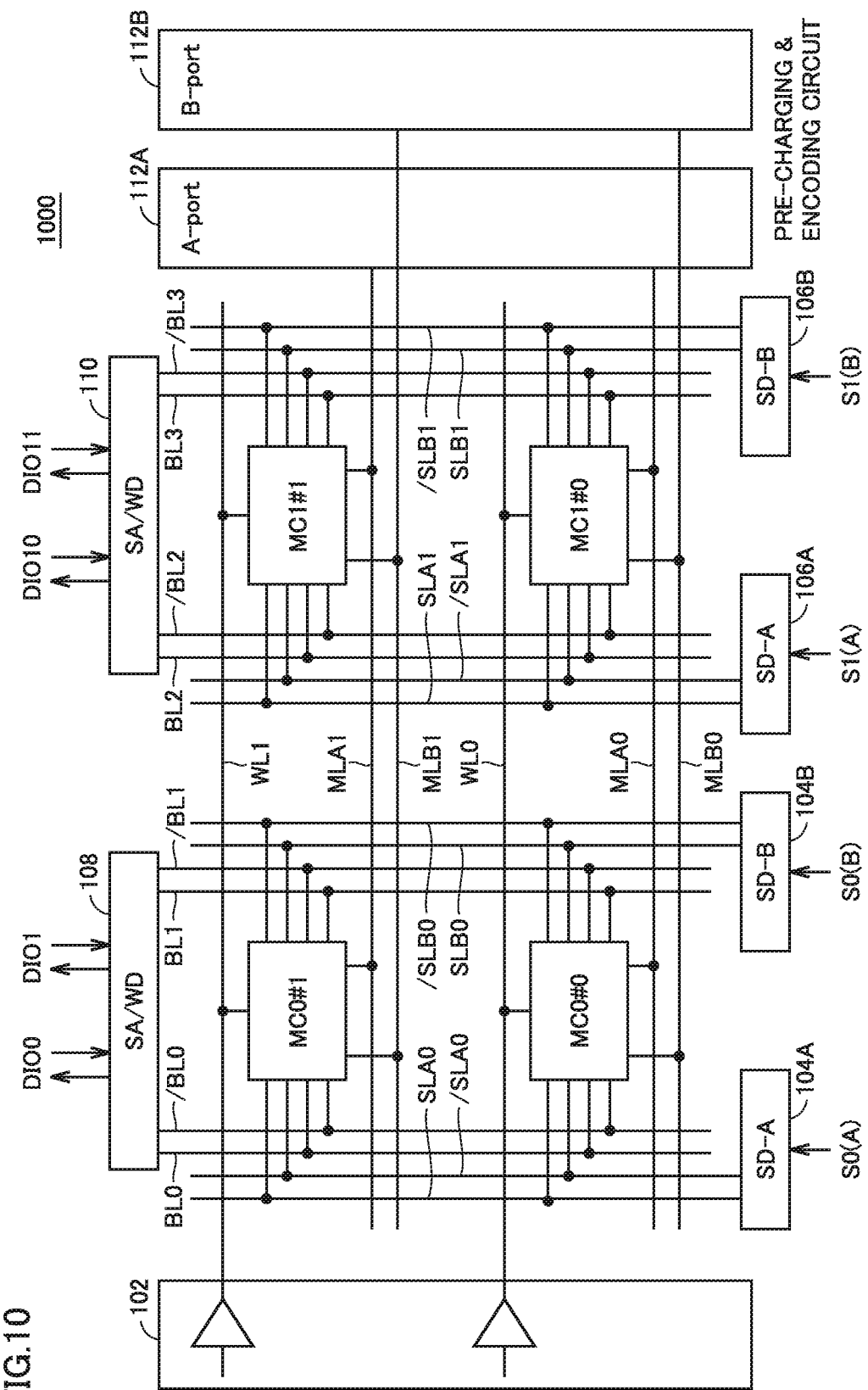
FIG. 10 is a block diagram illustrating a configuration example of a semiconductor device according to an embodiment.

FIG. 10 is a block diagram illustrating a configuration example of semiconductor device 1000 according to an embodiment. In FIG. 10, since the same elements as those in FIG. 1 are designated by the same reference characters, the description thereof will not be repeated.

Referring to FIG. 10, semiconductor device 1000 is different from semiconductor device 100 illustrated in FIG. 1 in that two sets of bit line pairs are connected to each memory cell.

More specifically, memory cells MC0#0 and MC0#1 arranged in the column direction are connected to common bit line pairs BL0, /BL0, and BL1, /BL1. Memory cells MC1#0 and MC1#1 are connected to common bit line pairs BL2, /BL2, and BL3, /BL3.

Circuit Configuration of Memory Cell

Figure 11:
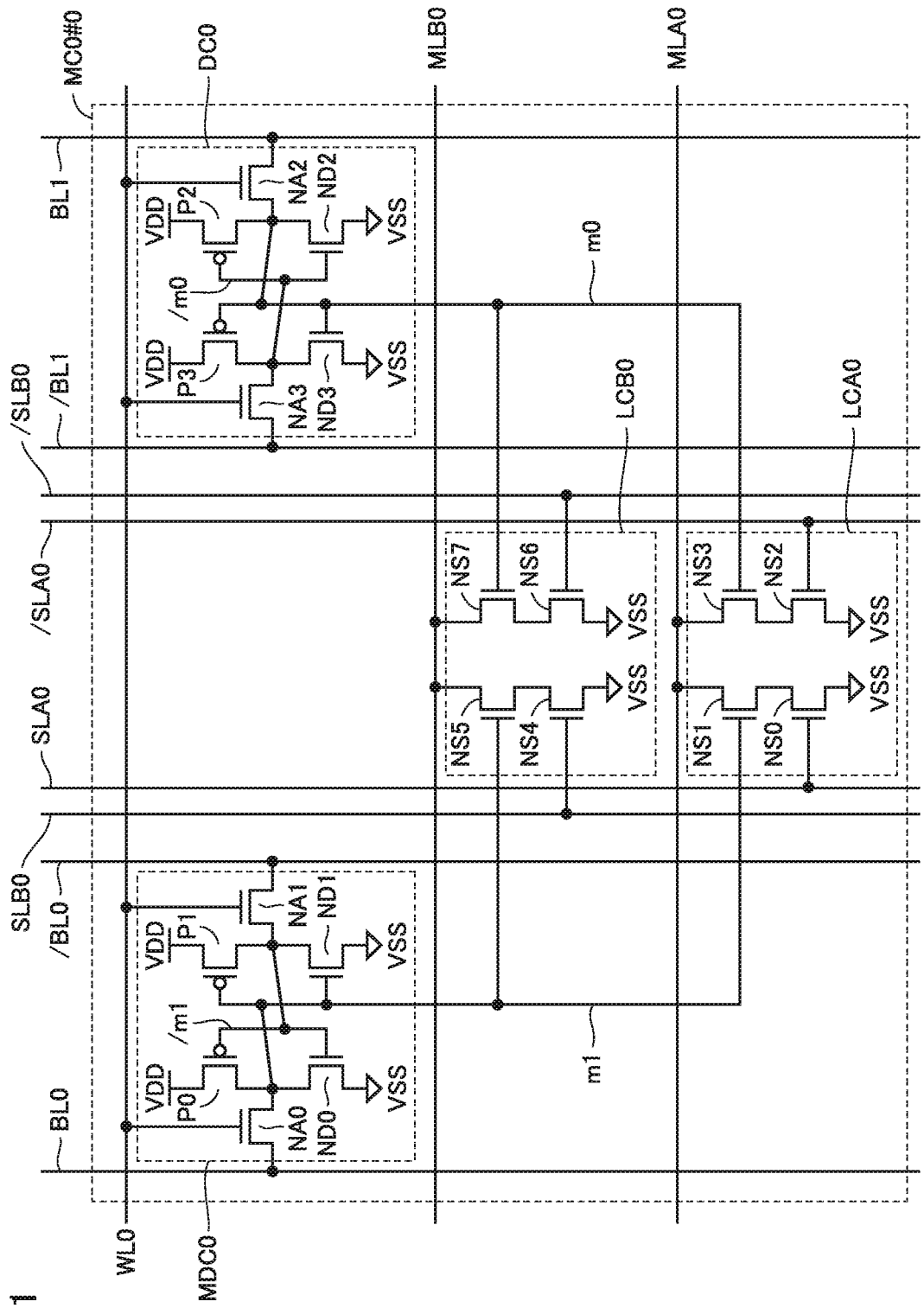
FIG. 11 is a circuit diagram illustrating a configuration example of a memory cell arranged in the semiconductor device.

FIG. 11 is a circuit diagram illustrating a configuration example of memory cell MC0#0 arranged in semiconductor device 1000.

Referring to FIG. 11, memory cell MC0#0 arranged in semiconductor device 1000 includes: a data cell DC0 configured to be capable of holding 1-bit storage data; and a mask data cell MDC0 configured to be capable of holding other 1-bit data that is independent of the 1-bit information held by data cell DC0. Data cell DC0 and mask data cell MDC0 are arranged adjacent to each other in the row direction.

Memory cell MC0#0 further includes a bit line pair BL0, /BL0 and a bit line pair BL1, /BL1 extending in the column direction.

Mask data cell MDC0 is formed by NMOS transistors NA0, NA1, ND0, and ND1, and PMOS transistors P0 and P1.

NMOS transistor NA0 is connected between a storage node m1 and a bit line BL0, and has a gate to which word line WL0 is connected. NMOS transistor NA1 is connected between a storage node /m1 and a bit line /BL0, and has a gate to which word line WL0 is connected. PMOS transistor P0 is connected between a power supply line VDD and storage node m1, and has a gate connected to storage node /m1. NMOS transistor ND0 is connected between storage node m1 and power supply line VSS, and has a gate connected to storage node /m1. PMOS transistor P1 is connected between power supply line VDD and storage node /m1, and has a gate connected to storage node m1. NMOS transistor ND1 is connected between storage node /m1 and power supply line VSS, and has a gate connected to storage node m1.

NMOS transistor ND0 and PMOS transistor P0 form an inverter. NMOS transistor ND1 and PMOS transistor P1 also form an inverter. The output of one inverter is connected to the input of the other inverter. A flip-flop formed by NMOS transistors ND0 and ND1 and PMOS transistors P0 and P1 holds 1-bit information.

Data cell DC0 is formed by NMOS transistors NA2 and NA3 each serving as an access transistor, NMOS transistors ND2 and ND3 each serving as a driver transistor, and PMOS transistors P2 and P3.

NMOS transistor NA2 is connected between storage node m0 and bit line BL1, and has a gate to which word line WL0 is connected. NMOS transistor NA3 is connected between storage node /m0 and bit line /BL1, and has a gate to which word line WL0 is connected. PMOS transistor P2 is connected between power supply line VDD and storage node m0, and has a gate connected to storage node /m0. NMOS transistor ND2 is connected between storage node m0 and power supply line VSS, and has a gate connected to storage node /m0. PMOS transistor P3 is connected between power supply line VDD and storage node /m0, and has a gate connected to storage node m0. NMOS transistor ND3 is connected between storage node /m0 and power supply line VSS, and has a gate connected to storage node m0.

NMOS transistor ND2 and PMOS transistor P2 form an inverter. NMOS transistor ND3 and PMOS transistor P3 also form an inverter. The output of one inverter is connected to the input of the other inverter. A flip-flop formed by NMOS transistors ND2 and ND3 and PMOS transistors P2 and P3 holds 1-bit information (storage data).

Memory cell MC0#0 further includes: a logical operation cell LCB0 arranged adjacent to both of data cell DC0 and mask data cell MDC0 in the column direction; and a logical operation cell LCA0 arranged adjacent to logical operation cell LCB0 in the column direction.

Logical operation cell LCA0 outputs the result to match line MLA0, the result being obtained based on the data held by each of data cell DC0 and mask data cell MDC0 and on the A-port search data. More specifically, logical operation cell LCA0 drives match line MLA0 depending on whether the data in data cell DC0 (the level on storage node m1) matches the A-port search data or not, and whether the data in mask data cell MDC (the level on storage node m0) matches the inverted level of the A-port search data or not. Logical operation cell LCB0 outputs the result to match line MLA0, the result being obtained based on the data held by each of data cell DC0 and mask data cell MDC0 and on the B-port search data. More specifically, logical operation cell LCB0 drives match line MLB0 depending on whether the data in data cell DC0 matches the B-port search data or not, and whether the data in mask data cell MDC matches the inverted level of the B-port search data or not.

Logical operation cell LCA0 includes NMOS transistors NS0 to NS3. Logical operation cell LCB0 includes NMOS transistors NS4 to NS7.

NMOS transistors NS0 and NS1 are connected in series between match line MLA0 and power supply line VSS. Also, NMOS transistors NS0 and NS1 have gates to which search line SLA0 and storage node m1 are respectively connected. NMOS transistors NS2 and NS3 are connected in series between match line MLA0 and power supply line VSS. Also, NMOS transistors NS2 and NS3 have gates to which search line /SLA0 and storage node m0 are respectively connected.

NMOS transistors NS4 and NS5 are connected in series between match line MLB0 and power supply line VSS. Also, NMOS transistors NS4 and NS5 have gates to which search line SLB0 and storage node m1 are respectively connected. NMOS transistors NS6 and NS7 are connected in series between match line MLB0 and power supply line VSS. Also, NMOS transistors NS6 and NS7 have gates to which search line /SLB0 and storage node m0 are respectively connected.

To each of memory cells other than memory cell MC0#0 in FIG. 10, a word line, a match line, a bit line pair, and a search line pair that are different from those in the above-described example are connected, but the inner circuit configuration is the same as that of memory cell MC0#0, and therefore, the description thereof will not be repeated.

Data in Memory Cell

FIG. 12 is a diagram showing, in a table form, the correspondence relation between the data held by each of data cell DC0 and mask data cell MDC0 and the data in memory cell MC0#0 in FIG. 11.

Referring to FIGS. 11 and 12, memory cell MC0#0 can store three values of "0", "1" and "*" (don't care) using a 2-bit SRAM cell (data cell DC0 and mask data cell MDC0). The symbol "*" (don't care) indicates that the value may be "0" or "1".

Specifically, when "0" ("L" level) is stored in storage node m0 of data cell DC0 and "1" ("H" level) is stored in storage node m1 of mask data cell MDC0, "0" is assumed to be stored in memory cell MC0#0. When "1" is stored in storage node m0 of data cell DC0 and "0" is stored in storage node m1 of mask data cell MDC0, "1" is assumed to be stored in memory cell MC0#0. When "0" is stored in storage node m0 of data cell DC0 and "0" is stored in storage node m1 of mask data cell MDC0, "*" (don't care) is assumed to be stored in memory cell MC0#0. Memory cell MC0#0 is configured such that "1" is not stored simultaneously in storage node m0 of data cell DC0 and in storage node m1 of mask data cell MDC0.

Writing Operation

Again referring to FIG. 11, the operation of writing onto memory cell MC0#0 will be hereinafter described. When data is written onto memory cell MC0#0, row decoder 102 activates word line WL0 to an "H" level, and deactivates a word line other than word line WL0 (that is, word line WL1) to an "L" level. Then, read/write circuit 108 drives bit lines BL0 and BL1 to the level corresponding to input data DIO0, and drives bit lines /BL0 and /BL1 to their respective inverted levels. In this case, each of the search line pairs is set at an "L" level. Although each of the match lines does not have to be set at a specific level, but is preferably set at a pre-charged "H" level.

By way of example, when input data DIO0 is "1", read/write circuit 108 drives bit line BL1 to an "H" level, drives bit line /BL1 to an "L" level, drives bit line BL0 to an "L" level, and drives bit line /BL0 to an "H" level.

By performing the above-described operations, semiconductor device 1000 can write the input data onto each memory cell. When the data is read, the potential difference on the bit line is amplified by a sense amplifier (not shown), and the data held by each memory cell is read.

In the memory cell arranged in semiconductor device 1000, the bit line pair to which a data cell is connected is different from the bit line pair to which a mask data cell is connected. Accordingly, in a certain aspect, while performing writing or reading data onto or from the data cells forming a memory cell, semiconductor device 1000 may write or read the data onto or from the mask data cells forming this memory cell.

Search Operation

The search operation will be hereinafter described. According to the above-described configuration of memory cell MC0#0, when the A-port search data is "1" (that is, search line SLA0 is "1" and search line /SLA0 is "0"), and when the data in memory cell MC0#0 is "0" (storage node m0 is "0" and storage node m1 is "1"), NMOS transistors NS0 and NS1 are brought into an ON state, and the electric potential on match line MLA0 becomes a ground potential. When the A-port search data is "0" (that is, search line SLA0 is "0" and search line /SLA0 is "1"), and when the data in memory cell MC0#0 is "1" (storage node m0 is "1" and storage node m1 is "0"), NMOS transistors NS2 and NS3 are brought into an ON state, and the electric potential on match line MLA0 becomes a ground potential. In other words, when the A-port search data does not match the data in memory cell MC0#0, the electric potential on match line MLA0 becomes a ground potential ("L" level).

On the other hand, when the A-port search data is "1" and the data in memory cell MC0#0 is "1" or "*", or when the A-port search data is "0" and the data in memory cell MC0#0 is "0" or "*" (that is, when the A-port search data matches the data in memory cell MC0#0), the electric potential ("H" level) on pre-charged match line MLA0 is maintained.

As described above, the electric charge stored in match line MLA0 is extracted unless the data in each of the memory cells connected to match line MLA0 (memory cells MC0#0 and MC1#0) matches the corresponding A-port search data.

Since the behavior of match line MLB0 is the same as that of match line MLA0 described above, the description thereof will not be repeated.

According to the above description, semiconductor device 1000 functioning as a TCAM device can simultaneously search for the A-port search data and the B-port search data in one cycle. Thus, when there are a plurality of search targets, semiconductor device 1000 can implement the searching speed that is twice as high as that of a single-port search device (a TCAM device).

In addition, this semiconductor device 1000 searches for the A-port search data and the B-port search data using a common memory array. Accordingly, semiconductor device 1000 can be suppressed from being increased in size.

Furthermore, in the conventional TCAM device, a clock signal has to be generated twice in order to search for two pieces of search data. On the other hand, in this semiconductor device 1000, a clock signal only has to be generated once in order to search for two pieces of search data. Thus, this semiconductor device 1000 can suppress power consumption as compared with the conventional device.

Layout of Memory Cell

Figure 13:
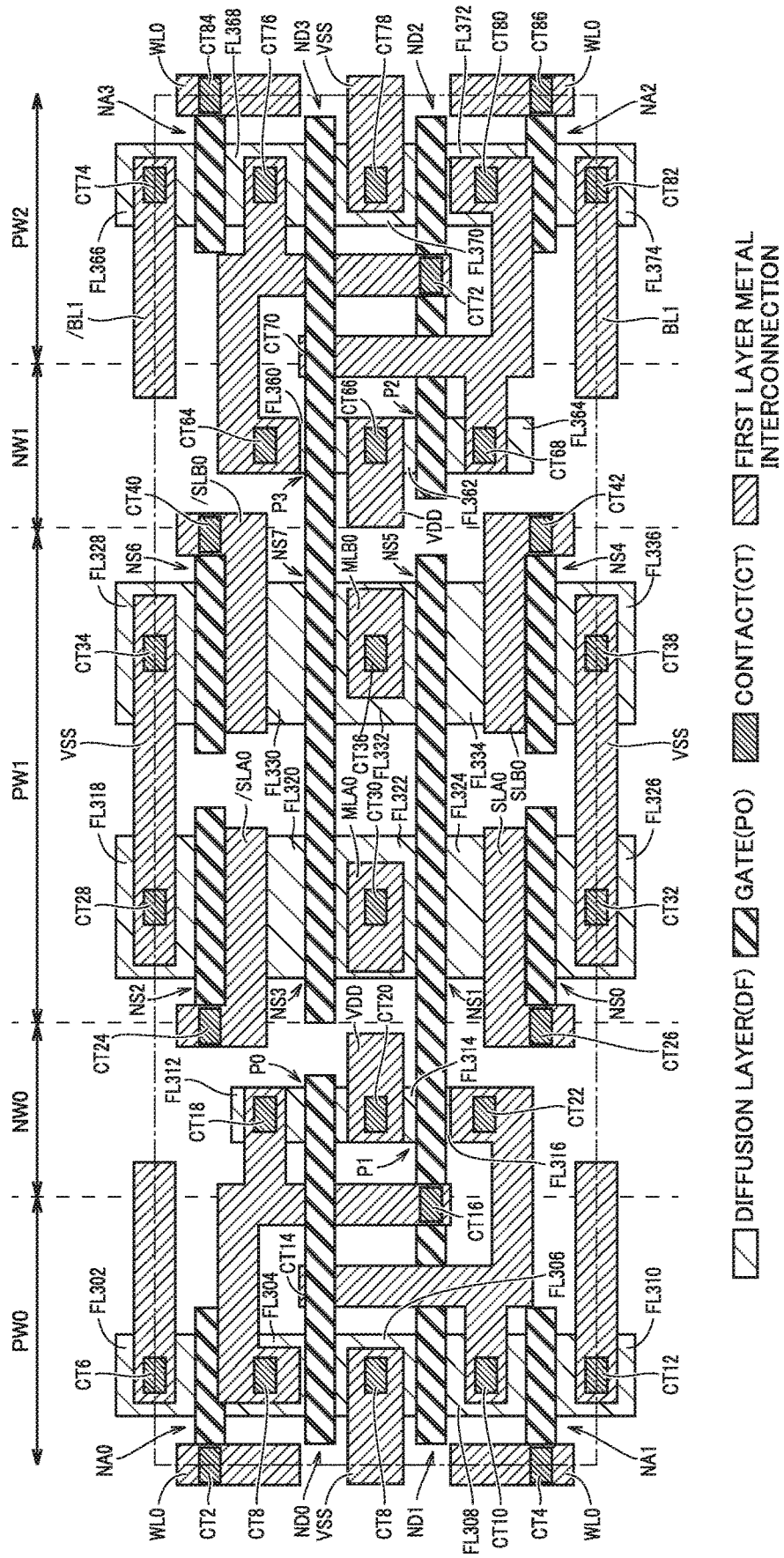
FIG. 13 is a plan view showing an arrangement of a well, a diffusion region, a polysilicon, a contact hole, and a first layer metal interconnection in the memory cell arranged in the semiconductor device.
Figure 14:
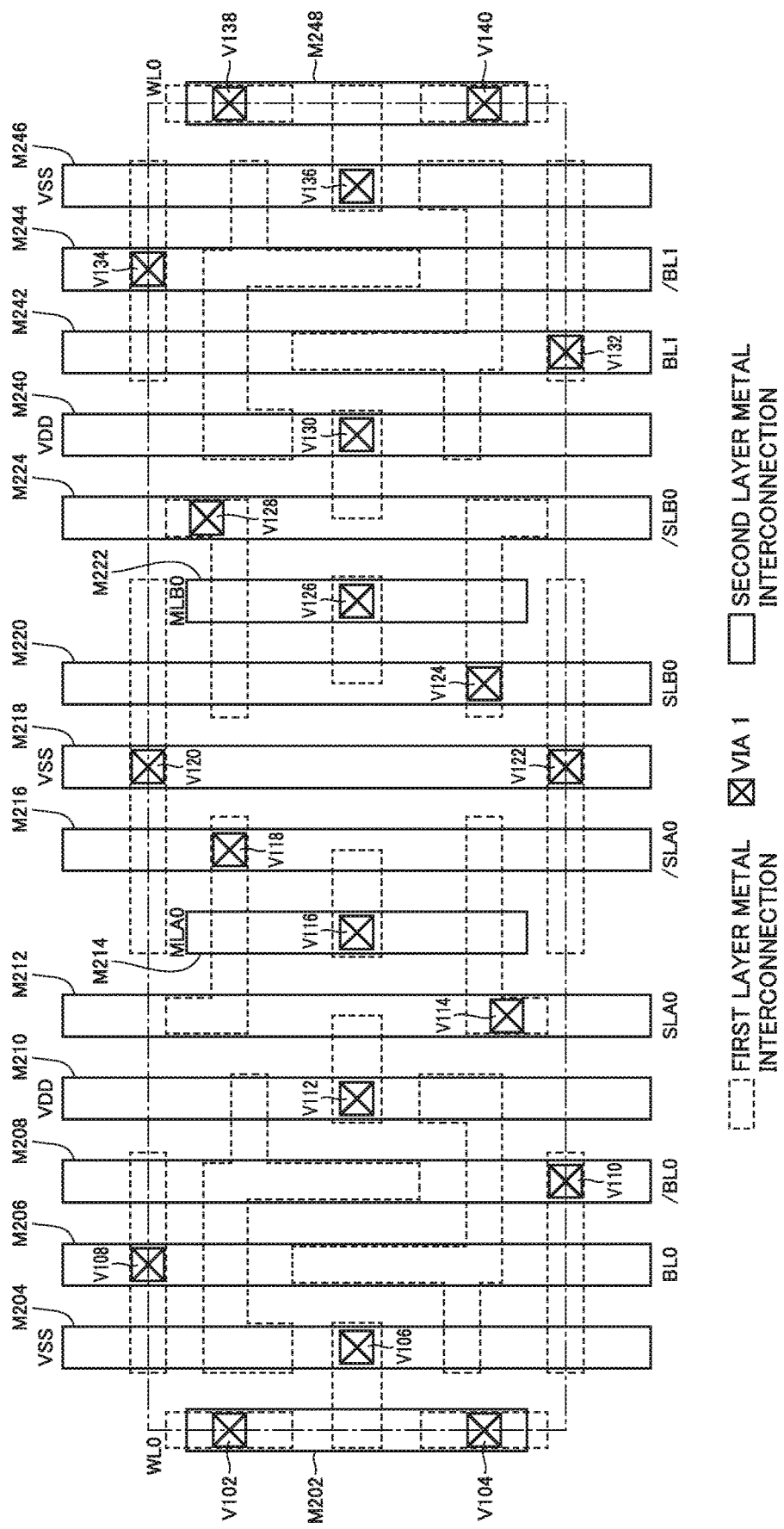
FIG. 14 is a plan view showing an arrangement of a via 1, a first layer metal interconnection layer, and a second layer metal interconnection layer in the memory cell arranged in the semiconductor device.
Figure 15:
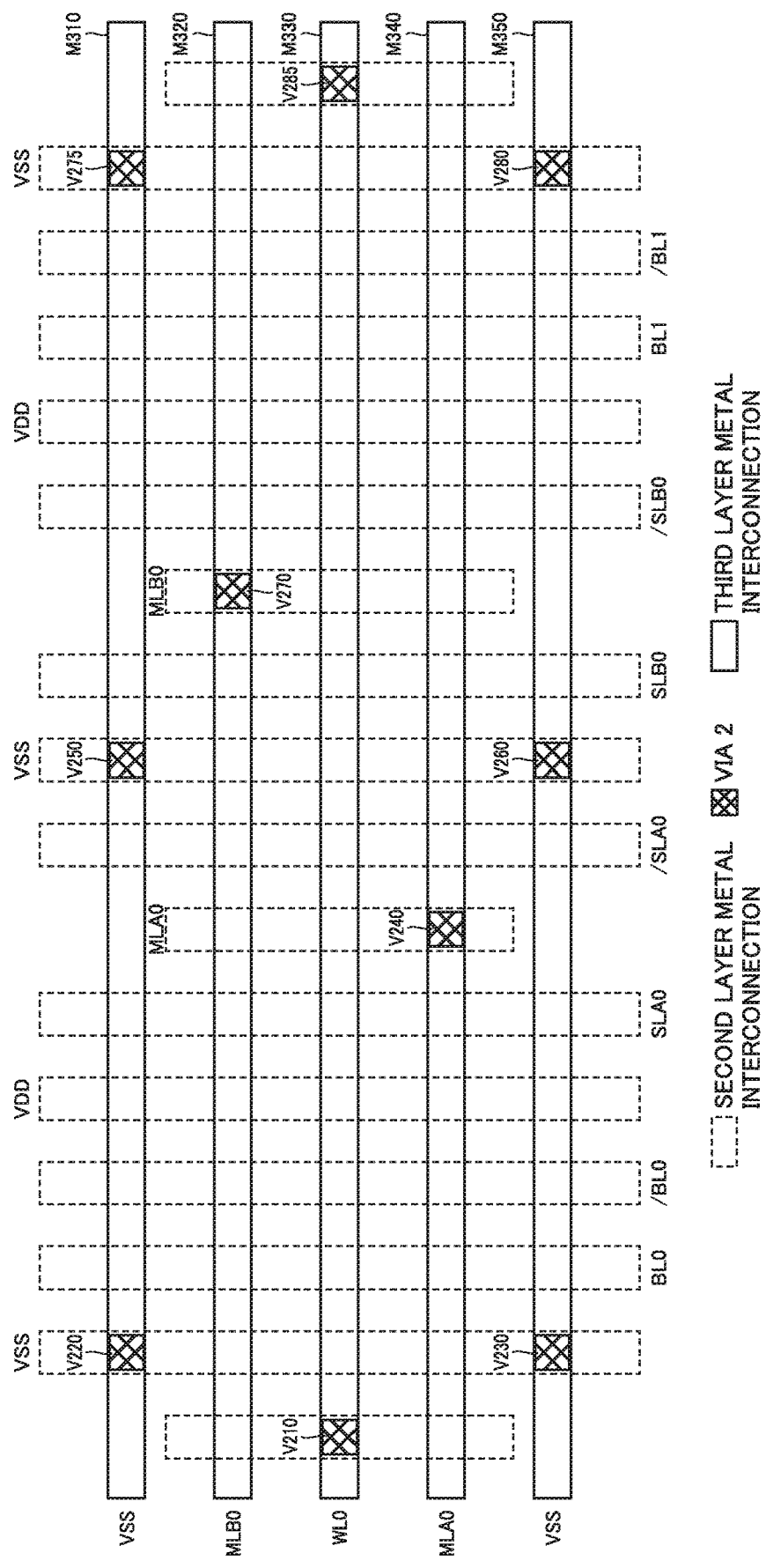
FIG. 15 is a plan view showing an arrangement of a via 2, a second layer metal interconnection layer, and a third layer metal interconnection layer in the memory cell arranged in the semiconductor device.

The following is an explanation about memory cell MC0#0 arranged in semiconductor device 1000 in the layout configuration divided in the stacking direction by way of example with reference to FIGS. 13 to 15. Since the same elements as those in FIGS. 3 to 5 are designated by the same reference characters, the description thereof will not be repeated.

FIG. 13 is a plan view showing an arrangement of a well, a diffusion region DF, a polysilicon P0, a contact hole CT, and a first layer metal interconnection in memory cell MC0#0 arranged in semiconductor device 1000.

As shown in FIG. 13, polysilicon (P0) forming a gate of each transistor extends in the row direction while the plurality of wells forming a memory cell extend in the column direction. Thus, each gate and each well extend in the direction orthogonal to each other. Furthermore, each well in a memory cell is formed so as to be continuous to the corresponding well in the memory cell (memory cell MC0#1) adjacent thereto in the column direction.

In memory cell MC0#0 according to an embodiment, P well PW0 having a P type conductivity type, N well NW0 having an N type conductivity type, P well PW1, N well NW1, and P well PW2 are formed sequentially in this order in the direction in which word line WL0 extends (in the row direction). In a region in which N well NW1 and P well PW2 are provided, NMOS transistors NA2, NA3, ND2, ND3 and PMOS transistors P2, P3 that form data cell DC0 are arranged. More specifically, PMOS transistors P2 and P3 are arranged in N well NW1 while NMOS transistors NA2, NA3, ND2, and ND3 are arranged in P well PW2.

PMOS transistor P3 has a source and a drain that are formed by one pair of P type diffusion regions FL360 and FL362, and also has a polysilicon gate disposed therebetween. P type diffusion region FL362 is connected through a contact hole CT66 to a power supply line VDD formed on the upper metal interconnection layer.

PMOS transistor P2 has a source and a drain that are formed by one pair of P type diffusion regions FL362 and FL364, and also has a polysilicon gate disposed therebetween.

NMOS transistor NA3 has a source and a drain that are formed by one pair of N type diffusion regions FL366 and FL368, and also has a polysilicon gate disposed therebetween. This gate is electrically connected through a contact hole CT84 to word line WL0 formed on the upper metal interconnection layer. N type diffusion region FL366 is electrically connected through a contact hole CT74 to bit line /BL1 formed on the upper metal interconnection layer.

NMOS transistor ND3 has a source and a drain that are formed by one pair of N type diffusion regions FL368 and FL370, and also has a polysilicon gate disposed therebetween. N type diffusion region FL370 is connected through a contact hole CT78 to power supply line VSS formed on the upper metal interconnection layer.

NMOS transistor ND2 has a source and a drain that are formed by one pair of N type diffusion regions FL370 and FL372, and also has a polysilicon gate disposed therebetween. P type diffusion region FL360, N type diffusion region FL368, and the gate of NMOS transistor ND2 are connected through contact holes CT64, CT76 and CT72, respectively, to the common first layer metal interconnection. Thus, these elements are electrically connected to each other. P type diffusion region FL364, the gate of PMOS transistor P3, and N type diffusion region FL372 are connected through contact holes CT68, CT70 and CT80, respectively, to the common first layer metal interconnection. Thus, these elements are electrically connected to each other.

NMOS transistor NA2 has a source and a drain that are formed by one pair of N type diffusion regions FL372 and FL374, and also has a polysilicon gate disposed therebetween. This gate is electrically connected through a contact hole CT86 to word line WL0 formed on the upper metal interconnection layer. N type diffusion region FL374 is electrically connected through a contact hole CT82 to bit line BL1 formed on the upper metal interconnection layer.

The gate of NMOS transistor NS3, the gate of NMOS transistor NS7, the gate of PMOS transistor P3, and the gate of NMOS transistor ND3 are formed by common polysilicon.

The gate of PMOS transistor P2 and the gate of NMOS transistor ND2 are formed by common polysilicon.

NMOS transistors NA0, ND0, ND1, and NA1 are arranged in the common N type diffusion layer. PMOS transistors P0 and P1 are arranged in the common P type diffusion layer. PMOS transistors P3 and P2 are arranged in the common P type diffusion layer. NMOS transistors NA3, ND3, ND2, and NA2 are arranged in the common N type diffusion layer.

As shown in FIG. 13, the memory cell forming semiconductor device 1000 has a configuration in which NMOS transistors NS0 to NS7 for data search are arranged in two N type diffusion layers DF. Generally, the TCAM device has a configuration in which a transistor for data search is arranged in one diffusion layer DF. Thus, in the memory array forming semiconductor device 1000, the physical distance of the memory cells arranged adjacent to each other in the row direction is slightly longer than that of a commonly-used TCAM device. Thereby, semiconductor device 1000 can reduce the probability of occurrence of a multi bit error.

FIG. 14 is a plan view showing an arrangement of a via 1, a first layer metal interconnection layer, and a second layer metal interconnection layer in memory cell MC0#0 arranged in semiconductor device 1000. In FIG. 14, second layer metal interconnections M202 to M248 are arranged in the column direction.

P type diffusion region FL362 forming sources of PMOS transistors P3 and P2 is connected to the first layer metal interconnection through contact hole CT66. This first layer metal interconnection is connected through a via 1 V130 to second layer metal interconnection M240 that forms power supply line VDD.

N type diffusion region FL374 forming a source of NMOS transistor NA2 is connected through a contact hole CT82 to the first layer metal interconnection. This first layer metal interconnection is connected through a via 1 V132 to second layer metal interconnection M242 that forms bit line BL1.

N type diffusion region FL366 forming a source of NMOS transistor NA3 is connected through a contact hole CT74 to first layer metal interconnection. This first layer metal interconnection is connected through a via 1 V134 to second layer metal interconnection M244 that forms bit line /BL1.

N type diffusion region FL370 forming sources of NMOS transistors ND3 and ND2 is connected through a contact hole CT78 to the first layer metal interconnection. This first layer metal interconnection is connected through a via 1 V136 to second layer metal interconnection M246 that forms power supply line VSS.

The gate of NMOS transistor NA3 and the gate of NMOS transistor NA2 are connected through contact holes CT84 and CT86, respectively, to different first layer metal interconnections. These first layer metal interconnections are connected through a via 1 V138 and a via 1 V140, respectively, to the common second layer metal interconnection M248 that forms word line WL0.

FIG. 15 is a plan view showing an arrangement of a via 2, a second layer metal interconnection layer, and a third layer metal interconnection layer in memory cell MC0#0 arranged in semiconductor device 1000.

Second layer metal interconnection M246 is connected through a via 2 V275 and a via 2 V280 to third layer metal interconnections M310 and M350, respectively, that form power supply line VSS.

Second layer metal interconnection M248 is connected through a via 2 V285 to third layer metal interconnection M330 that forms word line WL0.

By forming a layout as described above, a highly integrated TCAM memory array can be realized with layers up to the third layer metal interconnection layer. If the number of interconnection layers can be suppressed, the manufacturing cost can be reduced.

Figure 16:
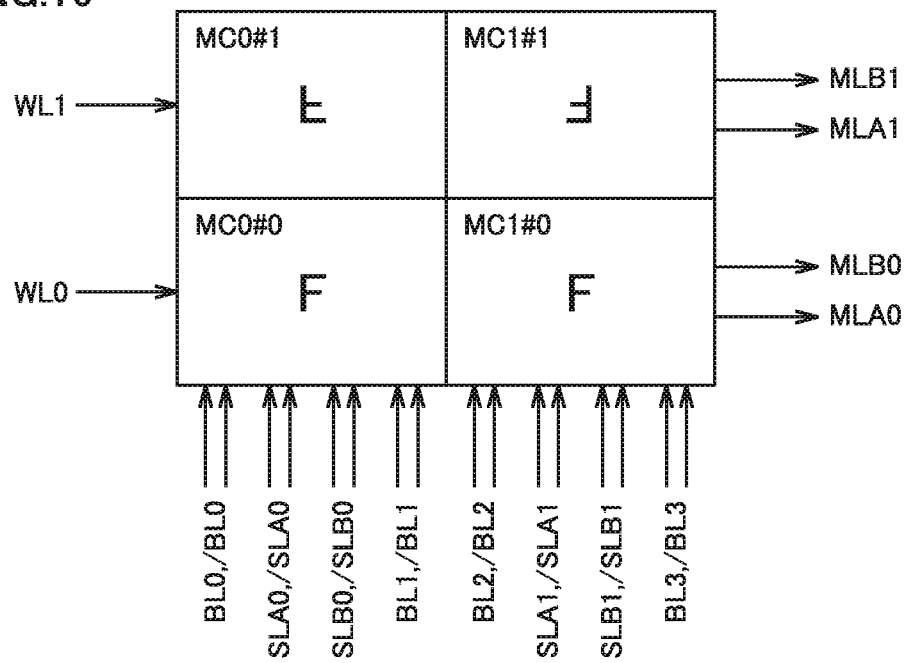
FIG. 16 is a diagram illustrating a metal interconnection pattern in a memory cell according to an embodiment.

FIG. 16 is a diagram illustrating a metal interconnection pattern in a memory cell according to an embodiment. The alphabetical character "F" in the figure shows the direction of the metal interconnection pattern. By way of example, the direction of the metal interconnection pattern in memory cell MC0#0 shown in each of FIGS. 13 to 15 is defined as "F".

In this case, the metal interconnection pattern of memory cell MC0#1 that is adjacent to memory cell MC0#0 in the column direction represents an interconnection pattern obtained by arranging the interconnection pattern of memory cell MC0#0 so as to be axisymmetrically in the row direction.

On the other hand, the metal interconnection pattern of memory cell MC1#0 that is adjacent to memory cell MC0#0 in the row direction represents an interconnection pattern that is the same as the interconnection pattern of memory cell MC0#0 in an example shown in FIG. 16. In another aspect, the metal interconnection pattern of memory cell MC1#0 may be an interconnection pattern that is obtained by arranging the interconnection pattern of memory cell MC0#0 so as to be axisymmetrically in the column direction.

Modifications

In semiconductor device 1000 as a TCAM device as described above, the transistor for data search is an NMOS transistor (NS01 to N507). A TCAM device using a PMOS transistor as a transistor for data search will be hereinafter described.

Figure 17:
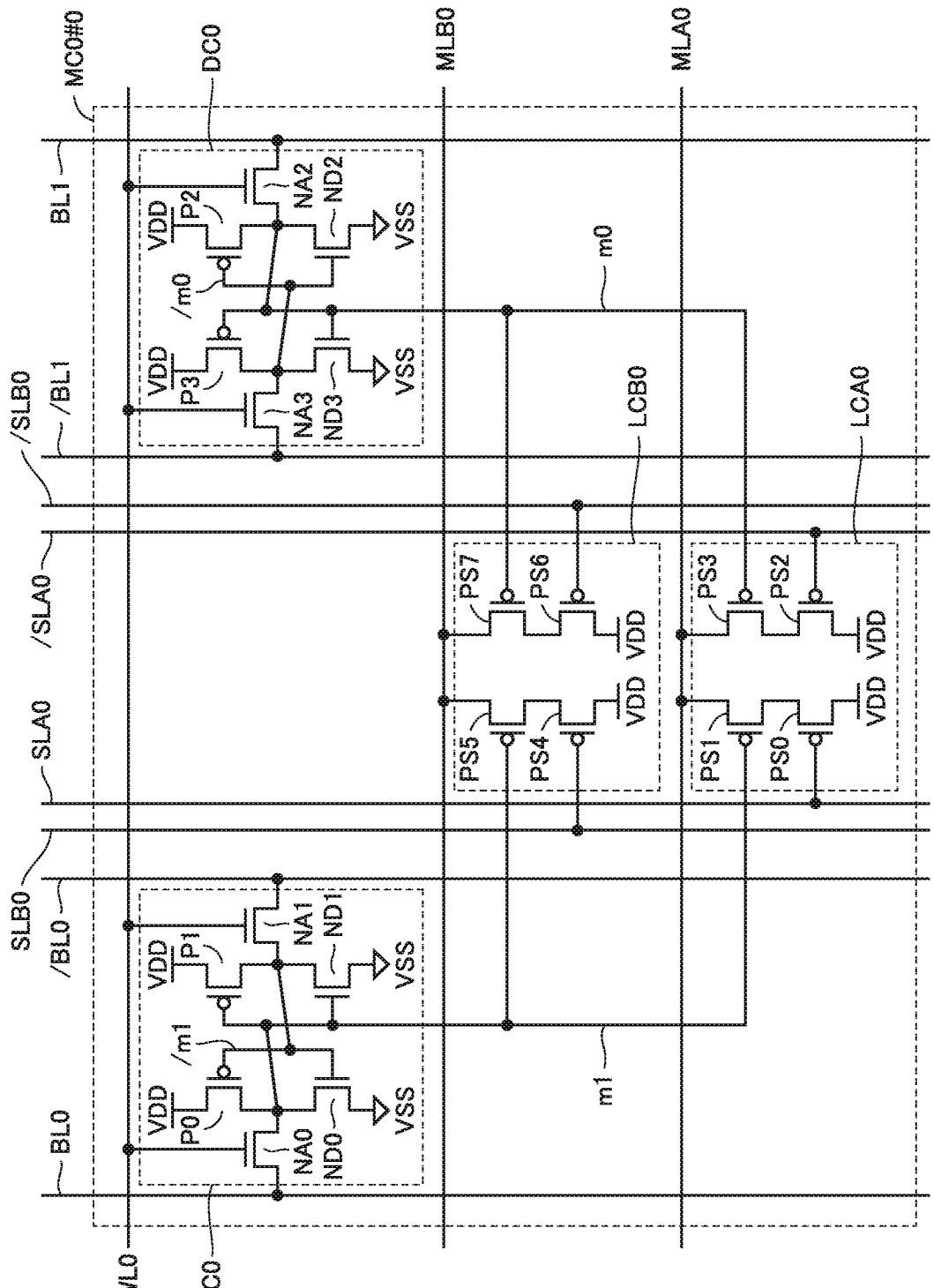
FIG. 17 is a circuit diagram illustrating a configuration example of a memory cell as a TCAM cell according to another embodiment.

FIG. 17 is a circuit diagram illustrating a configuration example of memory cell MC0#0 as a TCAM cell according to another embodiment. In FIG. 17, since the same elements as those in FIG. 11 are designated by the same reference characters, the description thereof will not be repeated.

Logical operation cell LCA0 according to another embodiment includes PMOS transistors PS0, P51, PS2, and PS3 in place of NMOS transistors NS0, NS1, NS2, and NS3. Logical operation cell LCB0 according to another embodiment includes PMOS transistors PS4, PS5, PS6, and PS7 in place of NMOS transistors NS4, NS5, NS6, and NS7.

PMOS transistors PS0 and PS1 are connected in series between match line MLA0 and power supply line VDD. Also, PMOS transistors PS0 and PS1 have gates to which search line SLA0 and storage node m1 are respectively connected. PMOS transistors PS2 and PS3 are connected in series between match line MLA0 and power supply line VDD. Also, PMOS transistors PS2 and PS3 have gates to which search line /SLA0 and storage node m0 are respectively connected.

PMOS transistors PS4 and PS5 are connected in series between match line MLB0 and power supply line VDD. Also, PMOS transistors PS4 and PS5 have gates to which search line SLB0 and storage node m1 are respectively connected. PMOS transistors PS6 and PS7 are connected in series between match line MLB0 and power supply line VDD. Also, PMOS transistors PS6 and PS7 have gates to which search line /SLB0 and storage node m0 are respectively connected.

The relation between the data in memory cell MC0#0 arranged in semiconductor device 1000 and the data held by each of data cell DC0 and mask data cell MDC0 is illustrated in FIG. 12. In a certain aspect, the relation shown in FIG. 17 between the data in memory cell MC0#0 and the data held by each of data cell DC0 and mask data cell MDC0 is different from the relation shown in FIG. 12.

FIG. 18 is a diagram showing, in a table form, the correspondence relation between the data held by each of data cell DC0 and mask data cell MDC0 and the data in memory cell MC0#0 in FIG. 17.

Referring to FIG. 18, when "1" is stored in storage node m0 of data cell DC0 and "0" is stored in storage node m1 of mask data cell MDC0, "0" is assumed to be stored in memory cell MC0#0. When "0" is stored in storage node m0 of data cell DC0 and "1" is stored in storage node m1 of mask data cell MDC0, "1" is assumed to be stored in memory cell MC0#0. When "1" is stored in storage node m0 of data cell DC0 and "1" is stored in storage node m1 of mask data cell MDC0, "*" (don't care) is assumed to be stored in memory cell MC0#0. Memory cell MC0#0 is configured such that "0" is not stored simultaneously in storage node m0 of data cell DC0 and in storage node m1 of mask data cell MDC0. As described above, the TCAM cell (memory cell MC0#0) employing a PMOS transistor as a transistor for data search may hold data in a manner opposite to the manner in which the TCAM cell employing an NMOS transistor holds data (FIG. 12).

Figure 19:
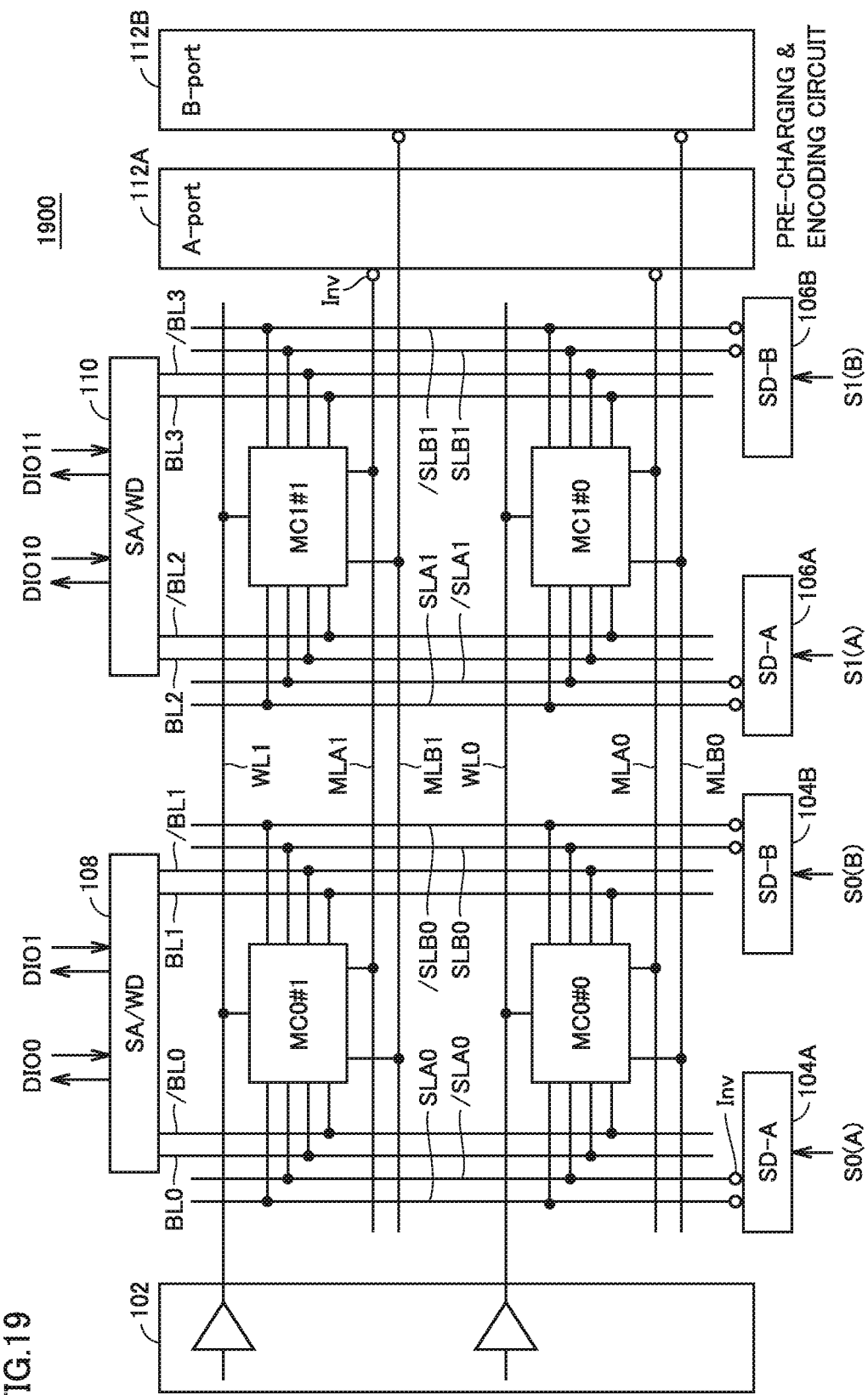
FIG. 19 is a block diagram illustrating a configuration example of a semiconductor device according to another embodiment.

FIG. 19 is a block diagram illustrating a configuration example of a semiconductor device 1900 according to another embodiment. In FIG. 19, since the same elements as those in FIG. 10 are designated by the same reference characters, the description thereof will not be repeated.

Memory cells MC0#0 to MC1#1 arranged in semiconductor device 1900 includes a PMOS transistor as a transistor for data search, as illustrated in FIG. 17.

Similar to semiconductor device 700 illustrated in FIG. 7, semiconductor device 1900 includes search drivers 104A, 104B, 106A, and 106B each having an output terminal provided with an inverter Inv, and also includes pre-charging & encoding circuits 112A and 112B each having an input terminal provided with an inverter Inv. As a result, the level of each search line shows an electric potential at the inverted level of the signal output from the search driver connected thereto. Also, pre-charging & encoding circuits 112A and 112B each receive an input of the signal of an inverted level on each match line connected thereto. Also, due to the effect of inverter Inv, each match line is pre-charged to the inverted level of the signal output from the pre-charging & encoding circuit connected thereto. In a certain aspect, each match line is pre-charged to an "L" level.

The search operation of semiconductor device 1900 will be hereinafter described with reference to FIGS. 17 to 19. When the data in memory cell MC0#0 matches the search data, the level on the match line is maintained at the "L" level. On the other hand, when the data in memory cell MC0#0 does not match the search data, the level on the match line becomes an "H" level.

The following is an explanation about the case where search data signal S0(A) is "1" by way of example. In this case, the level on search line SLA0 is inverted by inverter Inv and becomes an "L" level. Thus, PMOS transistor PS0 connected to search line SLA0 is brought into an ON state. In the above-described case, when the data in memory cell MC0#0 is "0", that is, when the data in memory cell MC0#0 does not match the search data, PMOS transistor PS1 is brought into an ON state, and match line MLA0 becomes an "H" level. On the other hand, when the data in memory cell MC0#0 is "1", that is, when the data in memory cell MC0#0 matches the search data, PMOS transistor PS1 is brought into an OFF state, and match line MLA0 is maintained at the pre-charged "L" level.

According to the above description, due to the effect of inverter Inv, pre-charging & encoding circuit receives an input of the "H" level when the data held by each memory cell matches the corresponding search data, and receives an input of the "L" level when even one piece of data does not match the corresponding search data. This also applies to the pre-charging & encoding circuit included in semiconductor device 1000 as described above.

Therefore, merely by providing an inverter at the output terminal of each search drivers and at the input terminal of each pre-charging & encoding circuit, semiconductor device 1900 may use a memory cell including a PMOS transistor as a transistor for data search.

Figure 20:
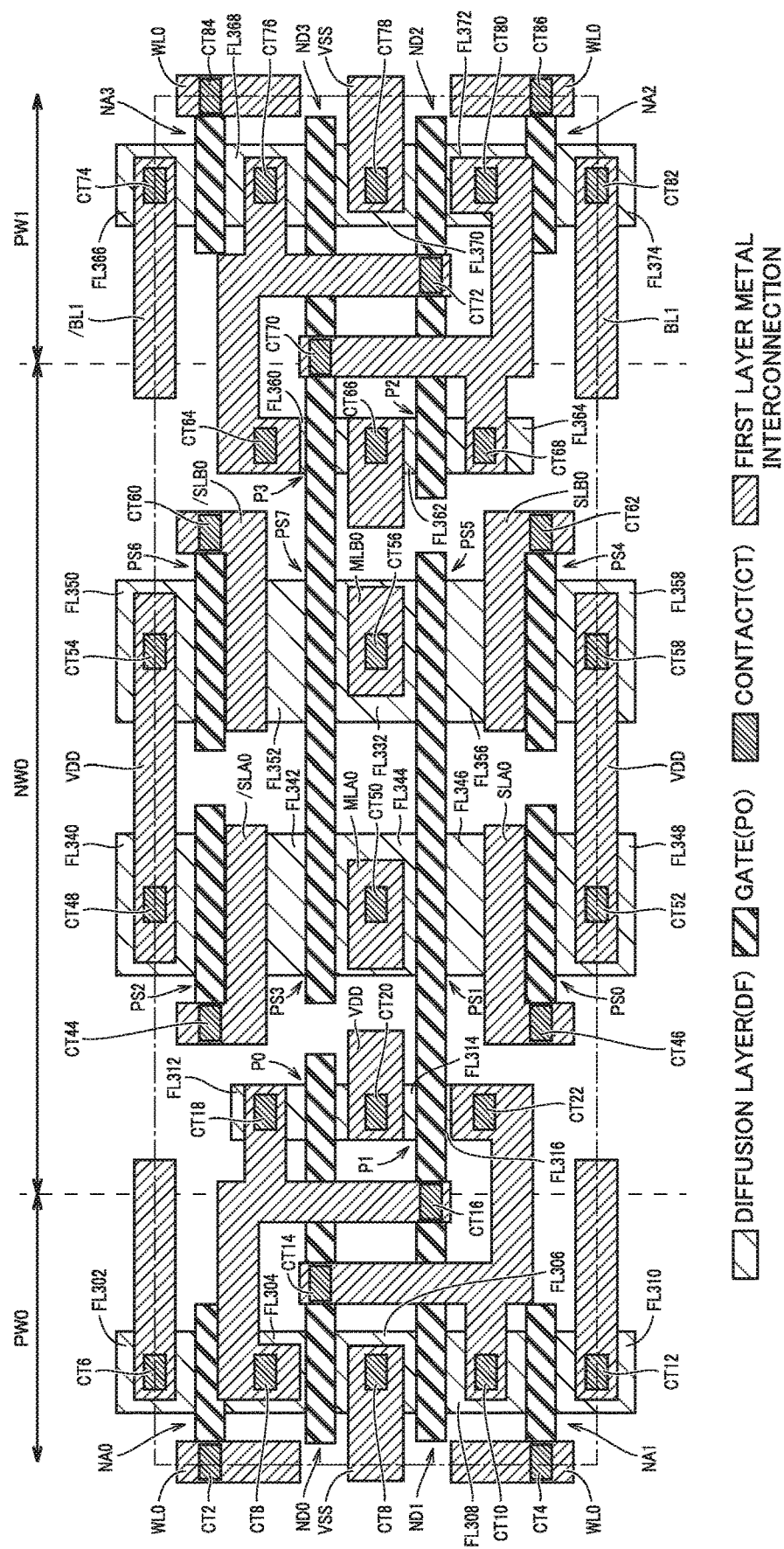
FIG. 20 is a plan view showing an arrangement of a well, a diffusion region, a polysilicon, a contact hole, and a first layer metal interconnection in the memory cell as a TCAM cell according to another embodiment.

FIG. 20 is a plan view showing an arrangement of a well, a diffusion region DF, a polysilicon P0, a contact hole CT, and a first layer metal interconnection in memory cell MC0#0 as a TCAM cell according to another embodiment. In FIG. 20, since the same elements as those in FIGS. 8 and 13 are designated by the reference characters, the description thereof will not be repeated.

As shown in FIG. 20, the layout of MC0#0 according to another embodiment may have a configuration in which the layout of the BCAM cell shown in FIG. 8 additionally incorporates N well NW1, P well PW2 and a configuration arranged on these wells that are provided in the layout of the TCAM cell shown in FIG. 13. Since N well NW0 shown in FIG. 8 and N well NW1 shown in FIG. 13 are adjacent to each other, these N well NW0 and N well NW1 are represented as one N well NW0 in FIG. 20. Also, P well PW2 shown in FIG. 13 corresponds to a P well PW1 in FIG. 20.

Since each of the memory cells forming semiconductor device 1900 does not have N well NW1 and P well PW2, the number of wells in each of memory cells forming semiconductor device 1900 is less by two than the number of wells in each of memory cells forming semiconductor device 1000. Accordingly, the memory cells forming semiconductor device 1900 can be reduced in size than the memory cells forming semiconductor device 1000.

Since the interconnection patterns of the second layer metal interconnection and the third layer metal interconnection may be implemented by the same interconnection pattern as those in the examples shown in FIGS. 14 and 15, the description thereof will not be repeated.

Third Embodiment

The data cell and the mask data cell forming the TCAM cell illustrated in the second embodiment are arranged adjacent to each other in the row direction, connected to the common word line, and connected to different bit line pairs. In the third embodiment, another configuration of the TCAM cell will be described. More specifically, the data cell and the mask data cell forming a TCAM cell are arranged adjacent in the column direction, connected to the common bit line pair, and connected to different word lines. The above-described configuration will be specifically described below.

Figure 21:
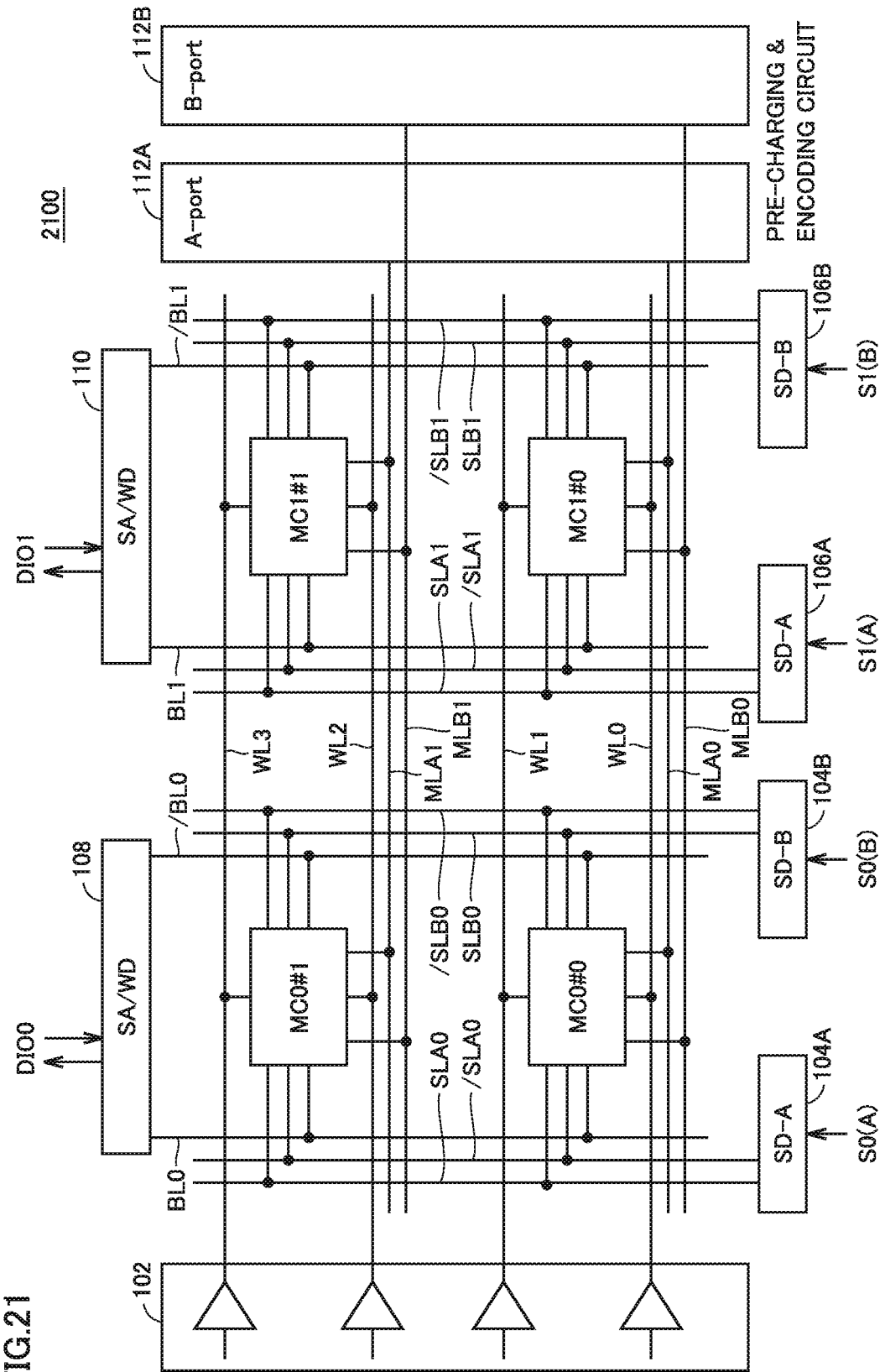
FIG. 21 is a block diagram illustrating a configuration example of a semiconductor device according to an embodiment.

FIG. 21 is a block diagram illustrating a configuration example of a semiconductor device 2100 according to an embodiment. In FIG. 21, since the same elements as those in FIG. 10 are designated by the same reference characters, the description thereof will not be repeated.

Each of memory cells forming semiconductor device 2100 is connected to two word lines, one set of bit line pair, two sets of search line pairs, and two match lines. For example, memory cell MC0#0 is connected to word lines WL0, WL1, bit line pair BL0, /BL0, search line pairs SLA0, /SLA0 and SLB0, /SLB0, and match lines MLA0, MLB0.

Circuit Configuration of Memory Cell

Figure 22:
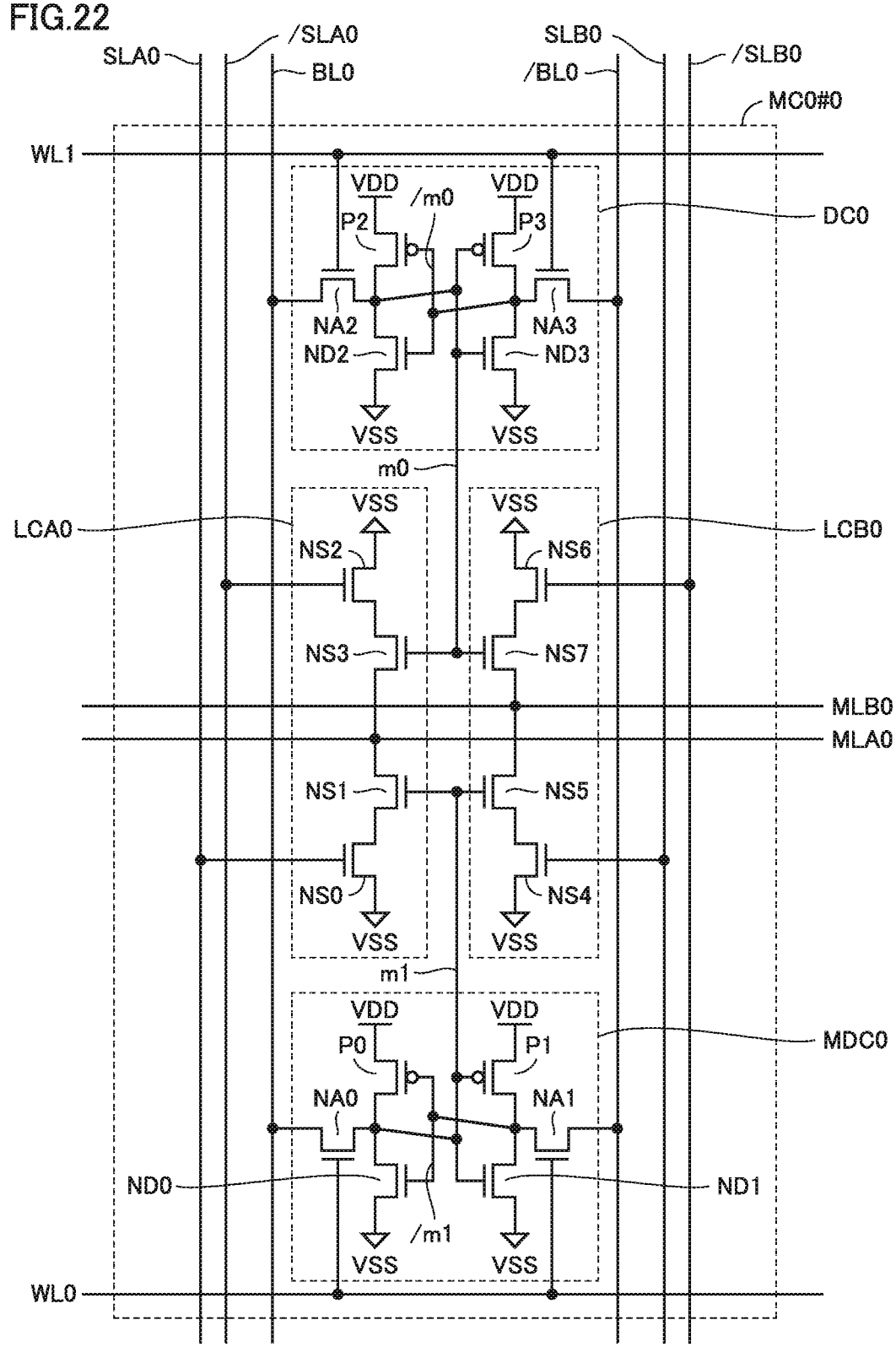
FIG. 22 is a circuit diagram illustrating a configuration example of a memory cell in the semiconductor device.

FIG. 22 is a circuit diagram illustrating a configuration example of memory cell MC0#0 in a semiconductor device 2100. Referring to FIG. 22, memory cell MC0#0 includes a data cell DC0 and a mask data cell MDC0, each of which is configured to be capable of holding 1-bit data. Data cell DC0 and mask data cell MDC0 are arranged adjacent to each other in the column direction.

Mask data cell MDC0 is formed by NMOS transistors NA0, NA1, ND0, ND1 and PMOS transistors P0, P1.

NMOS transistor NA0 is connected between storage node m1 and bit line BL0, and has a gate to which word line WL0 is connected. NMOS transistor NA1 is connected between storage node /m1 and bit line /BL0, and has a gate to which word line WL0 is connected. PMOS transistor P0 is connected between power supply line VDD and storage node m1, and has a gate connected to storage node /m1. NMOS transistor ND0 is connected between storage node m1 and power supply line VSS, and has a gate connected to storage node /m1. PMOS transistor P1 is connected between power supply line VDD and storage node /m1, and has a gate connected to storage node m1. NMOS transistor ND1 is connected between storage node /m1 and power supply line VSS, and has a gate connected to storage node m1.

NMOS transistor ND0 and PMOS transistor P0 form an inverter. NMOS transistor ND1 and PMOS transistor P1 also form an inverter. The output of one inverter is connected to the input of the other inverter. A flip-flop formed by NMOS transistors ND0 and ND1 and PMOS transistors P0 and P1 holds 1-bit information.

Data cell DC0 is formed by NMOS transistors NA2, NA3, ND2, and ND3, and PMOS transistors P2 and P3.

NMOS transistor NA2 is connected between storage node m0 and bit line BL0, and has a gate to which word line WL1 is connected. NMOS transistor NA3 is connected between storage node /m0 and bit line /BL0, and has a gate to which word line WL1 is connected. PMOS transistor P2 is connected between power supply line VDD and storage node m0, and has a gate connected to storage node /m0. NMOS transistor ND2 is connected between storage node m0 and power supply line VSS, and has a gate connected to storage node /m0. PMOS transistor P3 is connected between power supply line VDD and storage node /m0, and has a gate connected to storage node m0. NMOS transistor ND3 is connected between storage node /m0 and power supply line VSS, and has a gate connected to storage node m0.

NMOS transistor ND2 and PMOS transistor P2 form an inverter. NMOS transistor ND3 and PMOS transistor P3 also form an inverter. The output of one inverter is connected to the input of the other inverter. A flip-flop formed by NMOS transistors ND2 and ND3 and PMOS transistors P2 and P3 holds 1-bit information.

As described above, data cell DC0 and mask data cell MDC0 are connected to the common bit line pair BL0, /BL0. Furthermore, data cell DC0 and mask data cell MDC0 are connected to different word lines WL0 and WL1, respectively.

Memory cell MC0#0 has logical operation cells LCA0 and LCB0 between data cell DC0 and mask data cell MDC0. Logical operation cells LCA0 and LCB0 are arranged adjacent to each other in the row direction.

Logical operation cell LCA0 outputs the result to match line MLA0, the result being obtained based on the data held by each of data cell DC0 and mask data cell MDC0, and on the A-port search data. Logical operation cell LCB0 outputs the result to match line MLA0, the result being obtained based on the data held by each of data cell DC0 and mask data cell MDC, and on the B-port search data.

Logical operation cell LCA0 includes NMOS transistors NS0 to NS3. Logical operation cell LCB0 includes NMOS transistors NS4 to NS7.

NMOS transistors NS0 and NS1 are connected in series between match line MLA0 and power supply line VSS. Also, NMOS transistors NS0 and NS1 have gates to which search line SLA0 and storage node m1 are respectively connected. NMOS transistors NS2 and NS3 are connected in series between match line MLA0 and power supply line VSS. Also, NMOS transistors NS2 and NS3 have gates to which search line /SLA0 and storage node m0 are respectively connected.

NMOS transistors NS4 and NS5 are connected in series between match line MLB0 and power supply line VSS. Also, NMOS transistors NS4 and NS5 have gates to which search line SLB0 and storage node m1 are respectively connected. NMOS transistors NS6 and NS7 are connected in series between match line MLB0 and power supply line VSS. Also, NMOS transistors NS6 and NS7 have gates to which search line /SLB0 and storage node m0 are respectively connected.

The data in memory cell MC0#0 shown in FIG. 22 is assumed to be the same as the data in memory cell MC0#0 shown in FIG. 12. In other words, when storage node m0 of data cell DC0 is "0" and when storage node m1 of mask data cell MDC0 is "1", "0" is assumed be stored in memory cell MC0#0. When storage node m0 of data cell DC0 is "1" and when storage node m1 of mask data cell MDC0 is "0", "1" is assumed to be stored in memory cell MC0#0. When storage node m0 of data cell DC0 is "0" and when storage node m1 of mask data cell MDC0 is "0", "*" (don't care) is assumed to be stored in memory cell MC0#0. Memory cell MC0#0 is configured such that "1" is not stored simultaneously in storage node m0 of data cell DC0 and in storage node m1 of mask data cell MDC0.

Writing Operation

The operation of writing data onto memory cell MC0#0 shown in FIG. 22 will be hereinafter described. When data is written onto memory cell MC0#0, row decoder 102 first activates word line WL0 to an "H" level, and deactivates other word lines (that is, word lines WL1 to WL3) to an "L" level. Then, read/write circuit 108 drives bit line BL0 to the level corresponding to input data DIO00, and drives bit line BL0 to its inverted level. Thereby, semiconductor device 2100 writes data onto data cell DC0. When writing of data onto data cell DC0 is completed, read/write circuit 108 sets the level of bit line pair BL0, /BL0 at an "L" level.

Then, row decoder 102 activates word line WL1 to an "H" level, and deactivates other word lines to an "L" level. Then, read/write circuit 108 drives bit line BL0 to the level corresponding to input data DIO01, and drives bit line /BL0 to its inverted level. Thereby, semiconductor device 2100 writes data onto mask data cell MDC0. When writing of data onto data cell DC0 is completed, read/write circuit 108 sets the level of bit line pair BL0, /BL0 at an "L" level. Semiconductor device 2100 performs this series of operations in two cycles. In another aspect, semiconductor device 2100 may perform writing of data onto mask data cell MDC0 in the first one cycle, and may perform writing of data onto data cell DC0 in the next one cycle.

Search Operation

Then, the search operation will be hereinafter described. According to the configuration of memory cell MC0#0 as described above, when the A-port search data is "1" (that is, search line SLA0 is "1" and search line /SLA0 is "0"), and when the data in memory cell MC0#0 is "0" (storage node m0 is "0" and storage node m1 is "1"), NMOS transistors NS0 and NS1 are brought into an ON state, so that the electric potential on pre-charged match line MLA0 is extracted to a ground potential. When the A-port search data is "0" (that is, search line SLA0 is "0" and search line /SLA0 is "1"), and when the data in memory cell MC0#0 is "1" (storage node m0 is "1" and storage node m1 is "0"), NMOS transistors NS2 and NS3 are brought into an ON state, so that the electric potential on pre-charged match line MLA0 is extracted to a ground potential. In other words, when the A-port search data does not match the data in memory cell MC0#0, the electric potential on match line MLA0 becomes an "L" level (ground potential).

On the other hand, when the A-port search data is "1" and the data in memory cell MC0#0 is "1" or "*", or when the A-port search data is "0" and the data in memory cell MC0#0 is "0" or "*" (that is, the A-port search data matches the data in memory cell MC0#0), the electric potential ("H" level) on pre-charged match line MLA0 is maintained.

As described above, the electric charge stored in match line MLA0 is extracted unless the data in each of the memory cells connected to match line MLA0 (memory cells MC0#0 and MC1#0) matches the corresponding A-port search data.

Since the behavior of match line MLB0 is the same as that of match line MLA0 described above, the description thereof will not be repeated.

According to the above description, semiconductor device 2100 functioning as a TCAM device can simultaneously search for the A-port search data and the B-port search data in one cycle, as with semiconductor device 1000 described above. Thus, when there are a plurality of search targets, semiconductor device 2100 can implement the searching speed that is twice as high as that of a single-port search device (a TCAM device).

In addition, this semiconductor device 2100 searches for the A-port search data and the B-port search data using a common memory array. Thus, semiconductor device 2100 can be suppressed from being increased in size.

Furthermore, according to the conventional TCAM device, a clock signal has to be generated twice in order to search for two pieces of search data. On the other hand, according to this semiconductor device 2100, a clock signal only has to be generated once in order to search for two pieces of search data. Thus, this semiconductor device 2100 can suppress power consumption as compared with the conventional device.

Layout of Memory Cell

Figure 23:
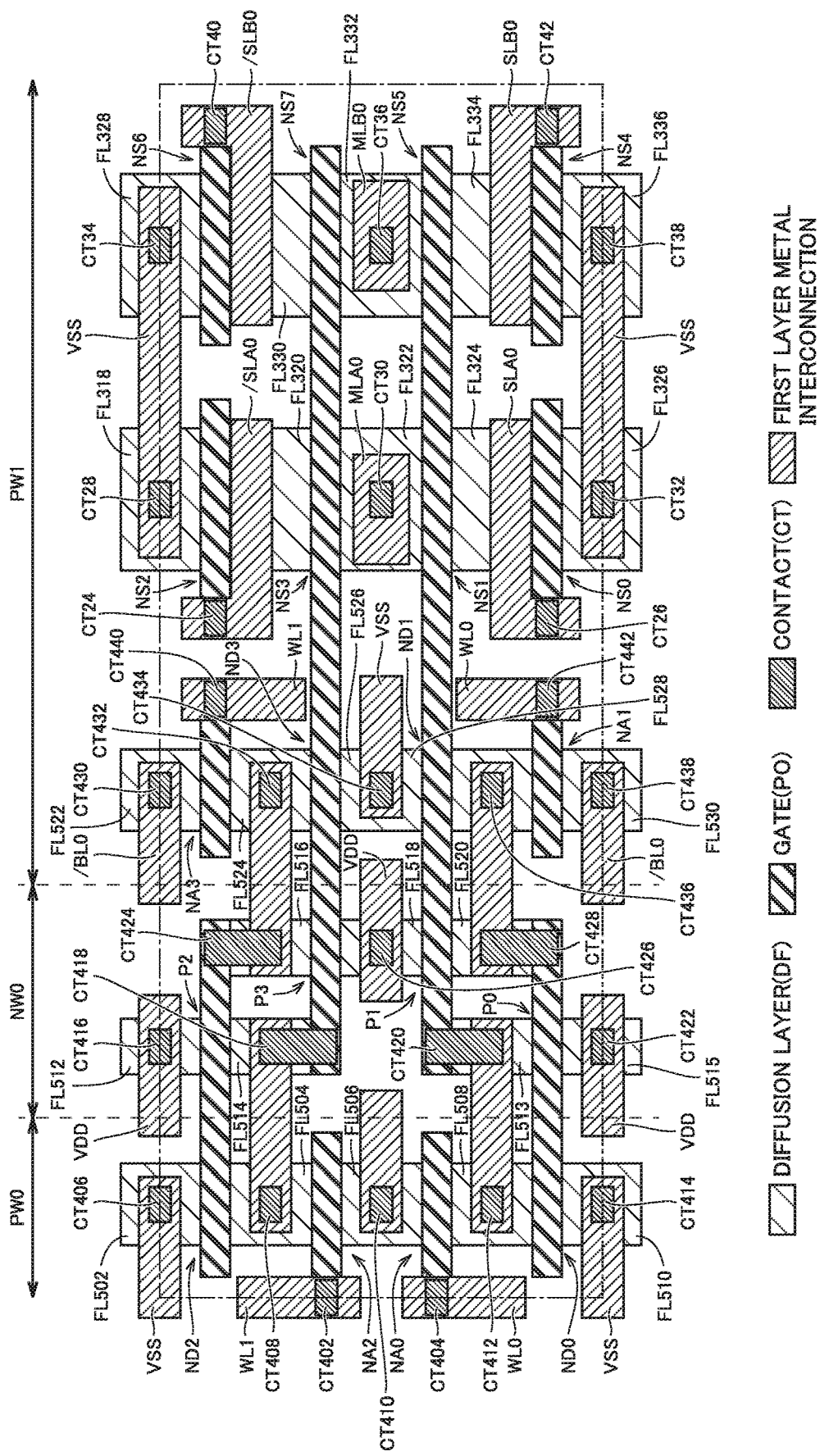
FIG. 23 is a plan view showing an arrangement of a well, a diffusion region, a polysilicon, a contact hole, and a first layer metal interconnection in the memory cell arranged in the semiconductor device.
Figure 24:
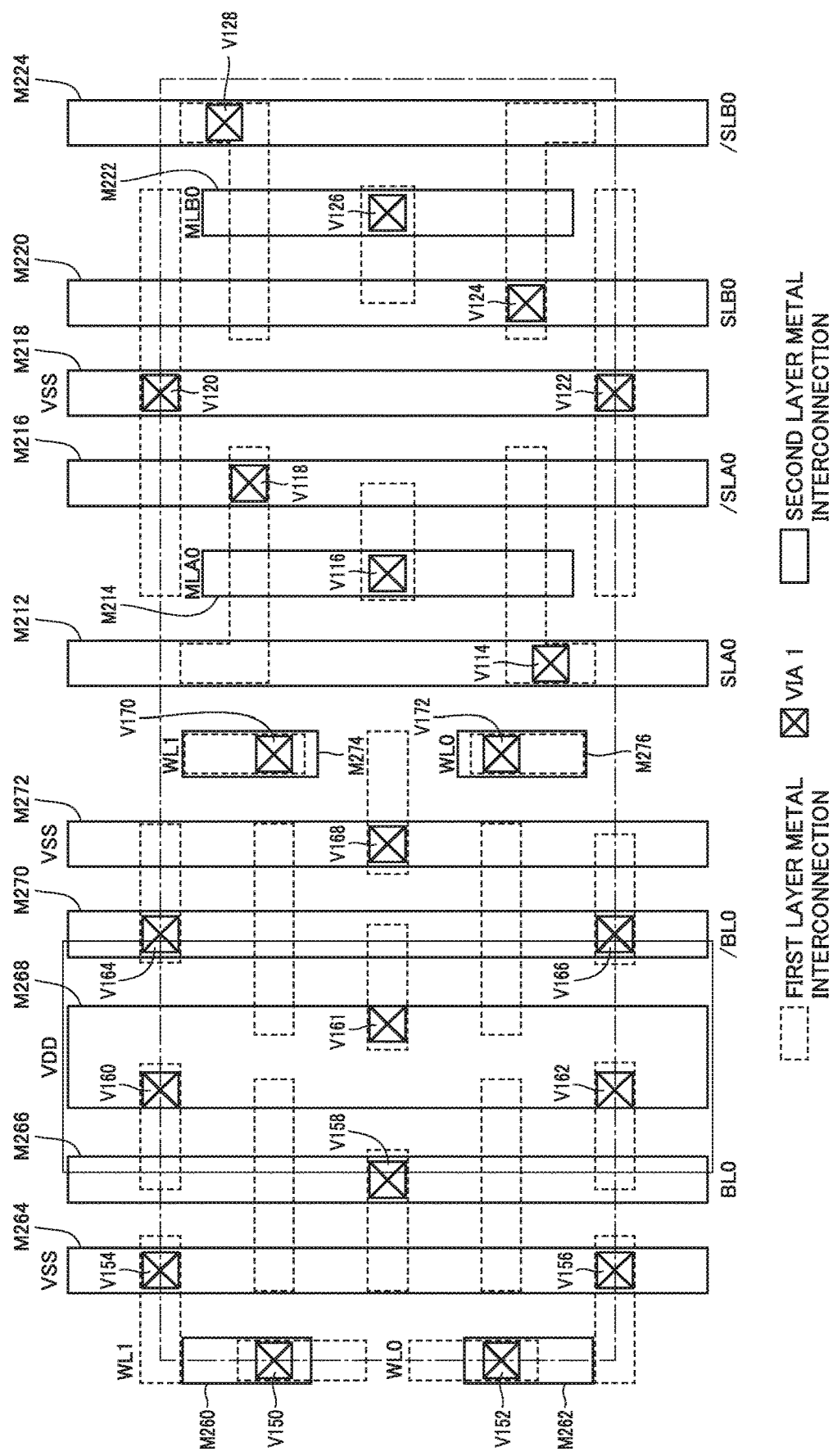
FIG. 24 is a plan view showing an arrangement of a via 1, a first layer metal interconnection layer, and a second layer metal interconnection layer in the memory cell arranged in the semiconductor device.
Figure 25:
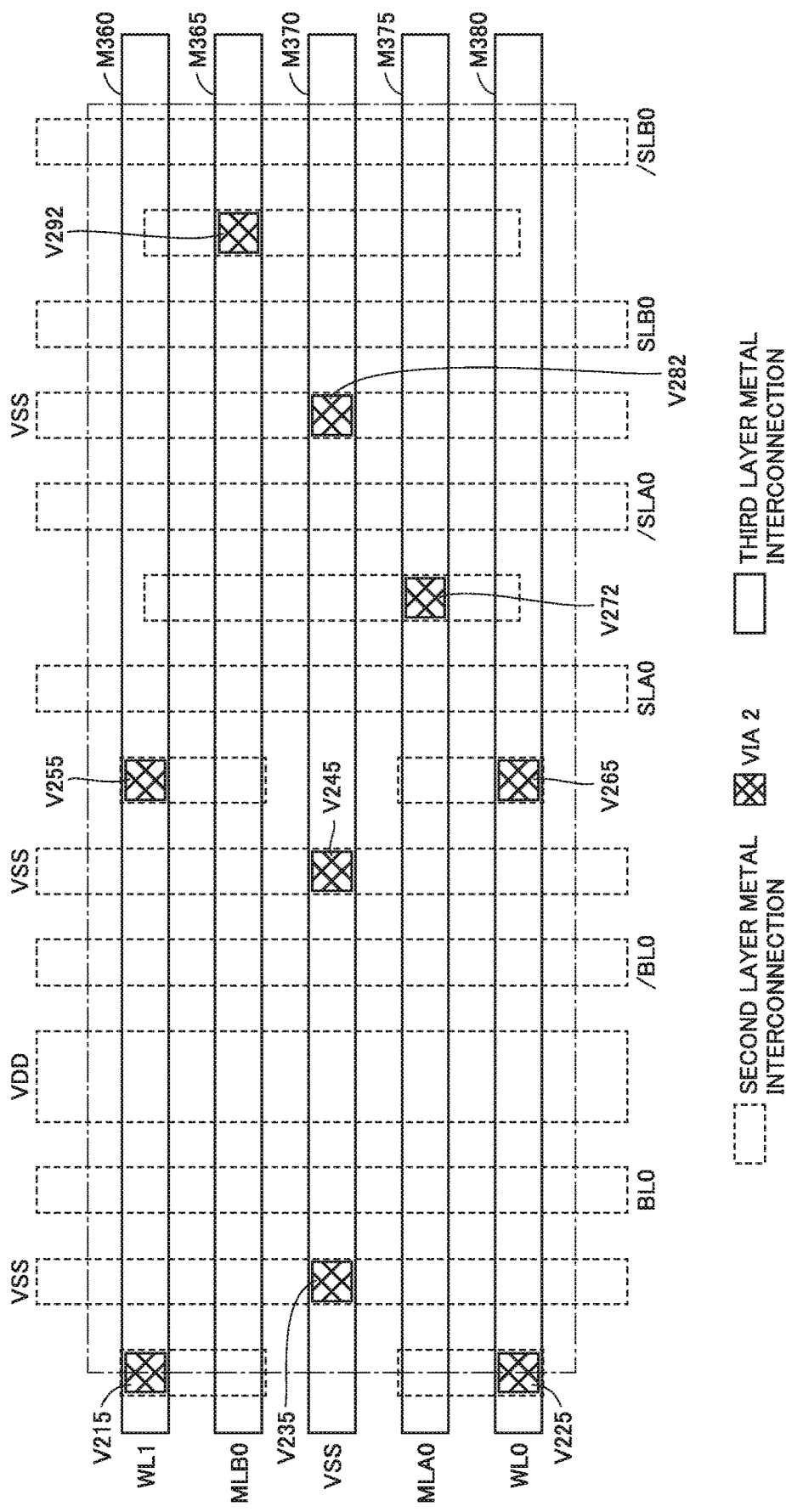
FIG. 25 is a plan view showing an arrangement of a via 2, a second layer metal interconnection layer, and a third layer metal interconnection layer in the memory cell arranged in the semiconductor device.

The following is an explanation about memory cell MC0#0 arranged in semiconductor device 2100 in the layout configuration divided in the stacking direction by way of example with reference to FIGS. 23 to 25. Since the same elements as those in FIGS. 13 to 15 are designated by the same reference characters, the description thereof will not be repeated.

FIG. 23 is a plan view showing an arrangement of a well, a diffusion region DF, a polysilicon P0, a contact hole CT, and a first layer metal interconnection in memory cell MC0#0 arranged in semiconductor device 2100.

In memory cell MC0#0 according to a certain embodiment, a P well PW0 having a P type conductivity type, an N well NW0 having an N type conductivity type, and a P well PW1 are formed sequentially in this order in the row direction. In P well PW0, NMOS transistors NA2 and ND2 forming data cell DC0 and NMOS transistors NA0 and ND0 forming mask data cell MDC0 are arranged. In N well NW0, PMOS transistors P0 and P1 forming data cell DC0 and PMOS transistors P2 and P3 forming mask data cell MDC0 are arranged. In P well PW1, NMOS transistors NA3 and ND3 forming data cell DC0 and NMOS transistors NA1 and ND1 forming mask data cell MDC0, and NMOS transistors NS0 to NS7 for data search are arranged.

NMOS transistor ND2 has a source and a drain that are formed by one pair of N type diffusion regions FL502, FL504, and also has a polysilicon gate disposed therebetween. N type diffusion region FL502 is electrically connected through a contact hole CT406 to power supply line VSS formed on the upper metal interconnection layer.

NMOS transistor NA2 has a source and a drain that are formed by one pair of N type diffusion regions FL504, FL506, and also has a polysilicon gate disposed therebetween. This gate is electrically connected through a contact hole CT402 to word line WL1 formed on the upper metal interconnection layer. N type diffusion region FL506 is electrically connected through a contact hole CT410 to bit line BL0 formed on the upper metal interconnection layer.

NMOS transistor NA0 has a source and a drain that are formed by one pair of N type diffusion regions FL506, FL508, and also has a polysilicon gate disposed therebetween. This gate is electrically connected through a contact hole CT404 to word line WL0 formed on the upper metal interconnection layer.

NMOS transistor ND0 has a source and a drain that are formed by one pair of N type diffusion regions FL508, FL510, and also has a polysilicon gate disposed therebetween. N type diffusion region FL510 is electrically connected through a contact hole CT414 to power supply line VSS formed on the upper metal interconnection layer.

NMOS transistors ND2, NA2, NA0, and ND0 are arranged in common N type diffusion layer DF.

PMOS transistor P2 has a source and a drain that are formed by one pair of P type diffusion regions FL512, FL514, and also has a polysilicon gate disposed therebetween. P type diffusion region FL514 and N type diffusion region FL504 are connected through a contact hole CT418 and a contact hole CT408, respectively, to the common first layer metal interconnection. Furthermore, contact hole CT418 is provided also in the gate of PMOS transistor P3 described later. Thus, P type diffusion region FL514, N type diffusion region FL504, and the gate of PMOS transistor P3 are electrically connected to each other. P type diffusion region FL512 is electrically connected through a contact hole CT416 to power supply line VDD formed on the upper metal interconnection layer.

PMOS transistor P0 has a source and a drain that are formed by one pair of P type diffusion regions FL513, FL515, and also has a polysilicon gate disposed therebetween. P type diffusion region FL513 and N type diffusion region FL508 are connected through a contact hole CT420 and a contact hole CT412, respectively, to the common first layer metal interconnection. Furthermore, contact hole CT420 is provided also in the gate of PMOS transistor P1 described later. Thus, P type diffusion region FL513, N type diffusion region FL508 and the gate of PMOS transistor P1 are electrically connected to each other. P type diffusion region FL515 is electrically connected through a contact hole CT422 to power supply line VDD formed on the upper metal interconnection layer.

PMOS transistor P3 has a source and a drain that are formed by one pair of P type diffusion regions FL516, FL518, and also has a polysilicon gate disposed therebetween. P type diffusion region FL516 and the gate of PMOS transistor P2 are electrically connected to each other through a common contact hole CT424. P type diffusion region FL516 and N type diffusion region FL524 that forms a drain of NMOS transistor NA3 described later are connected through contact holes CT424 and CT432, respectively, to the common first layer metal interconnection. Thus, P type diffusion region FL516, the gate of PMOS transistor P2 and N type diffusion region FL524 are electrically connected to each other. P type diffusion region FL518 is electrically connected through a contact hole CT426 to power supply line VDD formed on the upper metal interconnection layer.

PMOS transistor P1 has a source and a drain that are formed by one pair of P type diffusion regions FL518, FL520, and also has a polysilicon gate disposed therebetween. P type diffusion region FL520 and the gate of PMOS transistor P0 are electrically connected to each other through a common contact hole CT428. P type diffusion region FL520 and N type diffusion region FL528 that forms a drain of NMOS transistor NA1 described later are connected through contact holes CT428 and CT436, respectively, to the common first layer metal interconnection. Thus, P type diffusion region FL520, the gate of PMOS transistor P0 and N type diffusion region FL528 are electrically connected to each other. PMOS transistors P3 and P1 are arranged in common P type diffusion layer DF.

NMOS transistor NA3 has a source and a drain that are formed by one pair of N type diffusion regions FL522, FL524, and also has a polysilicon gate disposed therebetween. This gate is electrically connected through a contact hole CT440 to word line WL1 formed on the upper metal interconnection layer. N type diffusion region FL522 is electrically connected through a contact hole CT430 to bit line /BL0 formed on the upper metal interconnection layer.

NMOS transistor ND3 has a source and a drain that are formed by one pair of N type diffusion regions FL524, FL526, and also has a polysilicon gate disposed therebetween. N type diffusion region FL526 is electrically connected through a contact hole CT434 to power supply line VSS formed on the upper metal interconnection layer.

NMOS transistor ND1 has a source and a drain that are formed by one pair of N type diffusion regions FL526, FL528, and also has a polysilicon gate disposed therebetween.

NMOS transistor NA1 has a source and a drain that are formed by one pair of N type diffusion regions FL528, FL530, and also has a polysilicon gate disposed therebetween. This gate is electrically connected through a contact hole CT442 to word line WL0 formed on the upper metal interconnection layer. N type diffusion region FL530 is electrically connected through a contact hole CT438 to bit line /BL0 formed on the upper metal interconnection layer.

As described above, since each of memory cells forming semiconductor device 2100 does not include N well NW1 and P well PW2, the number of wells in each of memory cells forming semiconductor device 2100 is less by two than the number of wells in each of memory cells forming semiconductor device 1000 described with reference to FIG.

13. Thus, the memory cells forming semiconductor device 2100 may be further reduced in size than the memory cells forming semiconductor device 1000.

FIG. 24 is a plan view showing an arrangement of a via 1, a first layer metal interconnection layer, and a second layer metal interconnection layer in memory cell MC0#0 arranged in semiconductor device 2100.

The gate of NMOS transistor NA2 is connected through a contact hole CT402, the first layer metal interconnection and a via 1 V150 to second layer metal interconnection M260 forming word line WL1.

The gate of NMOS transistor NA0 is connected through a contact hole CT404, the first layer metal interconnection and a via 1 V152 to second layer metal interconnection M262 forming word line WL0.

N type diffusion region FL502 forming a source of NMOS transistor ND2 and N type diffusion region FL510 forming a source of NMOS transistor ND0 are connected through contact holes CT406 and CT414, respectively, to the common first layer metal interconnection. This first layer metal interconnection is connected through a via 1 V154 and a via 1 V156 to second layer metal interconnection M264 forming power supply line VSS.

N type diffusion region FL506 forming sources of NMOS transistors NA2 and NA0 is connected through contact hole CT410, the first layer metal interconnection and a via 1 V158 to second layer metal interconnection M266 forming bit line BL0.

P type diffusion region FL512 forming a source of PMOS transistor P2 is connected through contact hole CT416, the first layer metal interconnection and a via 1 V160 to second layer metal interconnection M268 forming power supply line VDD. P type diffusion region FL518 forming sources of PMOS transistors P3 and P1 is connected through contact hole CT426, the first layer metal interconnection and a via 1 V161 to second layer metal interconnection M268. P type diffusion region FL515 forming a source of PMOS transistor P0 is connected through contact hole CT422, the first layer metal interconnection and a via 1 V162 to second layer metal interconnection M268.

N type diffusion region FL522 forming a source of NMOS transistor NA3 and N type diffusion region FL530 forming a source of NMOS transistor NA1 are connected through contact hole CT430 and contact hole CT438, respectively, to the common first layer metal interconnection. This first layer metal interconnection is connected through a via 1 V164 and a via 1 V166 to second layer metal interconnection M270 forming bit line BL0.

N type diffusion region FL526 forming sources of NMOS transistors ND3 and ND1 is connected through contact hole CT434, the first layer metal interconnection and a via 1 V168 to second layer metal interconnection M272 forming power supply line VSS.

The gate of NMOS transistor NA3 is connected through contact hole CT440, the first layer metal interconnection and a via 1 V170 to second layer metal interconnection M274 forming word line WL1.

The gate of NMOS transistor NA1 is connected through contact hole CT442, the first layer metal interconnection and a via 1 V172 to second layer metal interconnection M276 forming word line WL0.

FIG. 25 is a plan view showing an arrangement of a via 2, a second layer metal interconnection layer, and a third layer metal interconnection layer in memory cell MC0#0 arranged in semiconductor device 2100. In FIG. 25, third layer metal interconnections M360 to M380 are arranged in the row direction.

Second layer metal interconnections M260 and M274 are connected through a via 2 V215 and a via 2 V255, respectively, to common third layer metal interconnection M360 forming word line WL1.

Second layer metal interconnection M222 is connected through a via 2 V292 to third layer metal interconnection M365 forming match line MLB0.

Second layer metal interconnections M264, M272 and M218 are connected through a via 2 V235, a via 2 V245, and a via 2 V282, respectively, to common third layer metal interconnection M370 forming a power supply node.

Second layer metal interconnection M214 is connected through a via 2 V272 to third layer metal interconnection M375 forming match line MLA0.

Second layer metal interconnections M262 and M276 are connected through a via 2 V225 and a via 2 V265, respectively, to common third layer metal interconnection M380 forming word line WL0.

Since the interconnection pattern of the metal interconnection inside memory cell MC1#0 that is adjacent to memory cell MC0#0 in the row direction is the same as the interconnection pattern that is obtained by arranging the interconnection pattern of memory cell MC0#0 so as to be axisymmetrically in the column direction, the description thereof will not be repeated. In addition, the interconnection pattern of the metal interconnection inside memory cell MC0#1 that is adjacent to memory cell MC0#0 in the column direction may be the same as the interconnection pattern obtained by arranging the interconnection pattern of memory cell MC0#0 so as to be axisymmetrically in the row direction, or may be the same as the interconnection pattern of memory cell MC0#0.

By configuring the layout as described above, a highly integrated CAM memory array can be realized with layers up to the third layer metal interconnection layer. If the number of interconnection layers can be suppressed, the manufacturing cost can be reduced.

Modifications

In the above-described embodiments, the transistor for data search is an NMOS transistor (NS01 to NS07). In another embodiment, the semiconductor device employs a PMOS transistor as a transistor for data search.

Figure 26:
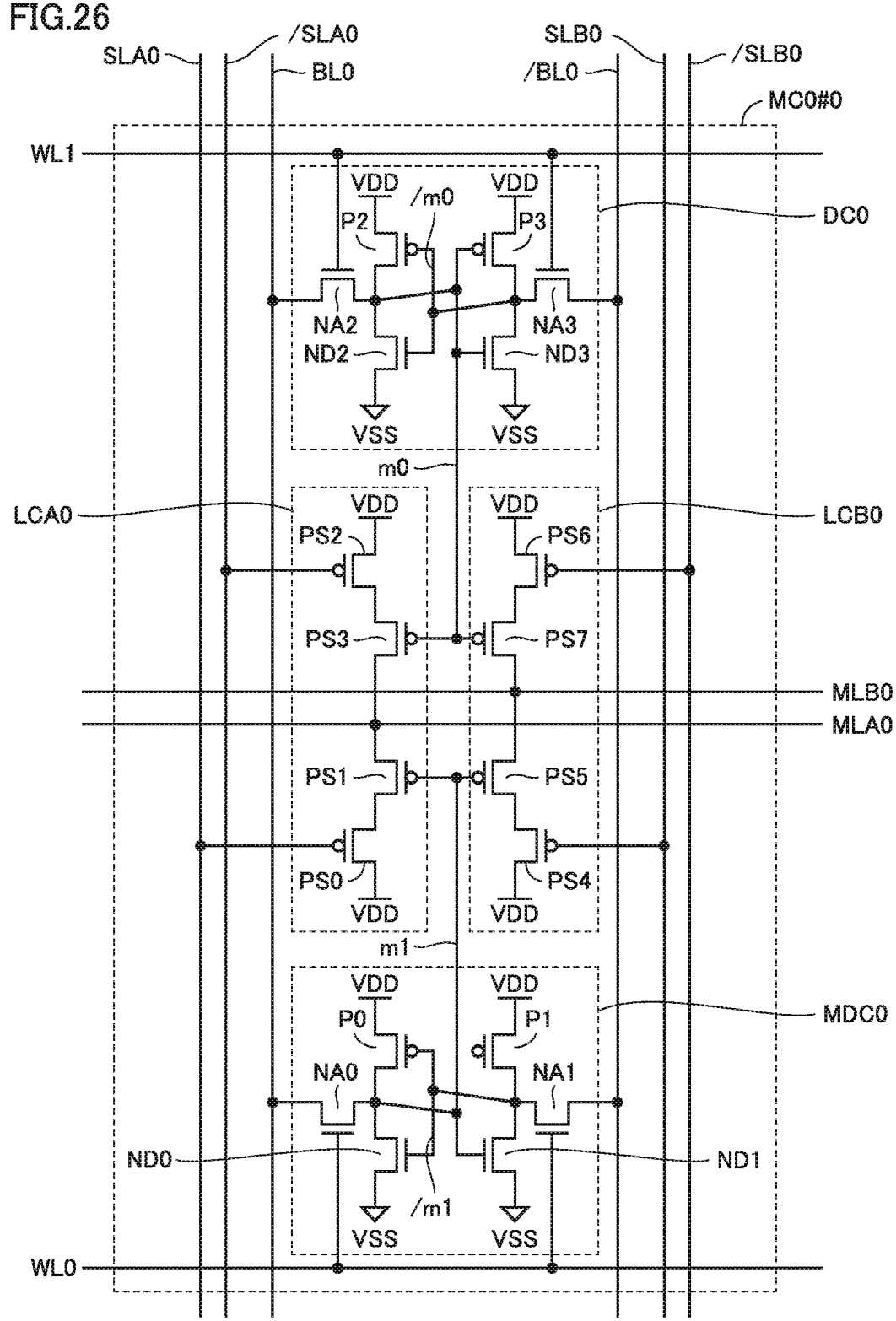
FIG. 26 is a circuit diagram illustrating a configuration example of a memory cell according to a modification of the third embodiment.

FIG. 26 is a circuit diagram illustrating a configuration example of memory cell MC0#0 according to a modification of the third embodiment. Since the elements having been described with reference to FIG. 22 among the elements shown in FIG. 26 are designated by the same reference characters, the description thereof will not be repeated.

Logical operation cell LCA0 according to a modification includes PMOS transistors PS0, PS1, PS2, and PS3 in place of NMOS transistors NS0, NS1, NS2, and NS3. Logical operation cell LCB0 according to the modification includes PMOS transistors PS4, PS5, PS6, and PS7 in place of NMOS transistors NS4, NS5, NS6, and NS7.

PMOS transistors PS0 and PS1 are connected in series between a match line MLA0 and a power supply line VDD. PMOS transistor PS0 has a gate connected to a search line SLA0. PMOS transistor PS1 has a gate connected to a storage node m1.

PMOS transistors PS2 and PS3 are connected in series between match line MLA0 and power supply line VDD. PMOS transistor PS2 has a gate connected to a search line /SLA0. PMOS transistor PS3 has a gate connected to a storage node m0.

PMOS transistors PS4 and PS5 are connected in series between a match line MLB0 and power supply line VDD. PMOS transistor PS4 has a gate connected to a search line SLB0. PMOS transistor PS5 has a gate connected to storage node m1.

PMOS transistors PS6 and PS7 are connected in series between match line MLB0 and power supply line VDD. PMOS transistor PS6 has a gate connected to a search line /SLB0. PMOS transistor PS7 has a gate connected to storage node m0.

The data in memory cell MC0#0 according to the modification is the same as the data in memory cell MC0#0 shown in FIG. 18.

Figure 27:
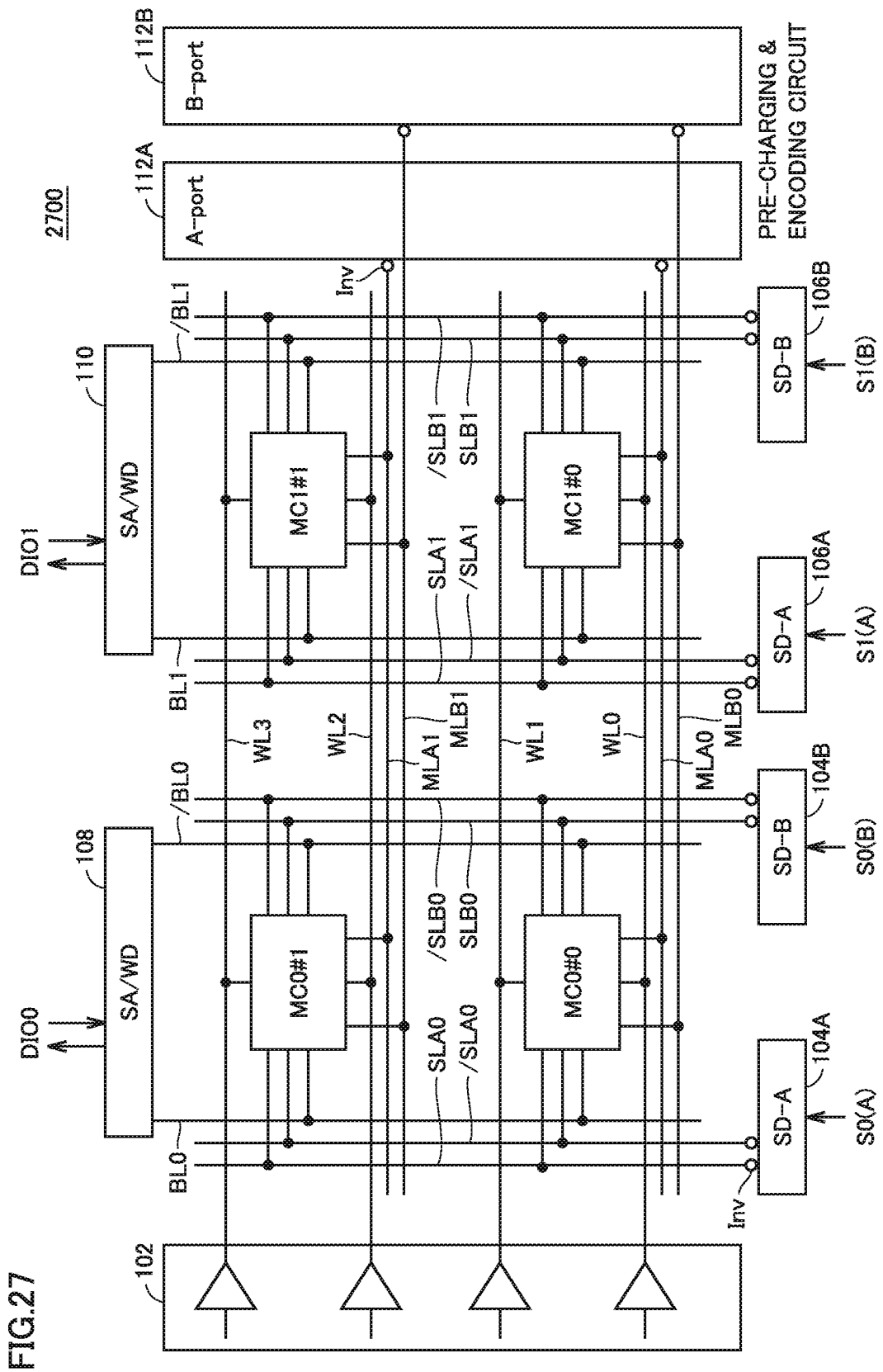
FIG. 27 is a block diagram illustrating a configuration example of a semiconductor device according to the modification of the third embodiment.

FIG. 27 is a block diagram illustrating a configuration example of a semiconductor device 2700 according to a modification of the third embodiment. Since the elements having been described with reference to FIG. 21 among the elements shown in FIG. 27 are designated by the same reference characters, the description thereof will not be repeated.

Memory cells MC0#0 to MC1#1 arranged in semiconductor device 2700 each have a PMOS transistor as a transistor for data search, as shown in FIG. 26.

Semiconductor device 2700 includes search drivers 104A, 104B, 106A, and 106B each having an output terminal provided with an inverter Inv, and also includes pre-charging & encoding circuits 112A and 112B each having an input terminal provided with an inverter Inv. As a result, the level of each search line becomes an electric potential at the inverted level of the signal output from the search driver connected thereto. Also, pre-charging & encoding circuits 112A and 112B each receive an input of the signal of an inverted level on each match line connected thereto. Also, due to the effect of inverter Inv, each match line is pre-charged to the inverted level of the signal output from the pre-charging & encoding circuit connected thereto. In a certain aspect, each match line is pre-charged to an "L" level.

The search operation of semiconductor device 2700 will be hereinafter described with reference to FIGS. 26 and 27. When the data in memory cell MC0#0 matches the search data, the level on the match line is maintained at an "L" level. On the other hand, when the data in memory cell MC0#0 does not match the search data, the level on the match line becomes an "H" level.

The following is an explanation about the case where search data signal S0(A) is "1" by way of example. In this case, the level on search line SLA0 is inverted by inverter Inv and thereby becomes an "L" level. Thus, PMOS transistor PS0 connected to search line SLA0 is brought into an ON state. In the above-described case, when the data in memory cell MC0#0 is "0", that is, when the data in memory cell MC0#0 does not match the search data, PMOS transistor PS1 is brought into an ON state, and match line MLA0 becomes an "H" level. On the other hand, when the data in memory cell MC0#0 is "1", that is, when the data in memory cell MC0#0 matches the search data, PMOS transistor PS1 is brought into an OFF state, and match line MLA0 is maintained at the pre-charged "L" level.

According to the above description, due to the effect of inverter Inv, pre-charging & encoding circuit receives an input of the "H" level when the data held by each memory cell matches the corresponding search data, and receives an input of the "L" level when even one piece of data does not match the corresponding search data.

Figure 28:
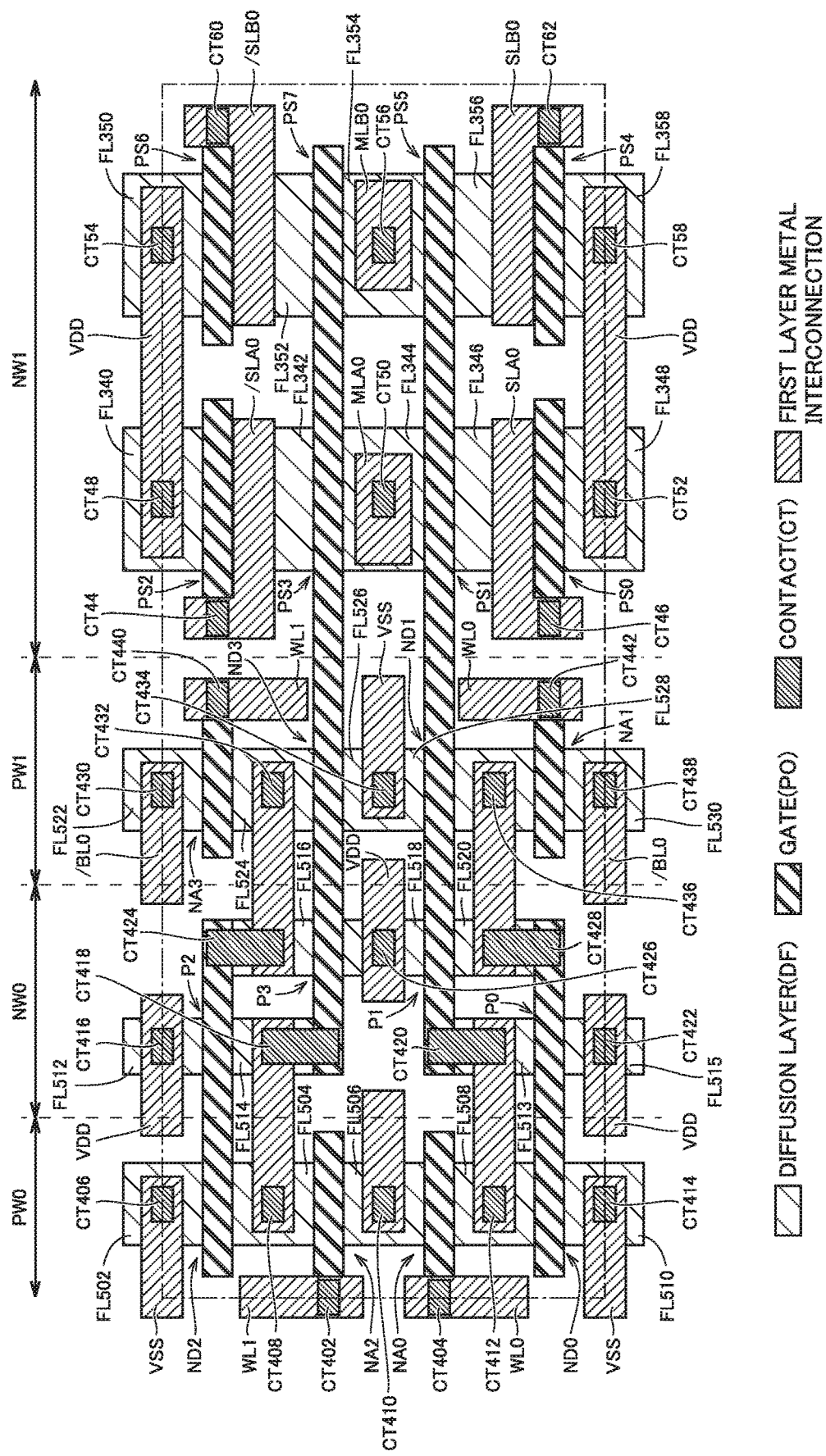
FIG. 28 is a plan view showing an arrangement of a well, a diffusion region, a polysilicon, a contact hole, and a first layer metal interconnection in the memory cell according to the modification of the third embodiment.

FIG. 28 is a plan view showing an arrangement of a well, a diffusion region DF, a polysilicon P0, a contact hole CT, and a first layer metal interconnection in memory cell MC0#0 according to a modification of the third embodiment.

The well configuration in memory cell MC0#0 shown in FIG. 28 is different from the well configuration of memory cell MC0#0 shown in FIG. 23 in that it further includes an N well NW1. The layout shown in FIG. 28 is the same as the layout shown in FIG. 23 in which the layout of NMOS transistors NS0 to NS7 for data search is replaced with the layout of PMOS transistors PS0 to PS7 for data search shown in FIG. 8. Thus, the details of memory cell MC0#0 shown in FIG. 28 will not be repeated.

Figure 29:
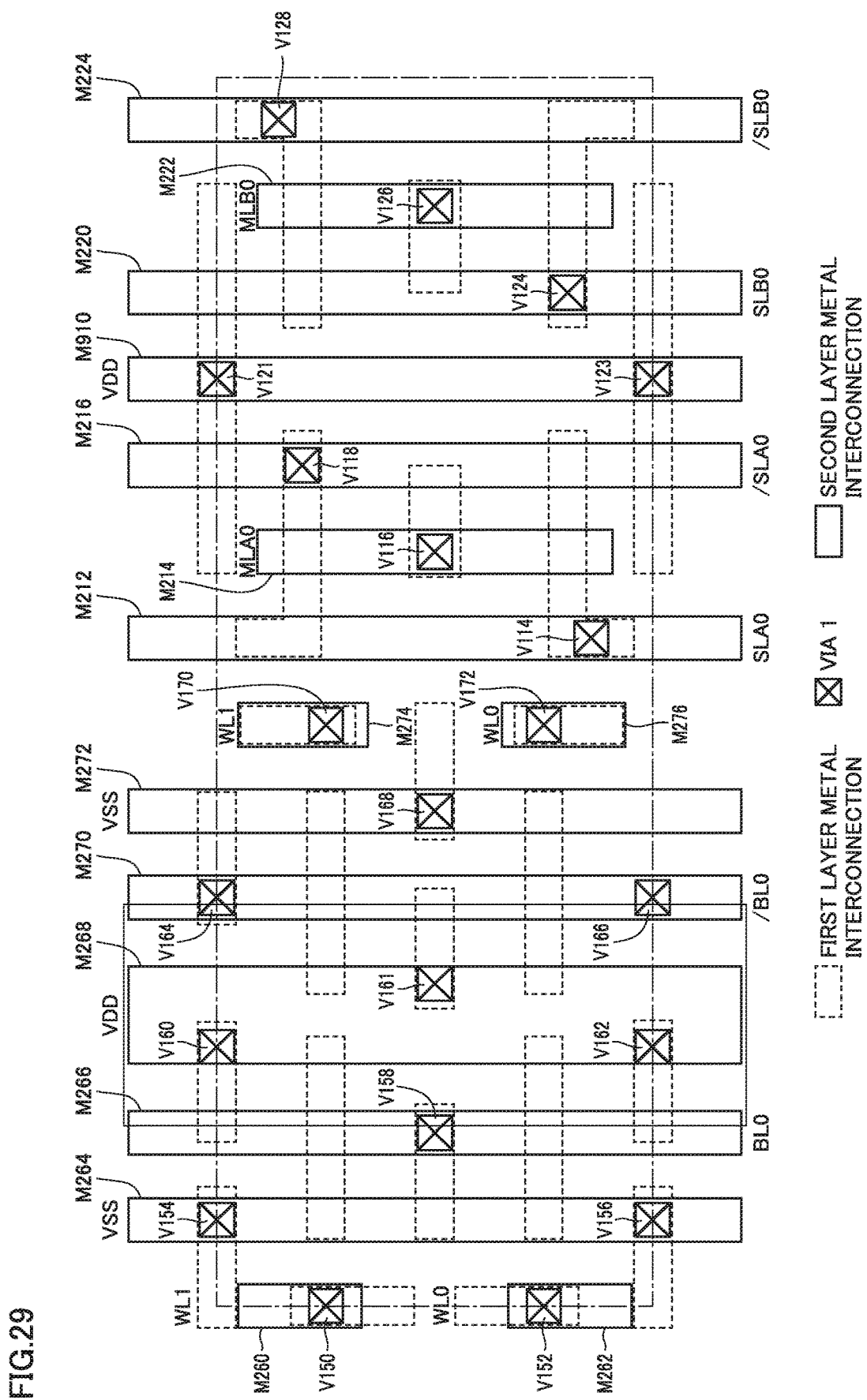
FIG. 29 is a plan view showing an arrangement of a via 1, first layer metal interconnection layer, and a second layer metal interconnection layer in the memory cell arranged in the semiconductor device.

FIG. 29 is a plan view showing an arrangement of a via 1, a first layer metal interconnection layer, and a second layer metal interconnection layer in memory cell MC0#0 arranged in semiconductor device 2700. The layout shown in FIG. 29 is approximately the same as the layout shown in FIG. 24. Thus, only different features will be hereinafter described.

P type diffusion region FL340 forming a source of PMOS transistor PS2 and P type diffusion region FL350 forming a source of PMOS transistor PS6 are connected through contact holes CT48 and CT54, respectively, to the common first layer metal interconnection. This first layer metal interconnection is connected through a via 1 V121 to second layer metal interconnection M910 that forms power supply line VDD.

P type diffusion region FL348 forming a source of PMOS transistor PS2 and P type diffusion region FL358 forming a source of PMOS transistor PS6 are connected through contact holes CT52 and CT58, respectively, to the common first layer metal interconnection. This first layer metal interconnection is connected through a via 1 V123 to second layer metal interconnection M910 that forms power supply line VDD.

Figure 30:
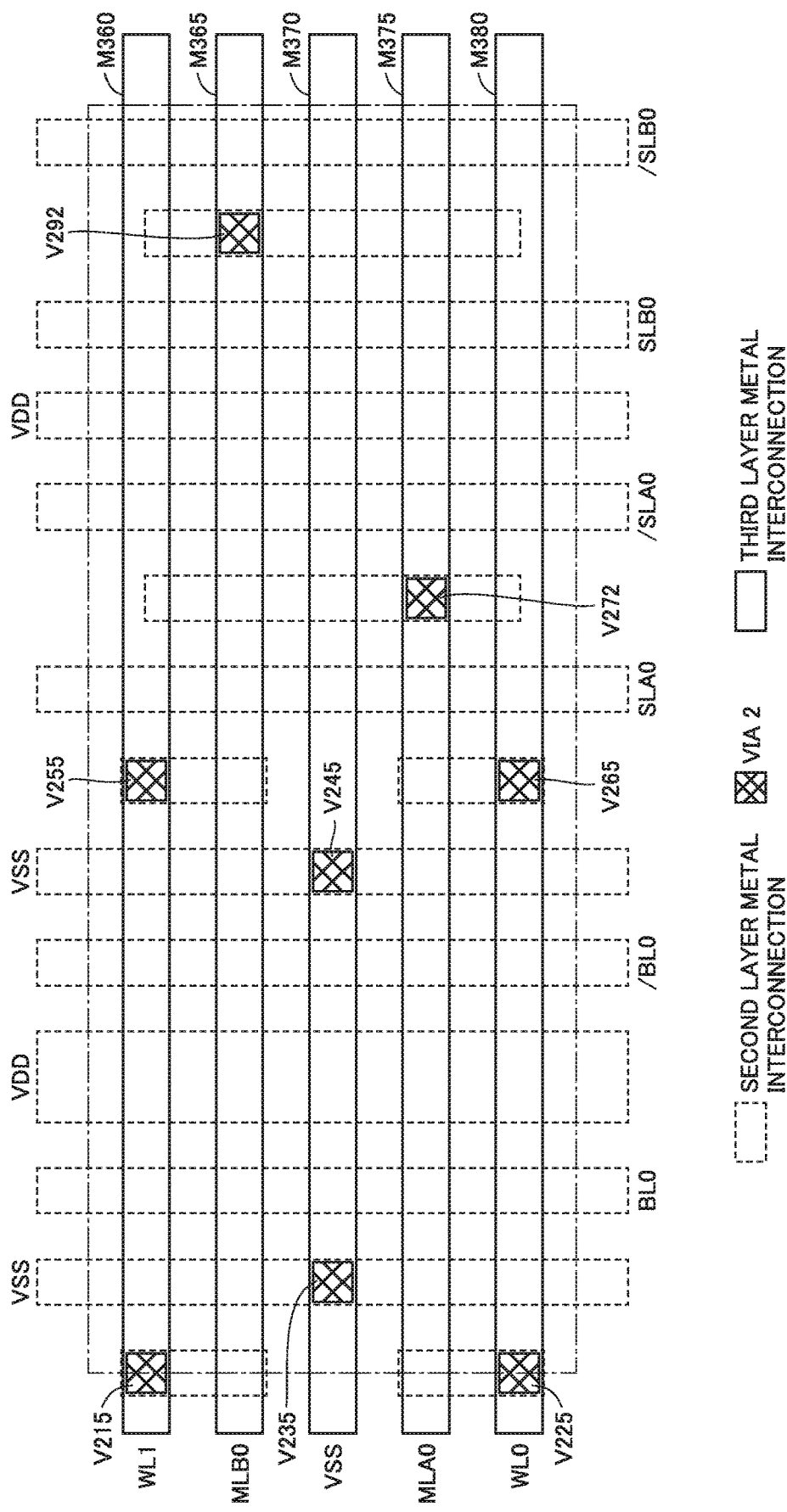
FIG. 30 is a plan view showing an arrangement of a via 2, a second layer metal interconnection layer, and a third layer metal interconnection layer in the memory cell arranged in the semiconductor device.

FIG. 30 is a plan view showing an arrangement of a via 2, a second layer metal interconnection layer, and a third layer metal interconnection layer in memory cell MC0#0 arranged in semiconductor device 2700. The layout shown in FIG. 30 is the same as the layout shown in FIG. 25 except that a via 2 V282 is not provided in third layer metal interconnection M370.

Semiconductor device 2700 employing a PMOS transistor as a transistor for data search can also simultaneously search for the A-port search data and the B-port search data.

Fourth Embodiment

In the above-described embodiment, each transistor is a plane type (planar type) transistor and structured to have a single gate for a channel. The semiconductor device according to the present embodiment includes a multi-gate transistor having a plurality of gates for a channel.

Structure of Transistor

Figure 31A:
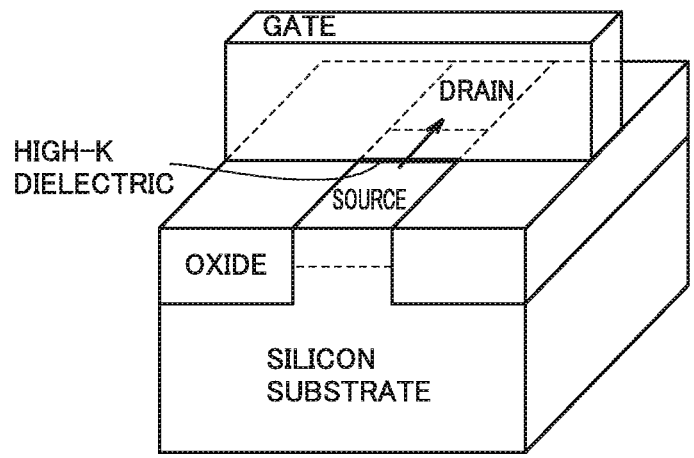
FIGS. 31A to 31C each are a diagram showing the structure of a transistor.
Figure 31B:
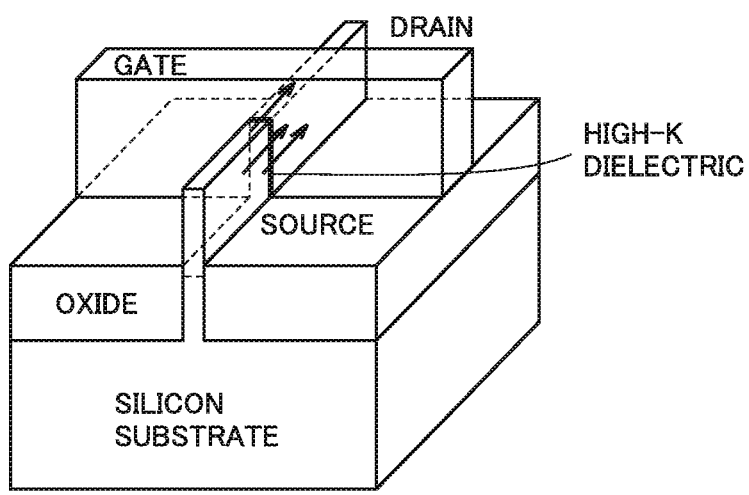
Figure 31C:
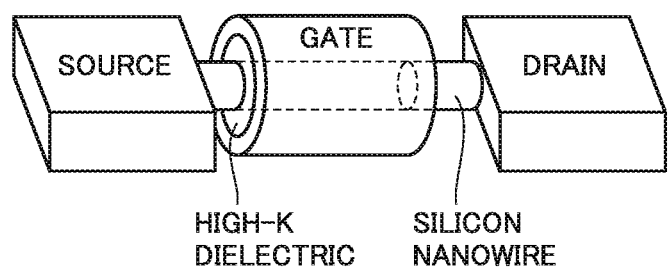

FIGS. 31A to 31C each are a diagram showing the structure of a transistor. FIG. 31A shows an example of the structure of a planar-type field effect transistor (hereinafter also referred to as a "planar FET"). FIG. 31B shows an example of the structure of a fin-type field effect transistor (hereinafter also referred to as a "FinFET"). FIG. 31C shows an example of the structure of a gate all around (GAA) type field effect transistor (hereinafter also referred to as a "GAAFET").

Referring to FIG. 31A, in a planar FET, a source, a channel and a drain are formed on the same plane. Furthermore, the gate of the planar FET is formed on a channel with a gate insulating film interposed therebetween. Namely, the gate is formed so as to cover one surface of the channel.

The channel of the FinFET shown in FIG. 31B protrudes from a silicon substrate as compared with the channel of the planar FET. Also, the gate of the FinFET is formed so as to cover the side surface and the upper surface of the protruding channel.

A nanowire obtained by crystal growth is used in the channel of a GAAFET shown in FIG. 31C. Also, the gate of the GAAFET is formed so as to completely cover the circumference of the axis of the channel (nanowire).

In the planar FET shown in FIG. 31A, since the channel is a plane, the gate faces the channel only from one direction. In this case, a depletion layer is formed only on one plane of the channel, so that a leakage current is increased.

On the other hand, in the transistor shown in FIG. 31B or 31C, the gate faces the channel from a plurality of directions. Thereby, the current driving capacity of the channel is increased. Also, the channel is approximately depleted. As a result, these transistors can reduce a leakage current. Thus, the semiconductor device according to the fourth embodiment employs these multi-gate transistors. In addition, the schematic configuration of this semiconductor device is the same as the schematic configuration shown in FIG. 21.

Layout of Dual-Port TCAM Using FinFET

The following is an explanation about the case where a FinFET is used as a transistor that forms memory cell MC0#0 shown in FIG. 22 by way of example.

Figure 32:
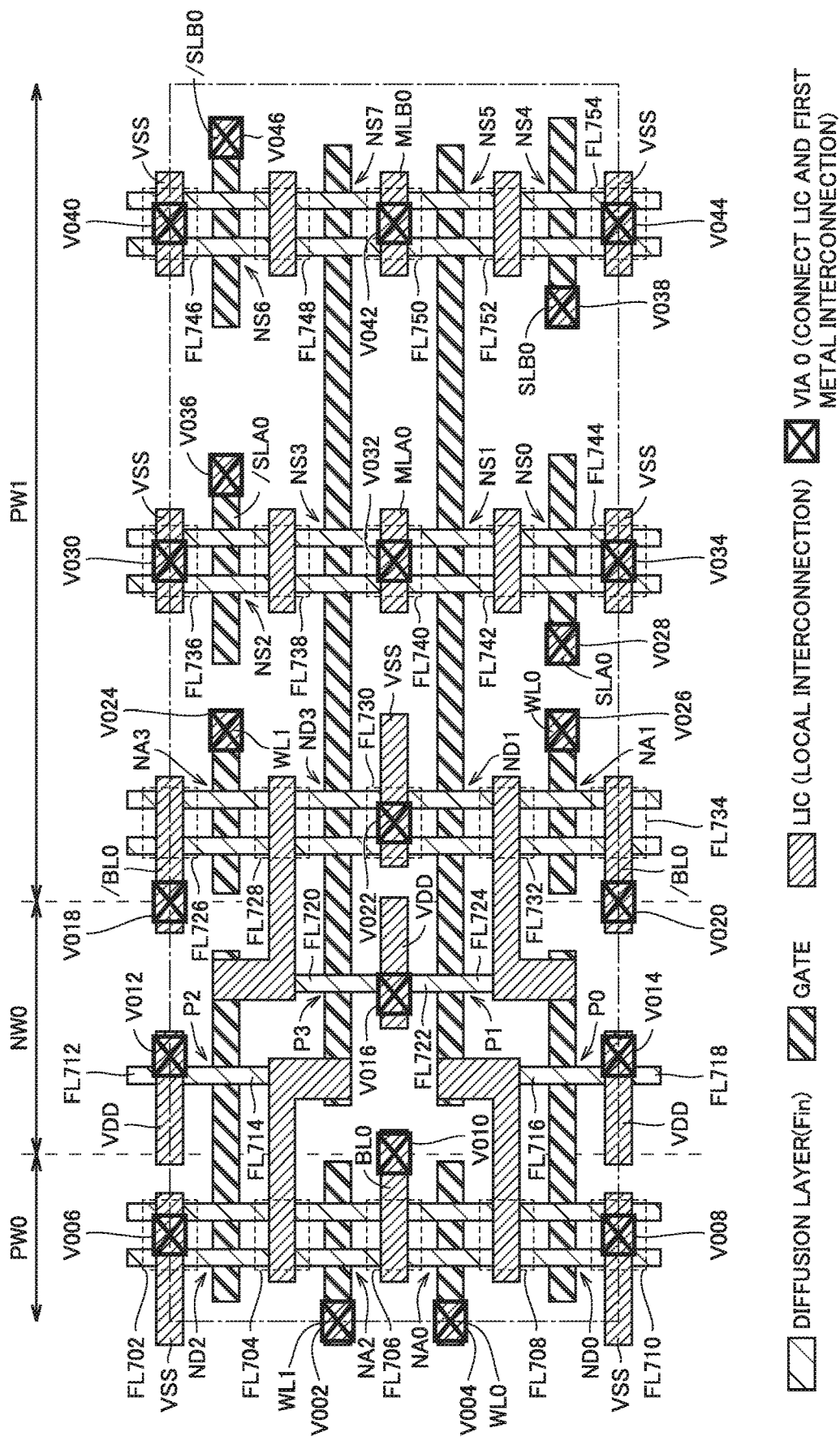
FIG. 32 is a plan view showing an arrangement of a well, a diffusion region, a polysilicon, and a local interconnection in a memory cell according to the fourth embodiment.

FIG. 32 is a plan view showing an arrangement of a well, a diffusion region DF, polysilicon P0, and a local interconnection (LIC) in memory cell MC0#0 according to the fourth embodiment. The layout of memory cell MC0#0 shown in FIG. 32 is different from the layout of memory cell MC0#0 shown in FIG. 23 in that it includes a diffusion layer DF corresponding to a fin in the FinFET and that it includes a local interconnection. Thus, these different features will be hereinafter described.

In memory cell MC0#0 according to the fourth embodiment, a P well PW0 having a P type conductivity type, an N well NW0 having an N type conductivity type, and P well PW1 are formed sequentially in this order in the row direction.

Diffusion layer DF corresponding to a fin in the FinFET is formed in each well. More specifically, in P well PW0, two diffusion layers DF are formed, which correspond to the source and the drain in each of NMOS transistors NA2 and ND2 that form a data cell DC0 and NMOS transistors NA0 and ND0 that form a mask data cell MDC0.

In N well NW0, one diffusion layer DF corresponding to PMOS transistors P0 and P1 that form data cell DC0, and one diffusion layer DF corresponding to PMOS transistors P2 and P3 that form a mask data cell MDC0 are formed.

For example, NMOS transistor ND2 has a source and a drain that are formed by one pair of N type diffusion regions FL702, FL704, and also has a polysilicon gate disposed therebetween. Each of N type diffusion regions FL702 and FL704 is formed by two common diffusion layers DF. Namely, the source and the drain of NMOS transistor ND2 are formed by two diffusion layers DF.

In P well PW1, two diffusion layers DF corresponding to NMOS transistors NA3 and ND3 that form a data cell DC0, NMOS transistors NA1 and ND1 that form a mask data cell MDC0, two diffusion layers DF corresponding to NMOS transistors NS0 to NS3 for data search, and two diffusion layers DF corresponding to NMOS transistors NS4 to NS7 are formed.

As the number of fins (diffusion layers) for each transistor increases, the current driving capacity of each transistor is further improved. In the example shown in FIG. 32, the number of fins corresponding to PMOS transistors P0 to P3 is one and the number of fins corresponding to other NMOS transistors is two, but the number of fins for each transistor is not limited thereto. For example, the number of fins for each transistor may be three or more.

The relation between the gate and the diffusion region (the source and the drain) forming each transistor shown in FIG. 32 is the same as the relation between the gate and the diffusion region forming each transistor shown in FIG. 23, except that diffusion layer DF corresponds to a fin in the FinFET.

The arrangement of a local interconnection will be hereinafter described. The local interconnection is formed, for example, by single metal such as tungsten, and arranged so as to be in ohmic contact with the source, the drain or the gate of the transistor. Namely, the local interconnection functions as a source electrode, a drain electrode, or a gate electrode.

The local interconnection shown in FIG. 32 is arranged in place of each contact hole and the first layer metal interconnection that are shown in FIG. 23. The local interconnection connected to a gate of each of (two diffusion layers DF forming) N type diffusion regions FL702, FL706, FL710, FL712, FL718, FL722, FL740, and FL750, and NMOS transistors NA0 to NA3, NS0, NS2, NS4, and NS6 is arranged in place of one contact hole and one first layer metal interconnection shown in FIG. 23. Also, local interconnections are arranged independently in N type diffusion regions FL736, FL744, FL746, and FL754. Each of these local interconnections is connected to a corresponding one of the upper first layer metal interconnections through a via 0. For example, the local interconnection connected to N type diffusion region FL702 is connected to the upper first layer metal interconnection through a via 0 V006. Also, local interconnections for causing two fins (diffusion layers DF) to be equipotential are arranged independently in N type diffusion regions FL738, FL742, FL748, and FL752.

The local interconnection for connecting N type diffusion region FL704 and the polysilicon that forms a gate in each of PMOS transistor P3 and NMOS transistors ND3, NS3 and NS7 is arranged in place of two contact holes (CT408, CT418) and one first layer metal interconnection. Similarly, the local interconnection for connecting the gate of PMOS transistor P1 and N type diffusion region FL708, the local interconnection for connecting the gate of PMOS transistor P2 and N type diffusion region FL728, and the local interconnection for connecting the gate of PMOS transistor P0 and N type diffusion region FL732 are also arranged in place of two contact holes and one first layer metal interconnection. These local interconnections are not connected to the upper first layer metal interconnection, but arranged so as to merely connect the drain of the NMOS transistor and the gate of the PMOS transistor.

Figure 33:
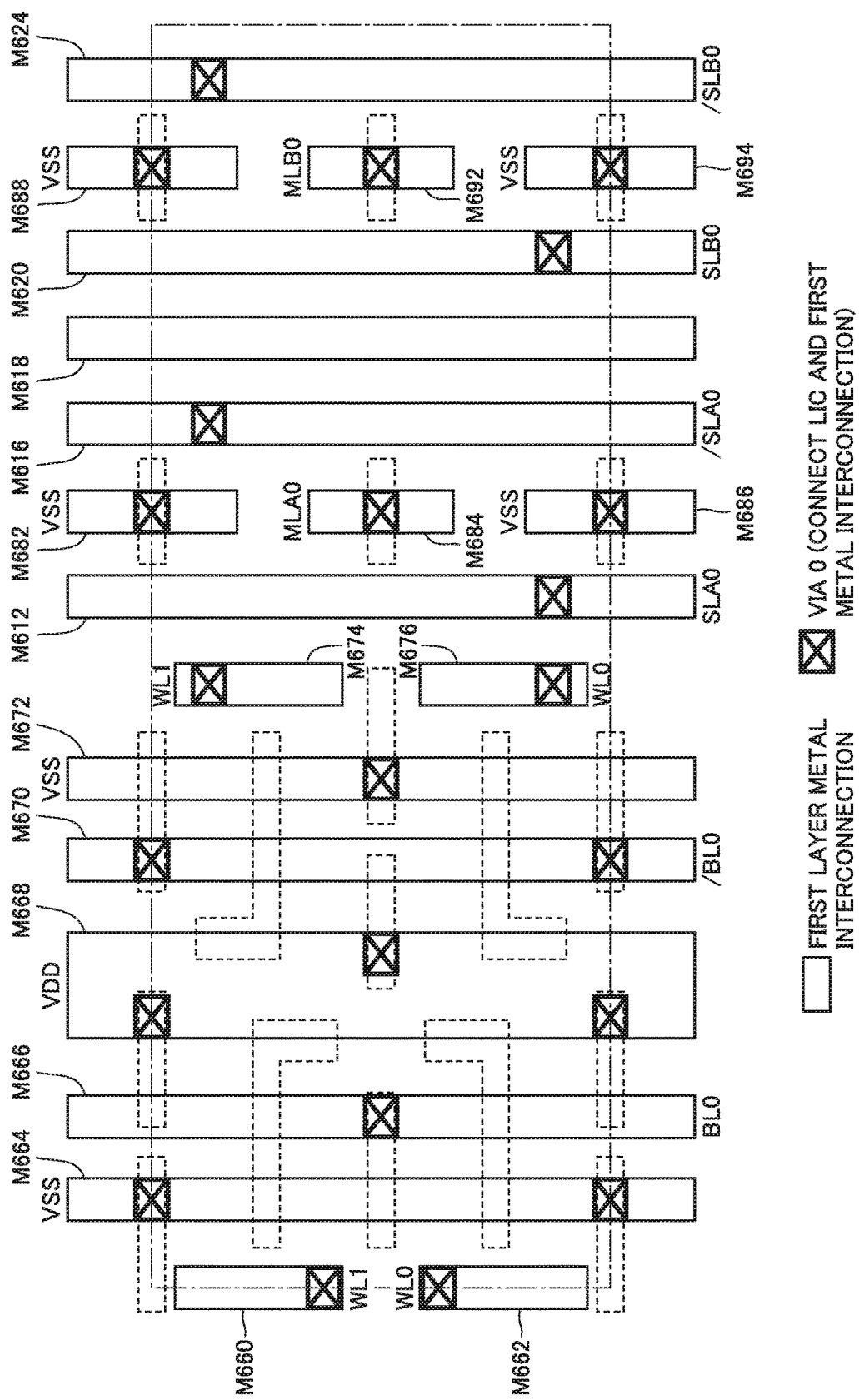
FIG. 33 is a plan view showing an arrangement of a via 0, a local interconnection, and a first layer metal interconnection layer in the memory cell according to the fourth embodiment.

FIG. 33 is a plan view showing an arrangement of a via 0, a local interconnection, and a first layer metal interconnection layer in memory cell MC0#0 according to the fourth embodiment. The layout of the first layer metal interconnection shown in FIG. 33 is approximately the same as the layout of the second layer metal interconnection shown in FIG. 24.

Specifically, first layer metal interconnections M660, M662, M664, M666, M668, M670, M672, M674, M676, M612, M616, M618, M620, and M624 shown in FIG. 33 correspond to second layer metal interconnections M260, M262, M264, M266, M268, M270, M272, M274, M276, M212, M216, M218, M220, and M224, respectively, shown in FIG. 24. First layer metal interconnection M618 functions as a dummy interconnection. In another embodiment, first layer metal interconnection M618 does not have to be arranged.

N type diffusion region FL736 forming a source of NMOS transistor NS2 is connected through a local interconnection and a via 0 V030 to first metal interconnection M682 forming power supply line VSS.

N type diffusion region FL740 forming sources of NMOS transistors NS3 and NS1 is connected through a local interconnection and a via 0 V032 to first metal interconnection M684 forming match line MLA0.

N type diffusion region FL744 forming a source of NMOS transistor NS0 is connected through a local interconnection and a via 0 V034 to first metal interconnection M686 forming power supply line VSS.

N type diffusion region FL746 forming a source of NMOS transistor NS6 is connected through a local interconnection and a via 0 V040 to first metal interconnection M688 forming power supply line VSS.

N type diffusion region FL750 forming sources of NMOS transistors NS7 and NS5 is connected through a local interconnection and a via 0 V042 to first metal interconnection M692 forming match line MLB0.

N type diffusion region FL754 forming a source of NMOS transistor NS4 is connected through a local interconnection and a via 0 V044 to first metal interconnection M694 forming power supply line VSS.

Figure 34:
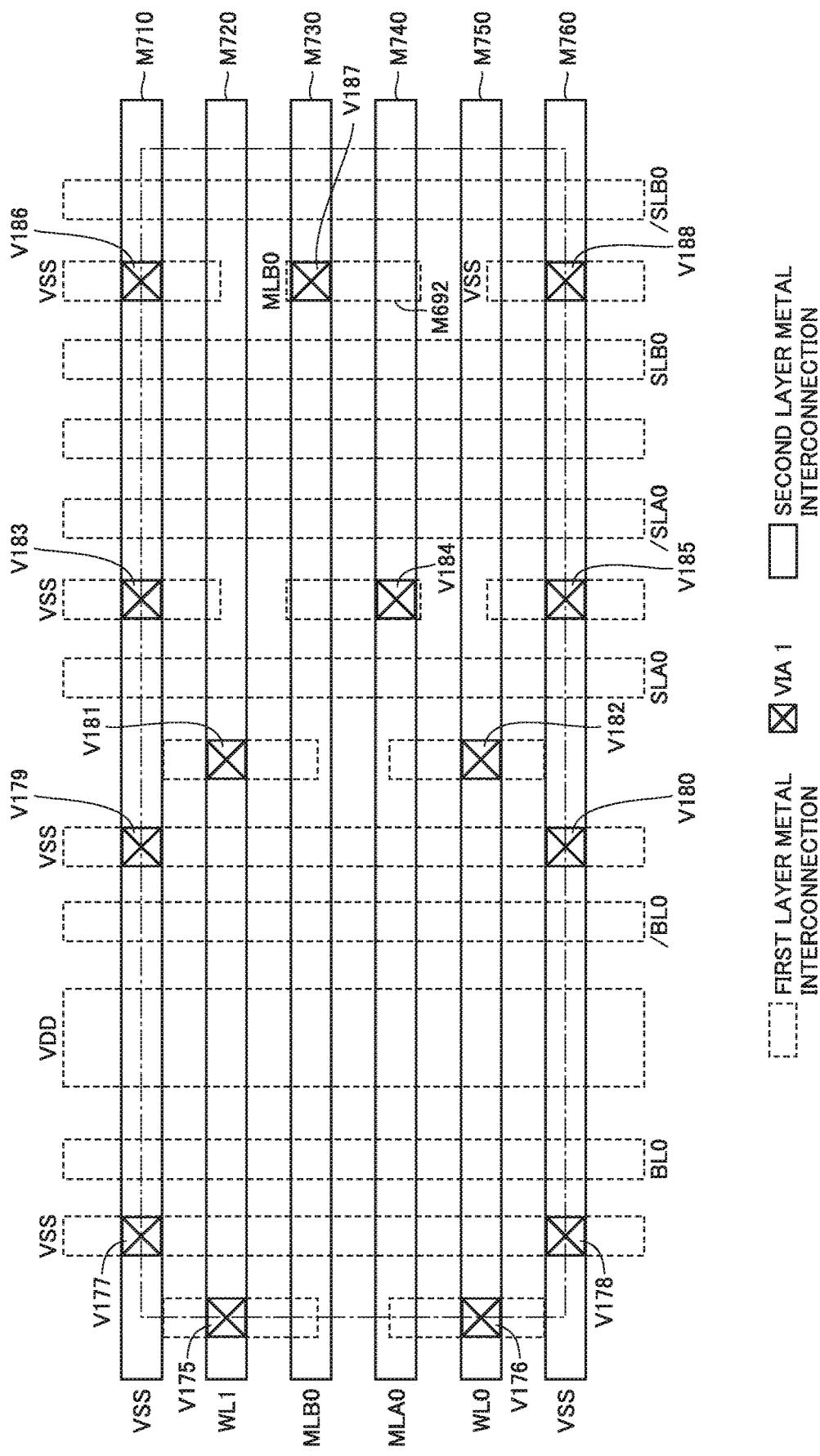
FIG. 34 is a plan view showing an arrangement of a via 1, a first layer metal interconnection layer, and a second layer metal interconnection layer in the memory cell according to the fourth embodiment.

FIG. 34 is a plan view showing an arrangement of a via 1, a first layer metal interconnection layer, and a second layer metal interconnection layer in memory cell MC0#0 according to the fourth embodiment. In FIG. 34, second layer metal interconnections M710 to M760 are arranged in the row direction.

First layer metal interconnections M664, M672, M682, and M688 are connected through a via 1 V177, a via 1 V179, a via 1 V183, and a via 1 V186, respectively, to second layer metal interconnection M710 forming power supply line VSS.

First layer metal interconnections M660 and M674 are connected through a via 1 V175 and a via 1 V181, respectively, to second layer metal interconnection M720 forming word line WL1.

First layer metal interconnection M692 is connected through a via 1 V187 to second layer metal interconnection M730 forming match line MLB0.

First layer metal interconnection M684 is connected through a via 1 V184 to second layer metal interconnection M740 forming match line MLA0.

First layer metal interconnections M662 and M676 are connected through a via 1 V176 and a via 1 V182, respectively, to second layer metal interconnection M750 forming word line WL0.

First layer metal interconnections M664, M672, M686, and M694 are connected through a via 1 V178, a via 1 V180, a via 1 V185, and a via 1 V188, respectively, to second layer metal interconnection M760 forming power supply line VSS.

As described above, in the semiconductor device according to the fourth embodiment, the number of metal interconnection layers can be reduced by using local interconnections. Specifically, in this semiconductor device, a layer corresponding to the first layer metal interconnection having been described with reference to FIG. 23 can be omitted. Namely, the semiconductor device according to the fourth embodiment can be reduced in size as compared with semiconductor device 2100.

Fifth Embodiment

As shown in FIGS. 32 to 34, memory cell MC0#0 according to the fourth embodiment employs one common power supply line VSS as: power supply line VSS connected to the NMOS transistor for data search; and power supply line VSS connected to the transistors forming data cell DC0 and mask data cell MDC0. In such a case, a prescribed amount of leakage current exists in the NMOS transistor for data search when the data is searched for (retrieved) and also when the data is not searched for.

A semiconductor device according to the fifth embodiment can solve the above-described problems. The following is an explanation about a specific configuration of the semiconductor device according to the fifth embodiment.

Figure 35:
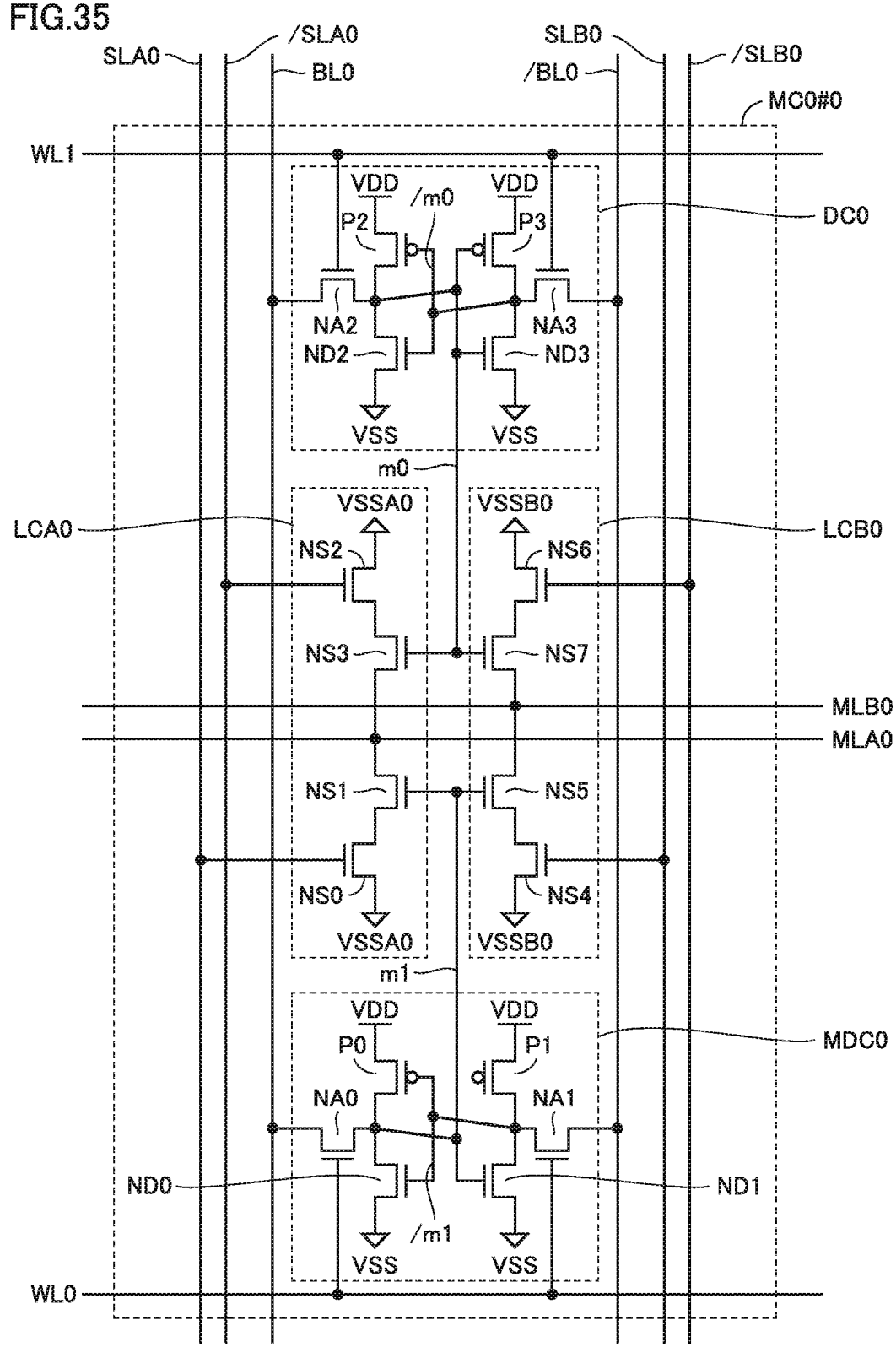
FIG. 35 is a circuit diagram illustrating a configuration example of a memory cell in a semiconductor device according to the fifth embodiment.

FIG. 35 is a circuit diagram illustrating a configuration example of memory cell MC0#0 in the semiconductor device according to the fifth embodiment. The configuration of memory cell MC0#0 shown in FIG. 35 is approximately the same as the configuration of memory cell MC0#0 shown in FIG. 22. Accordingly, only different elements will be hereinafter described.

NMOS transistors NS0 and NS1 are connected in series between match line MLA0 and a power supply line VASSA0. Also, NMOS transistors NS0 and NS1 have gates to which search line /SLA0 and storage node m1 are respectively connected. NMOS transistors NS2 and NS3 are connected in series between match line MLA0 and a power supply line VASSA0. Also, NMOS transistors NS2 and NS3 have gates to which search line /SLA0 and storage node m0 are respectively connected. Namely, power supply line VASSA0 is connected to logical operation cell LCA0.

NMOS transistors NS4 and NS5 are connected in series between match line MLB0 and a power supply line VSSB0. Also, NMOS transistors NS4 and NS5 have gates to which search line SLB0 and storage node m1 are respectively connected. NMOS transistors NS6 and NS7 are connected in series between match line MLB0 and power supply line VSSB0. Also, NMOS transistors NS6 and NS7 have gates to which search line /SLB0 and storage node m0 are respectively connected. Namely, power supply line VSSB0 is connected to logical operation cell LCB0.

As described above, power supply lines VASSA0 and VSSB0 connected to the transistors for data search and power supply line VSS connected to the transistors forming data cell DC0 and mask data cell MDC0 are electrically independent of each other.

The operation of writing onto memory cell MC0#0 shown in FIG. 35 is the same as the operation of writing onto memory cell MC0#0 having been described with reference to FIG. 22.

Search Operation

Figure 36:
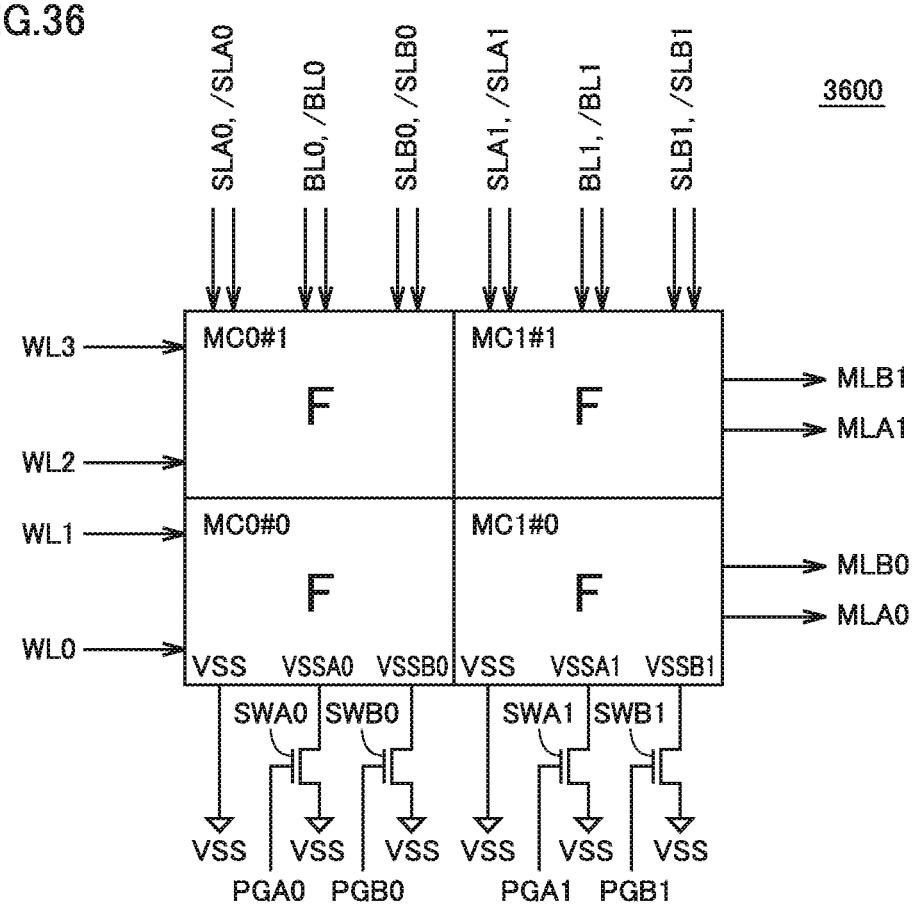
FIG. 36 is a diagram illustrating a metal interconnection pattern in each memory cell forming the semiconductor device according to the fifth embodiment.

FIG. 36 is a diagram illustrating a metal interconnection pattern in each memory cell forming a semiconductor device 3600 according to the fifth embodiment. The alphabetical character "F" in the figure shows the direction of the metal interconnection pattern. In the example shown in FIG. 36, memory cells MC0#0, MC0#1, MC1#0, and MC1#1 are set in the same interconnection pattern.

Memory cell MC0#0 and memory cell MC0#1 share power supply lines VSS, VASSA0, and VSSB0 with each other. Also, a switch SWB0 for connecting power supply line VSS and power supply line VASSA0 is arranged, and a switch SWB0 for connecting power supply line VSS and power supply line VSSB0 is arranged.

Memory cell MC1#0 and memory cell MC1#1 share power supply lines VSS, VSSA1 and VSSB1 with each other. Also, a switch SWA1 for connecting power supply line VSS and power supply line VSSA1 is arranged, and a switch SWB1 for connecting power supply line VSS and power supply line VSSB1 is arranged.

The schematic configuration of semiconductor device 3600 is the same as the schematic configuration shown in FIG. 21. By way of example, switches SWB0, SWB0, SWA1, and SWB1 are connected to search drivers 104A, 104B, 106A, and 106B, respectively. Furthermore, search drivers 104A to 106B output control signals for controlling switches connected thereto to be turned on and off. For example, search driver 104A outputs a control signal PGA0 for controlling switch SWB0 to be turned on and off.

When the data at the A port is searched for, that is, when an A-port search data signal S0(A) is input, search driver 104A outputs a control signal PGA0 for controlling switch SWB0 to be turned on. On the other hand, when the data search is completed (when the data is not searched for), search driver 104A outputs control signal PGA0 for controlling switch SWB0 to be turned off. As with search driver 104A, other search drivers 104B, 106A and 106B set the corresponding switches to be turned on when the data is searched for, and set the corresponding switches to be turned off when the data is not searched for.

According to the above description, when data is not searched for, semiconductor device 3600 can provide an electrical interruption between power supply line VSS connected to the transistor for holding data and the power supply line connected to the transistor for data search. As a result, semiconductor device 3600 can suppress a leakage current in the transistor for data search when the data is not searched for.

In the above-described example, semiconductor device 3600 is configured such that a switch is arranged for each column in a memory array. In other embodiments, however, semiconductor device 3600 may be configured such that a switch is arranged in each memory array. In this case, power supply lines VASSA0 and VSSA1 for A port arranged in each column are electrically connected. Also, power supply lines VSSB0 and VSSB1 for B port are also electrically connected. Thereby, in semiconductor device 3600 according to another embodiment, the number of switch elements can be reduced.

Layout of Memory Cell

The following is an explanation about memory cell MC0#0 forming semiconductor device 3600 in the layout divided in the stacking direction with reference to FIGS. 37 to 41.

Figure 37:
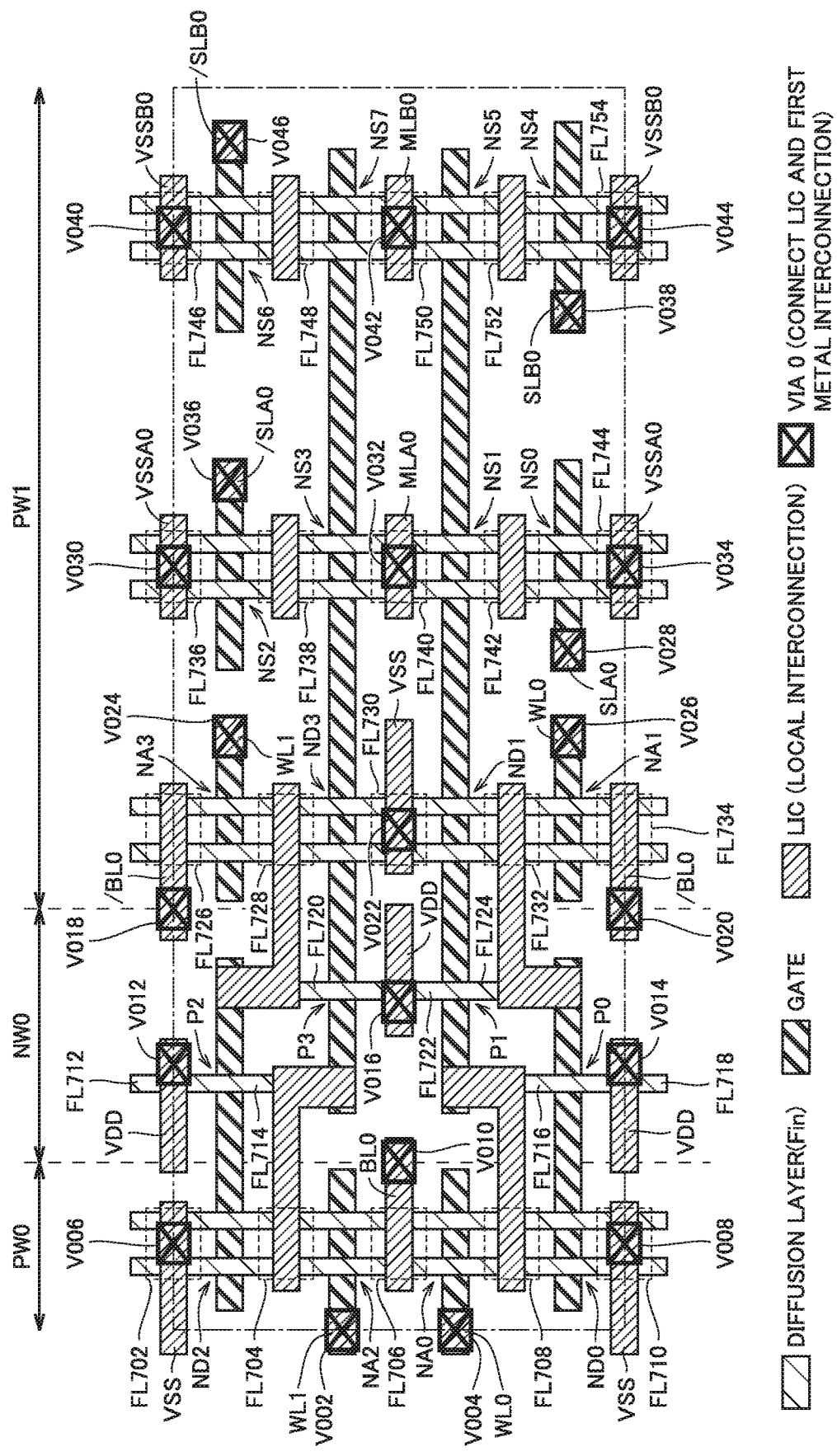
FIG. 37 is a plan view showing an arrangement of a well, a diffusion region, a polysilicon, and a local interconnection in the memory cell according to the fifth embodiment.

FIG. 37 is a plan view showing an arrangement of a well, a diffusion region DF, polysilicon P0, and a local interconnection in memory cell MC0#0 according to the fifth embodiment. The layout shown in FIG. 37 is the same as the layout shown in FIG. 32. However, the local interconnection connected to the transistor for data search is connected to the power supply line arranged independently of power supply line VSS.

Specifically, N type diffusion region FL736 forming a source of NMOS transistor NS2 is connected to the local interconnection functioning as a power supply line VASSA0. N type diffusion region FL744 forming a source of NMOS transistor NS0 is connected to the local interconnection functioning as power supply line VASSA0. N type diffusion region FL746 forming a source of NMOS transistor NS6 is connected to the local interconnection functioning as a power supply line VSSB0. N type diffusion region FL754 forming a source of NMOS transistor NS4 is connected to the local interconnection functioning as power supply line VSSB0.

Figure 38:
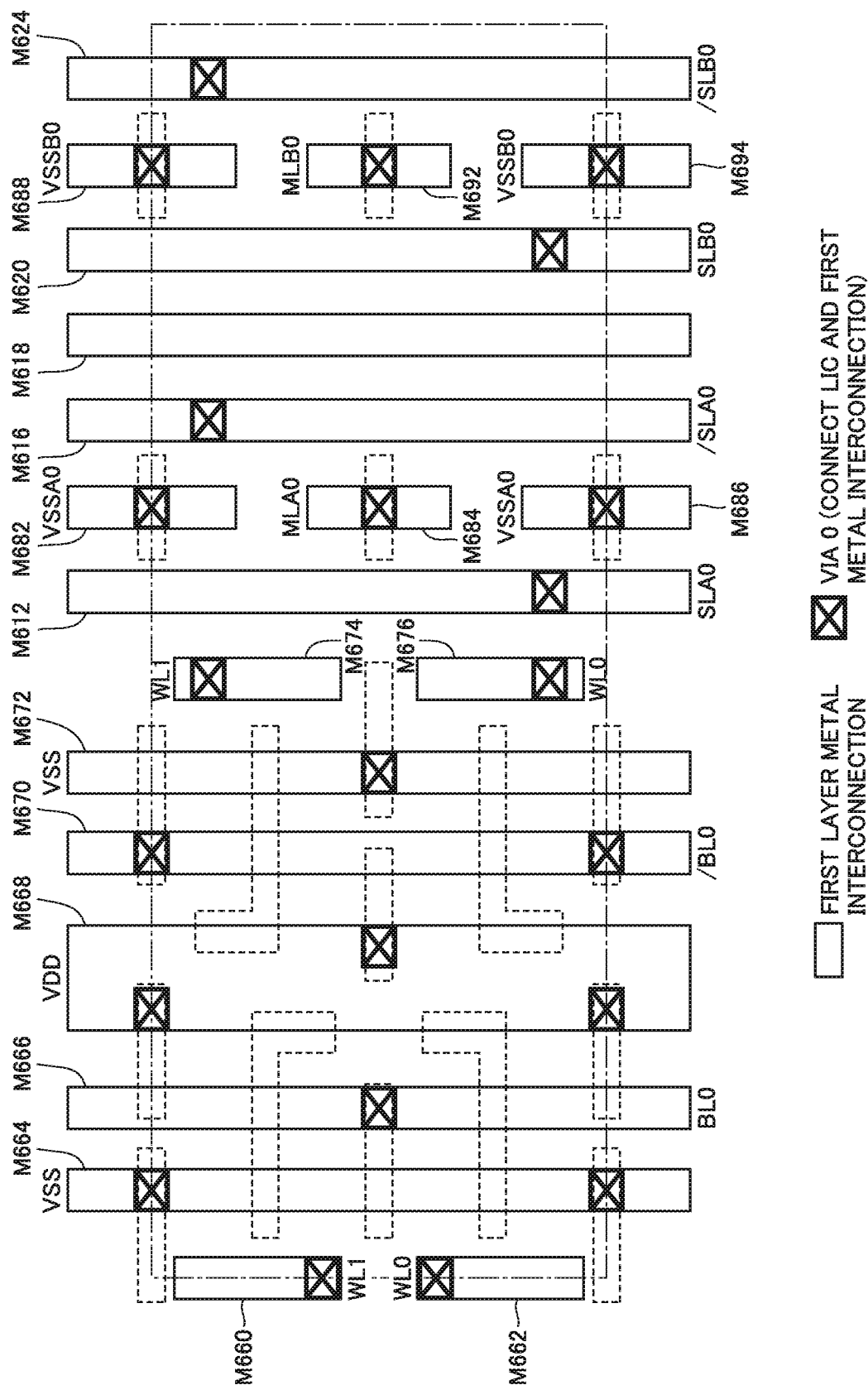
FIG. 38 is a plan view showing an arrangement of a via 0, a local interconnection, and a first layer metal interconnection layer in the memory cell according to the fifth embodiment.

FIG. 38 is a plan view showing an arrangement of a via 0, a local interconnection, and a first layer metal interconnection layer in memory cell MC0#0 according to the fifth embodiment. The layout shown in FIG. 38 is the same as the layout shown in FIG. 33.

It is to be noted that first layer metal interconnections M682 and M686 each function not as power supply line VSS but as power supply line VASSA0. Also, first layer metal interconnections M688 and M694 each function not as power supply line VSS but as power supply line VSSB0.

Figure 39:
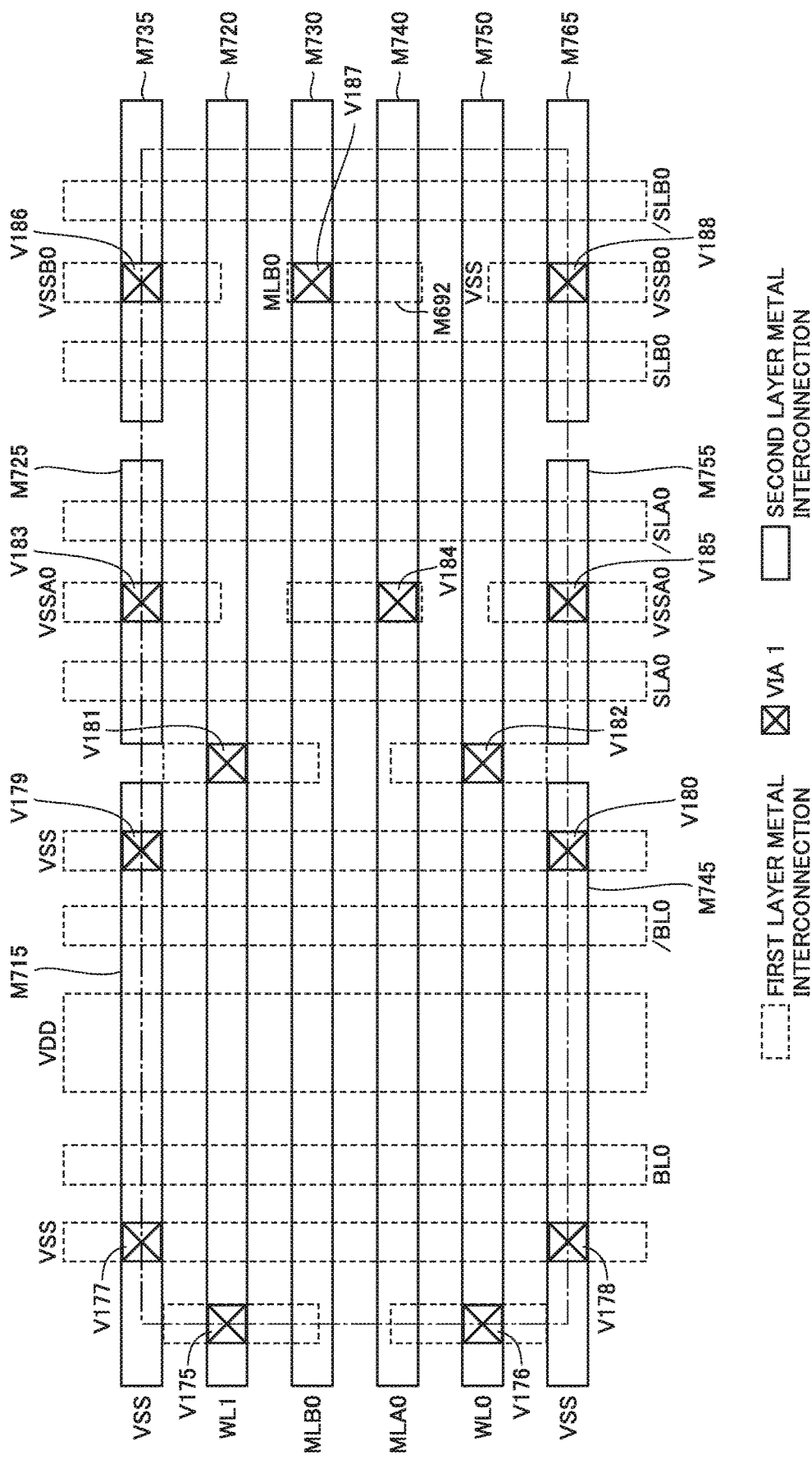
FIG. 39 is a plan view showing an arrangement of a via 1, a first layer metal interconnection layer, and a second layer metal interconnection layer in the memory cell according to the fifth embodiment.

FIG. 39 is a plan view showing an arrangement of via 1, a first layer metal interconnection layer, and a second layer metal interconnection layer in memory cell MC0#0 according to the fifth embodiment. The layout shown in FIG. 39 is approximately the same as the layout shown in FIG. 34. Accordingly, only different features will be hereinafter described.

In place of second layer metal interconnection M710, second layer metal interconnections M715, M725, and M735 are arranged. Also, in place of second layer metal interconnection M760, second layer metal interconnections M745, M755, and M765 are arranged.

First layer metal interconnections M664 and M672 are connected through a via 1 V177 and a via 1 V179, respectively, to second layer metal interconnection M715 forming power supply line VSS.

First layer metal interconnection M682 is connected through a via 1 V183 to second layer metal interconnection M725 forming power supply line VASSA0.

First layer metal interconnection M688 is connected through a via 1 V186 to second layer metal interconnection M735 forming power supply line VSSB0.

First layer metal interconnections M664 and M672 are connected through a via 1 V178 and a via 1 V180, respectively, to second layer metal interconnection M745 forming power supply line VSS.

First layer metal interconnection M686 is connected through a via 1 V185 to second layer metal interconnection M755 forming power supply line VASSA0.

First layer metal interconnection M694 is connected through a via 1 V188 to second layer metal interconnection M765 forming power supply line VSSB0.

Figure 40:
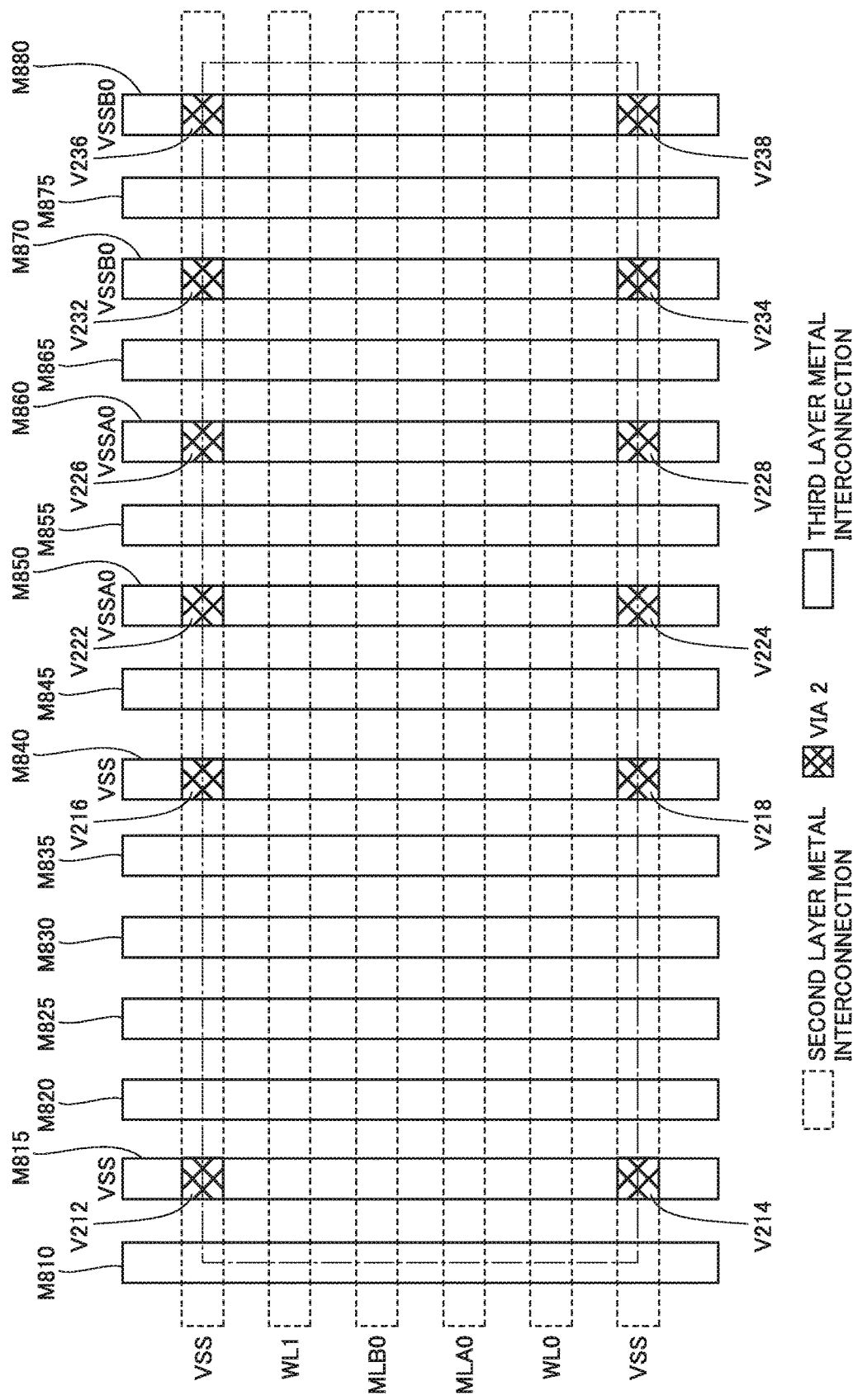
FIG. 40 is a plan view showing an arrangement of a via 2, a second layer metal interconnection, and a third layer metal interconnection in the memory cell according to the fifth embodiment.

FIG. 40 is a plan view showing an arrangement of a via 2, a second layer metal interconnection, and a third layer metal interconnection in memory cell MC0#0 according to the fifth embodiment. In FIG. 40, third layer metal interconnections M810 to M880 are arranged in the column direction.

Third layer metal interconnections M810, M820, M825, M830, M835, M845, M855, M865, and M875 function as dummy interconnections. In other embodiments, these third layer metal interconnections do not have to be arranged.

Second layer metal interconnection M715 is connected through a via 2 V212 and a via 2 V216 to third layer metal interconnections M815 and M840, respectively, that form power supply line VSS.

Second layer metal interconnection M725 is connected through a via 2 V222 and a via 2 V226 to third layer metal interconnections M850 and M860, respectively, that form power supply line VASSA0.

Second layer metal interconnection M735 is connected through a via 2 V232 and a via 2 V236 to third layer metal interconnections M870 and M880, respectively, that form power supply line VSSB0.

Second layer metal interconnection M745 is connected through a via 2 V214 and a via 2 V218 to third layer metal interconnections M815 and M840, respectively, that form power supply line VSS.

Second layer metal interconnection M755 is connected through a via 2 V224 and a via 2 V228 to third layer metal interconnections M850 and M860, respectively, that form power supply line VASSA0.

Second layer metal interconnection M765 is connected through a via 2 V234 and a via 2 V238 to third layer metal interconnections M870 and M880, respectively, that form power supply line VSSB0.

FIG. 41 is a plan view showing an arrangement of a via 3, a third layer metal interconnection, and a fourth layer metal interconnection in memory cell MC0#0 according to the fifth embodiment. In FIG. 41, fourth layer metal interconnections M920 to M970 are arranged in the row direction.

Fourth layer metal interconnections M930 and M960 function as dummy interconnections. In other embodiments, these fourth layer metal interconnections do not have to be arranged.

Third layer metal interconnection M815 is connected through a via 3 V310 and a via 3 V320 to fourth layer metal interconnections M920 and M970, respectively, that form power supply line VSS.

Third layer metal interconnection M840 is connected through a via 3 V330 and a via 3 V340 to fourth layer metal interconnections M920 and M970, respectively, that form power supply line VSS.

Third layer metal interconnection M850 is connected through a via 3 V350 to fourth layer metal interconnection M940 forming power supply line VASSA0.

Third layer metal interconnection M860 is connected through a via 3 V360 to fourth layer metal interconnection M940 forming power supply line VASSA0.

Third layer metal interconnection M870 is connected through a via 3 V370 to fourth layer metal interconnection M950 forming power supply line VSSB0.

Third layer metal interconnection M880 is connected through a via 3 V380 to fourth layer metal interconnection M950 forming power supply line VSSB0.

By configuring the layout as described above, memory cell MC0#0 according to the fifth embodiment can provide an electrical interruption between power supply line VSS connected to the transistor for holding data and the power supply line connected to the transistor for data search. As a result, each transistor for data search according to the fifth embodiment can suppress a leakage current at the time when data is not searched for.

Other Configurations

The circuit configuration and the layout of a dual-port CAM have been described in the above-described example.

In another aspect, a CAM may be configured to have three or more ports. In this case, the CAM cell has the same numbers of match lines, search line pairs and logical operation cells as the number of ports. Thereby, the semiconductor device may further improve the searching speed (processing speed).

In still another aspect, each transistor described above may have a Silicon on Insulator (SOI) structure in which an embedded insulation film is provided below a gate, a source and a channel formed between the gate and the source. Thereby, each memory cell can minimize generation of a depletion layer in a PN junction. As a result, each transistor can implement reduced power consumption by reduced leakage current, and can improve the switching speed.

Supplementary Notes

Supplementary Note 1

A semiconductor device includes: a first cell (MDC0) configured to be capable of holding 1-bit information; a second cell (DC0) configured to be capable of holding 1-bit information and located adjacent to the first cell; a first match line and a second match line (MLA0, MLB0) extending in a first direction; a first search line pair (SLA0, /SLA0) extending in a second direction orthogonal to the first direction, first data being transmitted through the first search line pair when the first data is searched for; a second search line pair (SLB0, /SLB0) extending in the second direction, second data being transmitted through the second search line pair when the second data is searched for; a first logical operation cell (LCA0) connected to the first search line pair and the first match line, and configured to drive the first match line based on a result of comparison between information held by each of the first cell and the second cell and the first data transmitted through the first search line pair; and a second logical operation cell (LCB0) connected to the second search line pair and the second match line, and configured to drive the second match line based on a result of comparison between information held by each of the first cell and the second cell and the second data transmitted through the second search line pair.

Thereby, the semiconductor device may function as a TCAM device capable of simultaneously searching for two pieces of search data in one cycle. Thus, when there are a plurality of search targets, this semiconductor device can improve the searching speed as compared with the conventional case. This semiconductor device also searches for two pieces of search data using a common memory array. Thus, this semiconductor device can be suppressed from being increased in size. In addition, this semiconductor device can search for two pieces of search data based on one clock signal, so that power consumption can be suppressed.

Supplementary Note 2

In (Supplementary Note 1), the second cell is located adjacent to the first cell in the first direction. The semiconductor device further includes: a first bit line pair (BL1, BL1) extending in the second direction and connected to the first cell; a second bit line pair (BL0, /BL0) extending in the second direction and connected to the second cell; and a word line (WL0) extending in the first direction and connected to each of the first cell and the second cell.

Thereby, this semiconductor device can write or read data onto or from the second cell while writing or reading data onto or from the first cell.

Supplementary Note 3

In (Supplementary Note 1), the second cell is located adjacent to the first cell in the second direction. The semiconductor device further includes: a bit line pair (BL0, /BL0) extending in the second direction and connected to each of the first and second cells; a first word line (WL1) extending in the first direction and connected to the first cell; and a second word line (WL0) extending in the first direction and connected to the second cell.

Thereby, this semiconductor device can use a common bit line pair shared between the first cell and the second cell, so that the device can be suppressed from being increased in size.

Supplementary Note 4

In (Supplementary Note 1), the first logical operation cell includes: a first logic unit connected between the first match line and a power supply line, and configured to drive, when the first data is searched for, the first match line based on a result of comparison between information (m1) held by the first cell and information transmitted through one search line (SLA0) of the first search line pair; and a second logic unit connected between the first match line and the power supply line, and configured to drive, when the first data is searched for, the first match line based on a result of comparison between information (m0) held by the second cell and information transmitted through the other search line (/SLA0) of the first search line pair. The second logical operation cell includes: a third logic unit connected between the second match line and the power supply line, and configured to drive, when the second data is searched for, the second match line based on a result of comparison between information held by the first cell and information transmitted through one search line (SLB0) of the second search line pair; and a fourth logic unit connected between the second match line and the power supply line, and configured to drive, when the second data is searched for, the second match line based on a result of comparison between information held by the second cell and information transmitted through the other search line (/SLB0) of the second search line pair.

Supplementary Note 5

In (Supplementary Note 4), the first logic unit includes a first transistor (NS1/PS1) and a second transistor (NS0/PS0) that are connected in series between the power supply line (VSS/VDD) and the first match line. The second logic unit includes a third transistor (NS3/PS3) and a fourth transistor (NS2/PS2) that are connected in series between the power supply line (VSS/VDD) and the first match line. The third logic unit includes a fifth transistor (NS5/PS5) and a sixth transistor (NS4/PS4) that are connected in series between the power supply line (VSS/VDD) and the second match line. The fourth logic unit includes a seventh transistor (NS7/PS7) and an eighth transistor (NS6/PS6) that are connected in series between the power supply line (VSS/VDD) and the second match line. The first transistor and the fifth transistor each have a gate connected to a node (m1) at which the first cell holds information. The third transistor and the seventh transistor each have a gate connected to a node (m0) at which the second cell holds information. The second transistor has a gate connected to one search line (SLA0) of the first search line pair. The fourth transistor has a gate connected to the other search line (/SLA0) of the first search line pair. The sixth transistor has a gate connected to one search line (SLB0) of the second search line pair. The eighth transistor has a gate connected to the other search line (/SLB0) of the second search line pair.

Supplementary Note 6

In (Supplementary Note 5), the second cell is located adjacent to the first cell in the first direction. The semiconductor device further includes: a first bit line pair (BL1, BL1) extending in the second direction and connected to the first cell; a second bit line pair (BL0, BL0) extending in the second direction and connected to the second cell; and a word line (WL0) extending in the first direction and connected to each of the first and second cells. The first cell includes: a first inverter having an input connected to a first storage node (m1) connected to the gate of each of the first transistor and the fifth transistor, and an output connected to a second storage node (/m1); a second inverter having an input connected to the second storage node and an output connected to the first storage node; a ninth transistor (NA0) having a first conductivity type, and having one end connected to the first storage node, the other end connected to one bit line of the first bit line pair, and a gate connected to the word line; and a tenth transistor (NA1) having the first conductivity type, and having one end connected to the second storage node, the other end connected to the other bit line of the first bit line pair, and a gate connected to the word line. The second cell includes: a third inverter having an input connected to a third storage node (m0) connected to the gate of each of the third transistor and the seventh transistor, and an output connected to a fourth storage node (/m0); a fourth inverter having an input connected to the fourth storage node, and an output connected to the third storage node; an eleventh transistor (NA2) having the first conductivity type, and having one end connected to the third storage node, the other end connected to one bit line of the second bit line pair, and a gate connected to the word line; and a twelfth transistor (NA3) having the first conductivity type, and having one end connected to the fourth storage node, the other end connected to the other bit line of the second bit line pair, and a gate connected to the word line. A first region (PW0) having a second conductivity type, a second region (NW0) having the first conductivity type, a third region (PW1) having the second conductivity type, a fourth region (NW1) having the first conductivity type, and a fifth region (PW2) having the second conductivity type are formed sequentially in a direction in which the word line extends. In the first region, the ninth and tenth transistors, the thirteenth transistor (ND0) having the first conductivity type and forming the first inverter, and the fourteenth transistor (ND1) having the first conductivity type and forming the second inverter are arranged. In the second region, a fifteenth transistor (P0) having the second conductivity type and forming the first inverter, and a sixteenth transistor (P1) having the second conductivity type and forming the second inverter are arranged. In the third region, the first transistor to the eighth transistor (NS0 to NS7) each having the first conductivity type are arranged. In the fourth region, a seventeenth transistor (P2) having the second conductivity type and forming the third inverter, and an eighteenth transistor (P3) having the second conductivity type and forming the fourth inverter are arranged. In the fifth region, the eleventh transistor, the twelfth transistor, a nineteenth transistor (ND2) having the first conductivity type and forming the third inverter, and a twentieth transistor (ND3) having the first conductivity type and forming the fourth inverter are arranged.

Thereby, the semiconductor device that may function as a TCAM device may simultaneously search for a plurality of pieces of search data using an NMOS transistor as a transistor for data search. Furthermore, this semiconductor device includes a greater number of transistors for data search than the number of transistors in the conventional semiconductor device. Accordingly, each well provided in this semiconductor device and having transistors arranged therein is wider than each well in the conventional semiconductor device. Thereby, this semiconductor device can reduce the probability of occurrence of a multi bit error.

Supplementary Note 7

In (Supplementary Note 5), the second cell is located adjacent to the first cell in the first direction. The semiconductor device further includes: a first bit line pair (BL1, BL1) extending in the second direction and connected to the first cell; a second bit line pair (BL0, /BL0) extending in the second direction and connected to the second cell; and a word line (WL0) extending in the first direction and connected to each of the first cell and the second cell. The first cell includes: a first inverter having an input connected to a first storage node (m1) connected to the gate of each of the first transistor and the fifth transistor, and an output connected to a second storage node (/m1); a second inverter having an input connected to the second storage node and an output connected to the first storage node; a ninth transistor (NA0) having a first conductivity type, and having one end connected to the first storage node, the other end connected to one bit line of the first bit line pair, and a gate connected to the word line; and a tenth transistor (NA1) having the first conductivity type, and having one end connected to the second storage node, the other end connected to the other bit line of the first bit line pair, and a gate connected to the word line. The second cell includes: a third inverter having an input connected to a third storage node (m0) connected to the gate of each of the third transistor and the seventh transistor, and an output connected to a fourth storage node (/m0); a fourth inverter having an input connected to the fourth storage node, and an output connected to the third storage node; an eleventh transistor (NA2) having the first conductivity type, and having one end connected to the third storage node, the other end connected to one bit line of the second bit line pair, and a gate connected to the word line; and a twelfth transistor (NA3) having the first conductivity type, and having one end connected to the fourth storage node, the other end connected to the other bit line of the second bit line pair, and a gate connected to the word line. A first region (PW0) having a second conductivity type, a second region (NW0) having the first conductivity type, and a third region (PW1) having the second conductivity type are formed sequentially in a direction in which the word line extends. In the first region, the ninth and tenth transistors, a thirteenth transistor (ND0) having the first conductivity type and forming the first inverter, and a fourteenth transistor (ND1) having the first conductivity type and forming the second inverter are arranged. In the second region, a fifteenth transistor (P0) having the second conductivity type and forming the first inverter, a sixteenth transistor (P1) having the second conductivity type and forming the second inverter, the first transistor to the eighth transistor (PS0 to PS7) each having the second conductivity type, a seventeenth transistor (P2) having the second conductivity type and forming the third inverter, and an eighteenth transistor (P3) having the second conductivity type and forming the fourth inverter are arranged. In the third region, the eleventh and twelfth transistors, a nineteenth transistor (ND2) having the first conductivity type and forming the third inverter, and a twentieth transistor (ND3) having the first conductivity type and forming the fourth inverter are arranged.

Thereby, the semiconductor device that may function as a TCAM device can simultaneously search for a plurality of pieces of search data using a PMOS transistor as a transistor for data search. Furthermore, since this semiconductor device includes a relatively few number of wells each having transistors arranged therein, the device can be suppressed from being increased in size. Furthermore, since this semiconductor device includes a greater number of transistors for data search than the number of transistors in the conventional device, each well having transistors arranged therein is wider than each well in the conventional device. Thereby, this semiconductor device can reduce the probability of occurrence of a multi bit error. In another aspect, in the semiconductor device, a material such as silicon germanium that applies stress onto silicon of the channel portion is used in the source region and the drain region of the PMOS transistor for data search, so that the searching speed may be improved.

Supplementary Note 8

In (Supplementary Note 5), the second cell is located adjacent to the first cell in the second direction. The semiconductor device further includes: a bit line pair (BL0, BL0) extending in the second direction and connected to each of the first cell and the second cell; a first word line (WL1) extending in the first direction and connected to the first cell; and a second word line (WL0) extending in the first direction and connected to the second cell. The first cell includes: a first inverter having an input connected to a first storage node (m1) connected to the gate of each of the first transistor and the fifth transistor, and an output connected to a second storage node (/m1); a second inverter having an input connected to the second storage node and an output connected to the first storage node; a ninth transistor (NA0) having a first conductivity type, and having one end connected to the first storage node, the other end connected to one bit line of the bit line pair, and a gate connected to the first word line; and a tenth transistor (NA1) having the first conductivity type, and having one end connected to the second storage node, the other end connected to the other bit line of the bit line pair, and a gate connected to the first word line. The second cell includes: a third inverter having an input connected to a third storage node (m0) connected to the gate of each of the third transistor and the seventh transistor, and an output connected to a fourth storage node; a fourth inverter having an input connected to the fourth storage node (/m0), and an output connected to the third storage node; an eleventh transistor (NA2) having the first conductivity type, and having one end connected to the third storage node, the other end connected to one bit line of the bit line pair, and a gate connected to the second word line; and a twelfth transistor (NA3) having the first conductivity type, and having one end connected to the fourth storage node, the other end connected to the other bit line of the bit line pair, and a gate connected to the second word line. A first region (PW0) having a second conductivity type, a second region (NW0) having the first conductivity type, and a third region (PW1) having the second conductivity type are formed sequentially in a direction in which the first word line and the second word line extend. In the first region, the ninth and eleventh transistors, a thirteenth transistor (ND0) having the first conductivity type and forming the first inverter, and a fourteenth transistor (ND1) having the first conductivity type and forming the second inverter are arranged. In the second region, a fifteenth transistor (P0) having the second conductivity type and forming the first inverter, the sixteenth transistor (P1) having the second conductivity type and forming the second inverter, a seventeenth transistor (P2) having the second conductivity type and forming the third inverter, and an eighteenth transistor (P3) having the second conductivity type and forming the fourth inverter are arranged. In the third region, the first transistor to the eighth transistor (NS0 to NS7) each having the first conductivity type, the tenth and twelfth transistors, a nineteenth transistor (ND2) having the first conductivity type and forming the third inverter, and a twentieth transistor (ND3) having the first conductivity type and forming the fourth inverter are arranged.

Thereby, the semiconductor device that may function as a TCAM device may simultaneously search for a plurality of pieces of search data using an NMOS transistor as a transistor for data search. Furthermore, since this semiconductor device includes a relatively few number of wells each having transistors arranged therein, the device can be suppressed from being increased in size.

Supplementary Note 9

In (Supplementary Note 8), at least one transistor of the first to twentieth transistors is formed by a multi-gate transistor.

Supplementary Note 10

In (Supplementary Note 8), the semiconductor device further includes: a first local interconnection for connecting a diffusion layer (FL704) shared between the eleventh transistor (NA2) and the nineteenth transistor (ND2) and a gate of the eighteenth transistor (P3); a second local interconnection for connecting a diffusion layer (FL708) shared between the ninth transistor (NA0) and the thirteenth transistor (ND0) and a gate of the sixteenth transistor (P1); a third local interconnection for connecting a diffusion layer (FL728) shared between the twelfth transistor (NA3) and the twentieth transistor (ND3) and a gate of the seventeenth transistor (P2); and a fourth local interconnection for connecting a diffusion layer (FL732) shared between the tenth transistor (NA1) and the fourteenth transistor (ND1) and a gate of the fifteenth transistor (P0).

Supplementary Note 11

In (Supplementary Note 4), the semiconductor device further includes: a first power supply line (VSS) connected to the first cell and the second cell; a second power supply line (VSSA0) connected to the first logic unit and the second logic unit; a third power supply line (VSSB0) connected to the third logic unit and the fourth logic unit; a first switch (SWB0) for connecting the first power supply line and the second power supply line; and a second switch (SWB0) for connecting the first power supply line and the third power supply line. The first switch is turned on when the first data is searched for, and turned off when the first data is not searched for. The second switch is turned on when the second data is searched for, and turned off when the second data is not searched for.

Supplementary Note 12

The semiconductor device includes: a data cell (DC0) configured to be capable of holding 1-bit information; a first match line and a second match line (MLA0, MLB0) extending in a first direction; a first search line pair (SLA0, /SLA0) extending in a second direction orthogonal to the first direction, first data being transmitted through the first search line pair when the first data is searched for; a second search line pair (SLB0, /SLB0) extending in the second direction, second data being transmitted through the second search line pair when the second data is searched for; a first logical operation cell (LCA0) connected to the first search line pair and the first match line, and configured to drive the first match line based on a result of comparison between information held by the data cell and the first data transmitted through the first search line pair; and a second logical operation cell (LCB0) connected to the second search line pair and the second match line, and configured to drive the second match line based on a result of comparison between information held by the data cell and the second data transmitted through the second search line pair.

Thereby, a semiconductor device may function as a BCAM device capable of simultaneously searching for two pieces of search data in one cycle. Accordingly, when there are a plurality of search targets, this semiconductor device can improve the searching speed as compared with the conventional case. This semiconductor device also searches for two pieces of search data using a common memory array. Thus, this semiconductor device can be suppressed from being increased in size. In addition, this semiconductor device can search for two pieces of search data based on one clock signal, so that power consumption can be suppressed.

Supplementary Note 13

In (Supplementary Note 12), the semiconductor device further includes: a bit line pair (BL0, BL0) extending in the first direction and connected to the data cell; and a word line (WL0) extending in the first direction and connected to the data cell. The first logical operation cell includes: a first logic unit connected between the first match line and a power supply line (VSS), and configured to drive, when first data is searched for, the first match line based on a result of comparison between information held at a first storage node (AO) of the data cell and information transmitted through one search line (SLA0) of the first search line pair; and a second logic unit connected between the first match line and the power supply line, and configured to drive, when the first data is searched for, the first match line based on a result of comparison between information held at a second storage node (A1) of the data cell and information transmitted through the other search line (/SLA0) of the first search line pair. The second logical operation cell includes: a third logic unit connected between the second match line and the power supply line, and configured to drive, when second data is searched for, the second match line based on a result of comparison between information held at the first storage node and information transmitted through one search line (SLB0) of the second search line pair; and a fourth logic unit connected between the second match line and the power supply line, and configured to drive, when the second data is searched for, the second match line based on a result of comparison between information held at the second storage node and information transmitted through the other search line (/SLB0) of the second search line pair. The first logic unit includes a first transistor (NS0) and a second transistor (NS1) that are connected in series between the power supply line and the first match line. The second logic unit includes a third transistor (NS3) and a fourth transistor (NS2) that are connected in series between the power supply line and the first match line. The third logic unit includes a fifth transistor (NS5) and a sixth transistor (NS4) that are connected in series between the power supply line and the second match line. The fourth logic unit includes a seventh transistor (NS7) and an eighth transistor (NS6) that are connected in series between the power supply line and the second match line. The first transistor and the fifth transistor each have a gate connected to the first storage node. The third transistor and the seventh transistor each have a gate connected to the second storage node. The second transistor has a gate connected to one search line (SLA0) of the first search line pair. The fourth transistor has a gate connected to the other search line (/SLA0) of the first search line pair. The sixth transistor has a gate connected to one search line (SLB0) of the second search line pair. The eighth transistor has a gate connected to the other search line (/SLB0) of the second search line pair. The data cell includes: a first inverter having an input connected to the first storage node and an output connected to the second storage node; a second inverter having an input connected to the second storage node and an output connected to the first storage node; a ninth transistor (NA0) having a first conductivity type, and having one end connected to the first storage node, the other end connected to one bit line of the bit line pair, and a gate connected to the word line; and a tenth transistor (NA1) having the first conductivity type, and having one end connected to the second storage node, the other end connected to the other bit line of the bit line pair, and a gate connected to the word line. A first region (PW0) having a second conductivity type, a second region (NW0) having the first conductivity type, and a third region (PW1) having the second conductivity type are formed sequentially in a direction in which the word line extends. In the first region, the ninth and tenth transistors, a thirteenth transistor (ND0) having the first conductivity type and forming the first inverter, and a fourteenth transistor (ND1 having the first conductivity type and forming the second inverter are arranged. In the second region, a fifteenth transistor (P0) having the second conductivity type and forming the first inverter, and a sixteenth transistor (P1) having the second conductivity type and forming the second inverter are arranged. In the third region, the first transistor to the eighth transistor (NS0 to NS7) each having the first conductivity type are arranged.

Thereby, the semiconductor device that may function as a BCAM device may simultaneously search for a plurality of pieces of search data using an NMOS transistor as a transistor for data search. Furthermore, since this semiconductor device includes a greater number of transistors for data search than the number of transistors in the conventional device. Accordingly, each well provided in this semiconductor device and having transistors arranged therein is wider than each well in the conventional device. Thereby, this semiconductor device can reduce the probability of occurrence of a multi bit error.

Supplementary Note 14

In (Supplementary Note 12), the semiconductor device further includes: a bit line pair (BL0, /BL0) extending in the first direction and connected to the data cell; and a word line (WL0) extending in the first direction and connected to the data cell. The first logical operation cell includes: a first logic unit connected between the first match line and a power supply line (VDD), and configured to drive, when the first data is searched for, the first match line based on a result of comparison between information held at a first storage node (A0) of the data cell and information transmitted through one search line (SLA0) of the first search line pair; and a second logic unit connected between the first match line and the power supply line, and configured to drive, when the first data is searched for, the first match line based on a result of comparison between information held at a second storage node (A1) of the data cell and information transmitted through the other search line (/SLA0) of the first search line pair. The second logical operation cell includes: a third logic unit connected between the second match line and the power supply line, and configured to drive, when the second data is searched for, the second match line based on a result of comparison between information held at the first storage node and information transmitted through one search line (SLB0) of the second search line pair; and a fourth logic unit connected between the second match line and the power supply line, and configured to drive, when the second data is searched for, the second match line based on a result of comparison between information held at the second storage node and information transmitted through the other search line (/SLB0) of the second search line pair. The first logic unit includes a first transistor (PS0) and a second transistor (PS1) that are connected in series between the power supply line and the first match line. The second logic unit includes a third transistor (PS3) and a fourth transistor (PS2) that are connected in series between the power supply line and the first match line. The third logic unit includes a fifth transistor (PS5) and a sixth transistor (PS4) that are connected in series between the power supply line and the second match line. The fourth logic unit includes a seventh transistor (PS7) and an eighth transistor (PS6) that are connected in series between the power supply line and the second match line. The first transistor and the fifth transistor each have a gate connected to the first storage node. The third transistor and the seventh transistor each have a gate connected to the second storage node. The second transistor has a gate connected to one search line (SLA0) of the first search line pair. The fourth transistor has a gate connected to the other search line (/SLA0) of the first search line pair. The sixth transistor has a gate connected to one search line (SLB0) of the second search line pair. The eighth transistor has a gate connected to the other search line (/SLB0) of the second search line pair. The data cell includes: a first inverter having an input connected to the first storage node and an output connected to the second storage node; a second inverter having an input connected to the second storage node and an output connected to the first storage node; a ninth transistor (NA0) having a first conductivity type, and having one end connected to the first storage node, the other end connected to one bit line of the bit line pair, and a gate connected to the word line; and a tenth transistor (NA1) having the first conductivity type, and having one end connected to the second storage node, the other end connected to the other bit line of the bit line pair, and a gate connected to the word line. A first region (PW0) having a second conductivity type and a second region (NW0) having the first conductivity type are formed sequentially in a direction in which the word line extends. In the first region, the ninth and tenth transistors, a thirteenth transistor (ND0) having the first conductivity type and forming the first inverter, and a fourteenth transistor (ND1) having the first conductivity type and forming the second inverter are arranged. In the second region, a fifteenth transistor (P0) having the second conductivity type and forming the first inverter, a sixteenth transistor (P1)

having the second conductivity type and forming the second inverter, and the first transistor to the eighth transistor (PS0 to PS7) each having the second conductivity type are arranged.

Thereby, the semiconductor device that may function as a BCAM device may simultaneously search for a plurality of pieces of search data using a PMOS transistor as a transistor for data search. Furthermore, since this semiconductor device includes a relatively few number of wells each having transistors arranged therein, the device can be suppressed from being increased in size. Furthermore, since this semiconductor device includes a greater number of transistors for data search than the number of transistors in the conventional device. Accordingly, each well provided in this semiconductor device and having transistors arranged therein is wider than each well in the conventional device. Thereby, this semiconductor device can reduce the probability of occurrence of a multi bit error. In another aspect, in the semiconductor device, a material such as silicon germanium that applies stress onto silicon of the channel portion is used in the source region and the drain region of the PMOS transistor for data search, so that the searching speed may be improved.

Although the embodiments of the present invention have been described as above, it should be understood that the embodiments disclosed herein are illustrative and non-restrictive in every respect. The scope of the present invention is defined by the terms of the claims, and is intended to include any modifications within the meaning and scope equivalent to the terms of the claims.

What is claimed is:

1. A semiconductor device comprising:
a first cell configured to be capable of holding 1-bit information;
a second cell configured to be capable of holding 1-bit information and located adjacent to the first cell;
a first match line and a second match line that extend in a first direction;
a first search line pair extending in a second direction orthogonal to the first direction, first data being transmitted through the first search line pair when the first data is searched for;
a second search line pair extending in the second direction, second data being transmitted through the second search line pair when the second data is searched for;
a first logical operation cell connected to the first search line pair and the first match line, and configured to drive the first match line based on a result of comparison between information held by each of the first cell and the second cell and the first data transmitted through the first search line pair;
a second logical operation cell connected to the second search line pair and the second match line, and configured to drive the second match line based on a result of comparison between information held by each of the first cell and the second cell and the second data transmitted through the second search line pair;
a first well region;
a second well region;
a third well region;
a fourth well region; and
a fifth well region,
wherein the second well region is arranged between the first well region and the third well region,
wherein the fourth well region is arranged between the third well region and the fifth well region,
wherein the second well region and the fourth well region have a first conductivity type,
wherein the first well region, the third well region and the fifth well region have a second conductivity type,
wherein the first cell is arranged on the first well region and the second well region;
wherein the second cell is arranged on the fourth well region and the fifth well region; and
wherein the third well region comprises:
a first diffusion layer on which the first logical operation cell is arranged; and
a second diffusion layers on which the second logical operation cell is arranged, wherein
the first logical operation cell includes
a first logic unit connected between the first match line and a power supply line, and configured to drive, when the first data is searched for, the first match line based on a result of comparison between information held by the first cell and information transmitted through one search line of the first search line pair, and
a second logic unit connected between the first match line and the power supply line, and configured to drive, when the first data is searched for, the first match line based on a result of comparison between information held by the second cell and information transmitted through the other search line of the first search line pair, and
the second logical operation cell includes
a third logic unit connected between the second match line and the power supply line, and configured to drive, when the second data is searched for, the second match line based on a result of comparison between information held by the first cell and information transmitted through one search line of the second search line pair, and
a fourth logic unit connected between the second match line and the power supply line, and configured to drive, when the second data is searched for, the second match line based on a result of comparison between information held by the second cell and information transmitted through the other search line of the second search line pair,
wherein
the first logic unit includes a first transistor and a second transistor that are connected in series between the power supply line and the first match line,
the second logic unit includes a third transistor and a fourth transistor that are connected in series between the power supply line and the first match line,
the third logic unit includes a fifth transistor and a sixth transistor that are connected in series between the power supply line and the second match line,
the fourth logic unit includes a seventh transistor and an eighth transistor that are connected in series between the power supply line and the second match line,
the first transistor and the fifth transistor each have a gate connected to a node at which the first cell holds information,
the third transistor and the seventh transistor each have a gate connected to a node at which the second cell holds information,
the second transistor has a gate connected to one search line of the first search line pair,
the fourth transistor has a gate connected to the other search line of the first search line pair, the sixth transistor has a gate connected to one search line of the second search line pair, and the eighth transistor has a gate connected to the other search line of the second search line pair, wherein the second cell is located adjacent to the first cell in the first direction, the second cell includes
- a first bit line pair extending in the second direction and connected to the first cell,
- a second bit line pair extending in the second direction and connected to the second cell, and
- a word line extending in the first direction and connected to each of the first cell and the second cell, the first cell includes
- a first inverter having an input connected to a first storage node connected to the gate of each of the first transistor and the fifth transistor, and an output connected to a second storage node,
- a second inverter having an input connected to the second storage node and an output connected to the first storage node,
- a ninth transistor having a first conductivity type, and having one end connected to the first storage node, the other end connected to one bit line of the first bit line pair, and a gate connected to the word line, and
- a tenth transistor having the first conductivity type, and having one end connected to the second storage node, the other end connected to the other bit line of the first bit line pair, and a gate connected to the word line, the second cell includes
- a third inverter having an input connected to a third storage node connected to the gate of each of the third transistor and the seventh transistor, and an output connected to a fourth storage node,
- a fourth inverter having an input connected to the fourth storage node and an output connected to the third storage node,
- an eleventh transistor having the first conductivity type, and having one end connected to the third storage node, the other end connected to one bit line of the second bit line pair, and a gate connected to the word line, and
- a twelfth transistor having the first conductivity type, and having one end connected to the fourth storage node, the other end connected to the other bit line of the second bit line pair, and a gate connected to the word line, the first well region, the second well region and the third well region are formed sequentially in a direction in which the word line extends, in the first well region, the ninth transistor, the tenth transistor, a thirteenth transistor having the first conductivity type and forming the first inverter, and a fourteenth transistor having the first conductivity type and forming the second inverter are arranged, in the second well region, a fifteenth transistor having the second conductivity type and forming the first inverter, a sixteenth transistor having the second conductivity type and forming the second inverter, the first transistor to the eighth transistor each having the second conductivity type, a seventeenth transistor having the second conductivity type and forming the third inverter, and an eighteenth transistor having the second conductivity type and forming the fourth inverter are arranged, and in the third well region, the eleventh transistor, the twelfth transistor, a nineteenth transistor having the first conductivity type and forming the third inverter, and a twentieth transistor having the first conductivity type and forming the fourth inverter are arranged.

2. The semiconductor device according to claim 1, wherein at least one transistor of the first transistor to the twentieth transistor is formed by a multi-gate transistor.

3. The semiconductor device according to claim 1, further comprising:
- a first local interconnection for connecting a diffusion layer shared between the eleventh transistor and the nineteenth transistor and a gate of the eighteenth transistor;
- a second local interconnection for connecting a diffusion layer shared between the ninth transistor and the thirteenth transistor and a gate of the sixteenth transistor;
- a third local interconnection for connecting a diffusion layer shared between the twelfth transistor and the twentieth transistor and a gate of the seventeenth transistor; and
- a fourth local interconnection for connecting a diffusion layer shared between the tenth transistor and the fourteenth transistor and a gate of the fifteenth transistor.

4. The semiconductor device according to claim 1, further comprising:
- a first power supply line connected to the first cell and the second cell;
- a second power supply line connected to the first logic unit and the second logic unit;
- a third power supply line connected to the third logic unit and the fourth logic unit;
- a first switch for connecting the first power supply line and the second power supply line; and
- a second switch for connecting the first power supply line and the third power supply line, wherein
the first switch is turned on when the first data is searched for, and turned off when the first data is not searched for, and
the second switch is turned on when the second data is searched for, and turned off when the second data is not searched for.

5. A semiconductor device comprising:
- a first cell configured to be capable of holding 1-bit information;
- a second cell configured to be capable of holding 1-bit information and located adjacent to the first cell;
- a first match line and a second match line that extend in a first direction;
- a first search line pair extending in a second direction orthogonal to the first direction, first data being transmitted through the first search line pair when the first data is searched for;
- a second search line pair extending in the second direction, second data being transmitted through the second search line pair when the second data is searched for;
- a first logical operation cell connected to the first search line pair and the first match line, and configured to drive the first match line based on a result of comparison between information held by each of the first cell and the second cell and the first data transmitted through the first search line pair;
- a second logical operation cell connected to the second search line pair and the second match line, and configured to drive the second match line based on a result of comparison between information held by each of the first cell and the second cell and the second data transmitted through the second search line pair;
a first well region;
a second well region;
a third well region;
a fourth well region; and
a fifth well region,
wherein the second well region is arranged between the first well region and the third well region,
wherein the fourth well region is arranged between the third well region and the fifth well region,
wherein the second well region and the fourth well region have a first conductivity type,
wherein the first well region, the third well region and the fifth well region have a second conductivity type,
wherein the first cell is arranged on the first well region and the second well region;
wherein the second cell is arranged on the fourth well region and the fifth well region; and
wherein the third well region comprises:
a first diffusion layer on which the first logical operation cell is arranged; and
a second diffusion layers on which the second logical operation cell is arranged, wherein the first logical operation cell includes
a first logic unit connected between the first match line and a power supply line, and configured to drive, when the first data is searched for, the first match line based on a result of comparison between information held by the first cell and information transmitted through one search line of the first search line pair, and
a second logic unit connected between the first match line and the power supply line, and configured to drive, when the first data is searched for, the first match line based on a result of comparison between information held by the second cell and information transmitted through the other search line of the first search line pair, and
the second logical operation cell includes
a third logic unit connected between the second match line and the power supply line, and configured to drive, when the second data is searched for, the second match line based on a result of comparison between information held by the first cell and information transmitted through one search line of the second search line pair, and
a fourth logic unit connected between the second match line and the power supply line, and configured to drive, when the second data is searched for, the second match line based on a result of comparison between information held by the second cell and information transmitted through the other search line of the second search line pair,
wherein the first logic unit includes a first transistor and a second transistor that are connected in series between the power supply line and the first match line,
the second logic unit includes a third transistor and a fourth transistor that are connected in series between the power supply line and the first match line,
the third logic unit includes a fifth transistor and a sixth transistor that are connected in series between the power supply line and the second match line,
the fourth logic unit includes a seventh transistor and an eighth transistor that are connected in series between the power supply line and the second match line,
the first transistor and the fifth transistor each have a gate connected to a node at which the first cell holds information,
the third transistor and the seventh transistor each have a gate connected to a node at which the second cell holds information,
the second transistor has a gate connected to one search line of the first search line pair,
the fourth transistor has a gate connected to the other search line of the first search line pair,
the sixth transistor has a gate connected to one search line of the second search line pair, and
the eighth transistor has a gate connected to the other search line of the second search line pair,
wherein the second cell is located adjacent to the first cell in the second direction, the second cell further includes
a bit line pair extending in the second direction and connected to each of the first cell and the second cell,
a first word line extending in the first direction and connected to the first cell, and
a second word line extending in the first direction and connected to the second cell, the first cell includes
a first inverter having an input connected to a first storage node connected to the gate of each of the first transistor and the fifth transistor, and an output connected to a second storage node,
a second inverter having an input connected to the second storage node, and an output connected to the first storage node,
a ninth transistor having a first conductivity type, and having one end connected to the first storage node, the other end connected to one bit line of the bit line pair, and a gate connected to the first word line, and
a tenth transistor having the first conductivity type, and having one end connected to the second storage node, the other end connected to the other bit line of the bit line pair, and a gate connected to the first word line,
the second cell includes
a third inverter having an input connected to a third storage node connected to the gate of each of the third transistor and the seventh transistor, and an output connected to a fourth storage node,
a fourth inverter having an input connected to the fourth storage node and an output connected to the third storage node,
an eleventh transistor having the first conductivity type, and having one end connected to the third storage node, the other end connected to one bit line of the bit line pair, and a gate connected to the second word line, and
a twelfth transistor having the first conductivity type, and having one end connected to the fourth storage node, the other end connected to the other bit line of the bit line pair, and a gate connected to the second word line,
the first well region, the second well region and the third well region are sequentially formed in a direction in which the first word line and the second word line extend,
in the first well region, the ninth transistor, the eleventh transistor, a thirteenth transistor having the first conductivity type and forming the first inverter, and a fourteenth transistor having the first conductivity type and forming the second inverter are arranged,
in the second well region, a fifteenth transistor having the second conductivity type and forming the first inverter, a sixteenth transistor having the second conductivity type and forming the second inverter, a seventeenth transistor having the second conductivity type and forming the third inverter, and an eighteenth transistor having the second conductivity type and forming the fourth inverter are arranged, and in the third well region, the first transistor to the eighth transistor each having the first conductivity type, the tenth transistor, the twelfth transistor, a nineteenth transistor having the first conductivity type and forming the third inverter, and a twentieth transistor having the first conductivity type and forming the fourth inverter are arranged.

6. The semiconductor device according to claim 5, wherein at least one transistor of the first transistor to the twentieth transistor is formed by a multi-gate transistor.

7. The semiconductor device according to claim 5, further comprising:
- a first local interconnection for connecting a diffusion layer shared between the eleventh transistor and the nineteenth transistor and a gate of the eighteenth transistor;
- a second local interconnection for connecting a diffusion layer shared between the ninth transistor and the thirteenth transistor and a gate of the sixteenth transistor;
- a third local interconnection for connecting a diffusion layer shared between the twelfth transistor and the twentieth transistor and a gate of the seventeenth transistor; and
- a fourth local interconnection for connecting a diffusion layer shared between the tenth transistor and the fourteenth transistor and a gate of the fifteenth transistor.

8. The semiconductor device according to claim 5, further comprising:
- a first power supply line connected to the first cell and the second cell;
- a second power supply line connected to the first logic unit and the second logic unit;
- a third power supply line connected to the third logic unit and the fourth logic unit;
- a first switch for connecting the first power supply line and the second power supply line; and
- a second switch for connecting the first power supply line and the third power supply line, wherein
the first switch is turned on when the first data is searched for, and turned off when the first data is not searched for, and
the second switch is turned on when the second data is searched for, and turned off when the second data is not searched for.

9. A semiconductor device comprising:
- a data cell configured to be capable of holding 1-bit information;
- a first match line and a second match line extending in a first direction;
- a first search line pair extending in a second direction orthogonal to the first direction, first data being transmitted through the first search line pair when the first data is searched for;
- a second search line pair extending in the second direction, second data being transmitted through the second search line pair when the second data is searched for;
- a first logical operation cell connected to the first search line pair and the first match line, and configured to drive the first match line based on a result of comparison between information held by the data cell and the first data transmitted through the first search line pair;
- a second logical operation cell connected to the second search line pair and the second match line, and configured to drive the second match line based on a result of comparison between information held by the data cell and the second data transmitted through the second search line pair;
- a first well region;
- a second well region; and
- a third well region;
wherein the second well region is arranged between the first well region and the third well region,
wherein the second well region has a first conductivity type,
wherein the first well region and the third well region have a second conductivity type,
wherein the third well region comprises:
  - a first diffusion layer on which the first logical operation cell is arranged; a second diffusion layers on which the second logical operation cell is arranged;
- a bit line pair extending in the second direction and connected to the data cell; and
- a word line extending in the first direction and connected to the data cell, wherein the first logical operation cell includes
  - a first logic unit connected between the first match line and a power supply line, and configured to drive, when the first data is searched for, the first match line based on a result of comparison between information held at a first storage node of the data cell and information transmitted through one search line of the first search line pair, and
  - a second logic unit connected between the first match line and the power supply line, and configured to drive, when the first data is searched for, the first match line based on a result of comparison between information held at a second storage node of the data cell and information transmitted through the other search line of the first search line pair,
the second logical operation cell includes
  - a third logic unit connected between the second match line and the power supply line, and configured to drive, when the second data is searched for, the second match line based on a result of comparison between information held at the first storage node and information transmitted through one search line of the second search line pair, and
  - a fourth logic unit connected between the second match line and the power supply line, and configured to drive, when the second data is searched for, the second match line based on a result of comparison between information held at the second storage node and information transmitted through the other search line of the second search line pair,
the first logic unit includes a first transistor and a second transistor that are connected in series between the power supply line and the first match line,
the second logic unit includes a third transistor and a fourth transistor that are connected in series between the power supply line and the first match line,
the third logic unit includes a fifth transistor and a sixth transistor that are connected in series between the power supply line and the second match line,
the fourth logic unit includes a seventh transistor and an eighth transistor that are connected in series between the power supply line and the second match line,
the first transistor and the fifth transistor each have a gate connected to the first storage node, the third transistor and the seventh transistor each have a gate connected to the second storage node, the second transistor has a gate connected to one search line of the first search line pair, the fourth transistor has a gate connected to the other search line of the first search line pair, the sixth transistor has a gate connected to one search line of the second search line pair, and the eighth transistor has a gate connected to the other search line of the second search line pair, the data cell includes
- a first inverter having an input connected to the first storage node and an output connected to the second storage node,
- a second inverter having an input connected to the second storage node and an output connected to the first storage node,
- a ninth transistor having a first conductivity type, and having one end connected to the first storage node, the other end connected to one bit line of the bit line pair, and a gate connected to the word line, and
- a tenth transistor having the first conductivity type, and having one end connected to the second storage node, the other end connected to the other bit line of the bit line pair, and a gate connected to the word line, the first well region and the second well region are arranged in a direction in which the word line extends, in the first well region, the ninth transistor, the tenth transistor, a thirteenth transistor having the first conductivity type and forming the first inverter, and a fourteenth transistor having the first conductivity type and forming the second inverter are arranged, and in the second well region, a fifteenth transistor having the second conductivity type and forming the first inverter, a sixteenth transistor having the second conductivity type and forming the second inverter, and the first transistor to the eighth transistor each having the second conductivity type are arranged.

* * * * *